(12) United States Patent
Lee et al.

(10) Patent No.: US 11,295,972 B2
(45) Date of Patent: Apr. 5, 2022

(54) LAYOUT STRUCTURE BETWEEN SUBSTRATE, MICRO-LED ARRAY AND MICRO-VACUUM MODULE FOR MICRO-LED ARRAY TRANSFER USING MICRO-VACUUM MODULE, AND METHOD FOR MANUFACTURING MICRO-LED DISPLAY USING THE SAME

(71) Applicant: KOREA ADVANCED INSTITUTE OF SCIENCE AND TECHNOLOGY, Daejeon (KR)

(72) Inventors: Keon Jae Lee, Daejeon (KR); Han Eol Lee, Daejeon (KR); Tae Jin Kim, Daejeon (KR); Jung Ho Shin, Daejeon (KR); Sang Hyun Park, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 16/727,248

(22) Filed: Dec. 26, 2019

(65) Prior Publication Data
US 2020/0211879 A1  Jul. 2, 2020

Related U.S. Application Data

(63) Continuation-in-part of application No. 16/225,178, filed on Dec. 19, 2018, now abandoned.

(30) Foreign Application Priority Data

Jun. 12, 2018 (KR) .......... 10-2018-0067701
Jul. 3, 2018 (KR) .......... 10-2018-0076935

(51) Int. Cl.
*H01L 21/683*  (2006.01)
*H01L 21/677*  (2006.01)
(Continued)

(52) U.S. Cl.
CPC ........ *H01L 21/67721* (2013.01); *B65G 47/91* (2013.01); *H01L 21/6838* (2013.01); *H01L 33/62* (2013.01)

(58) Field of Classification Search
CPC .......... H01L 21/67721; H01L 21/6835; H01L 21/6836; H01L 21/6838;
(Continued)

(56) References Cited

U.S. PATENT DOCUMENTS 9,927,349 B2   3/2018 Wang et al.
2004/0123456 A1*  7/2004 Matsumura ....... H01L 23/49816
                                                    29/840
(Continued)

FOREIGN PATENT DOCUMENTS

KR    10-1307481    9/2013
WO   WO 2005-122285   12/2005

*Primary Examiner* — Lan Vinh
(74) *Attorney, Agent, or Firm* — NSIP Law

(57) ABSTRACT

The present disclosure provides a method for transfer and assembly of RGB micro-light-emitting diodes using vacuum suction force whereby the vacuum state of micrometer-sized adsorption holes to which micro-light-emitting diodes formed on a mother substrate or a temporary substrate are bonded is controlled selectively, so that only the micro-light-emitting diode devices desired to be detached from the mother substrate or the temporary substrate are detached from the mother substrate or the temporary substrate using vacuum suction force and then transferred to a target substrate.

13 Claims, 75 Drawing Sheets

MAVA module allowing selective vacuum control of channels

Target substrate coated with transfer member

(51) Int. Cl.
*B65G 47/91* (2006.01)
*H01L 33/62* (2010.01)

(58) Field of Classification Search
CPC . H01L 2221/68322; H01L 2221/68327; H01L 2221/68368; H01L 25/0753; H01L 33/0095; H01L 33/62; B65G 47/91
USPC ....... 216/24, 33; 156/345.238, 345.241, 238, 156/241, 297; 294/183, 186, 188; 438/107, 110, 113
See application file for complete search history.

(56) References Cited

U.S. PATENT DOCUMENTS

| | | | |
|---|---|---|---|
| 2012/0058579 A1* | 3/2012 | Horng | H01L 33/60 438/27 |
| 2017/0110599 A1 | 4/2017 | Han et al. | |
| 2018/0096878 A1 | 4/2018 | Wu et al. | |
| 2018/0158706 A1* | 6/2018 | Hsu | G01R 31/2887 |
| 2018/0190614 A1 | 7/2018 | Kumar et al. | |
| 2018/0233536 A1 | 8/2018 | Chang | |
| 2019/0139794 A1* | 5/2019 | Saketi | H01L 21/67144 |

\* cited by examiner

MAVA module allowing selective vacuum control of channels

Target substrate coated with transfer member

Mother substrate

Mother substrate

Transfer substrate

Transfer substrate

Target substrate coated with transfer member

Target substrate coated with transfer member

Target substrate coated with transfer member

Pressure-applying means with flat bottom roll

Vacuum off

Target substrate coated
with transfer member

Target substrate coated
with transfer member

Target substrate coated
with transfer member

Pressure-applying means with flat bottom

| | High-definition TV | Tablet PC | Smart Phone | VR | Next-generation AR/VR |
|---|---|---|---|---|---|
| PPI | 80 | 100~300 | 250~600 | 400~1000 | >1000 |
| Pixel Pitch (μm) | 320 | 80~250 | 40~100 | 25~60 | <25 |
| Gap between adsorption holes (μm) | 315 | 75~245 | 35~95 | 20~55 | <20 |

Distance between adsorption holes (distance between chips)

■ 1st release   ▦ 2nd release (e)

LAYOUT STRUCTURE BETWEEN SUBSTRATE, MICRO-LED ARRAY AND MICRO-VACUUM MODULE FOR MICRO-LED ARRAY TRANSFER USING MICRO-VACUUM MODULE, AND METHOD FOR MANUFACTURING MICRO-LED DISPLAY USING THE SAME

CROSS-REFERENCE TO RELATED APPLICATIONS

This application is a Continuation in part of U.S. patent application Ser. No. 16/225,178 filed on Dec. 19, 2018, which claims benefit of priority under 35 USC § 119(a) to Korean Patent Application Nos. 10-2018-0067701 filed on Jun. 12, 2018 and 10-2018-0076935 filed on Jul. 3, 2018 in the Korean Intellectual Property Office, the entire disclosures of which are incorporated herein by reference for all purposes.

TECHNICAL FIELD

The present disclosure relates to a method for vacuum suction force-based easy transfer and assembly of RGB micro-light-emitting diodes formed on a mother substrate as chips or thin films onto a target substrate by detaching the micro-light-emitting diodes from the mother substrate using selective micro-vacuum adsorption.

BACKGROUND ART

The existing printable semiconductors include thin film transistors, micro-LEDs, batteries, memories, etc. In general, the semiconductor is formed on a hard mother substrate including silicon, SOI, glass, etc. through a general semiconductor process, and then transferred onto a desired target substrate such as silicon, SOI, glass, plastic, etc. through various electronic device printing methods.

Polymer stamping or transfer using electrostatic or electromagnetic force has been studied mainly as a method for transferring the semiconductor.

For polymer stamping, the type of devices that can be transferred are limited, for example, only to low-efficiency horizontal micro-LEDs. In addition, as the stamp size is increased, large-area transfer becomes difficult due to drooping of the stamp, which leads to low transfer yield.

The electrostatic transfer module is disadvantageous in that transfer yield is low. In addition, there is a risk of device failure because a high voltage is applied to the device when the electrostatic force is formed.

The electromagnetic transfer module is also disadvantageous in that transfer yield is low because transfer should be performed at least two times. In addition, it cannot be used for semiconductors with a size of 30 μm or smaller.

The micro-LED is a very small light-emitting device which emits light on its own without a color filter. Because a panel is prepared by assembling light-emitting LEDs, there is no limitation in size, shape or resolution. However, because the transfer process of mounting very small LED chips onto a substrate is time-consuming and costly, it is difficult to be applied to the present display industry including the production of large-sized TVs.

As a method of fabricating a light-emitting diode on a flexible substrate, there may be a method including a step of transferring an alloy layer onto a light-emitting diode device layer and then fixing the device layer through eutectic bonding to a transfer substrate and a step of separating the light-emitting diode device layer from the sacrificial substrate by irradiating laser to the backside of the sacrificial substrate. However, the procedure is complicated and unstable because processes of detaching the mother substrate and bonding the temporary transfer substrate to the device layer are required.

With the currently developed micro-light-emitting diode transfer technologies such as line-wise transfer, pixel-wise transfer, etc., selective transfer is difficult.

As described, the transfer member used to bond micro-LEDs to a target substrate has the disadvantage that the transfer process cannot be repeated several times with the same transfer member because of its irreversible property, i.e., inability to restore to original state after being deformed.

DISCLOSURE

Technical Problem

The present disclosure is directed to providing a method for transfer and assembly of RGB micro-light-emitting diodes using vacuum suction force whereby the vacuum state of micrometer-sized adsorption holes to which micro-light-emitting diodes formed on a mother substrate or a temporary substrate are bonded is controlled selectively, so that only the micro-light-emitting diode devices desired to be detached from the mother substrate or the temporary substrate are detached from the mother substrate or the temporary substrate using vacuum suction force and then transferred to a target substrate.

Technical Solution

The present disclosure provides a method for micro-LED array transfer using a micro-vacuum module, wherein the micro-vacuum module includes a plurality of adsorption holes directly contacting with a micro-LED array being transferred and a vacuum flow channel formed to communicate with the plurality of adsorption holes, which includes: a step of contacting adsorption holes of a micro-vacuum module with a micro-LED array of a single color from among red, green and blue colors formed on a first mother substrate or a temporary substrate in the form of a chip; a step of forming suction force by creating vacuum state in a vacuum flow channel connected to the adsorption holes contacting with the micro-LED array of a single color and selectively or collectively detaching the micro-LED array of a single color from the first mother substrate or the temporary substrate; a step of aligning the detached micro-LED array by on a target substrate with a transfer member coated and then selectively or collectively releasing the same; a step of transferring a micro-LED array of a single color from among red, green and blue colors or micro-LED arrays of red, green and blue colors onto desired positions on a target substrate with a transfer member coated by conducting the detachment, alignment and releasing of the micro-LED array of a single color for a micro-LED array of the same or different color from the micro-LED array of a single color formed on a different mother substrate or a temporary substrate other than the first mother substrate or the temporary substrate; and a step of physically or electrically connecting the target substrate and the micro-LED array provided on the target substrate by deforming the conductive transfer member using an external force-applying means.

The micro-LED constituting the micro-LED array is a thin film-type micro-LED or a chip-type micro-LED. The thin film-type micro-LED includes a thin film-type micro- LED of a horizontal structure, a thin film-type micro-LED of a flip chip structure, and a thin film-type micro-LED of a vertical structure.

The micro-LED is a LED exhibiting a red color, a green color, a blue color or all of red, green and blue colors, and is aligned and collectively or selectively transferred to a target substrate with a transfer member coated using the micro-vacuum module.

The external force applied in a state whether the transfer member and the micro-LED array are stacked on the target substrate is one of a group including heat, pressure, ultrasound, physical force and van der Waals force.

The mother substrate is one of a group including GaAs, sapphire, Si, glass and a substrate on which an inorganic light-emitting diode layer can grow.

The transfer member is one of a group including a conductive adhesive material including ACF, ACA, SOCF and solder and a nonconductive adhesive material.

The target substrate is one of a group including an electrode-patterned substrate, a substrate on which semiconductor device arrays have been formed, and a backplane.

Before selectively or collectively detaching a micro-LED array of a single color from the mother substrate or the temporary substrate using a micro-vacuum module, the mother substrate with the micro-LED array of a single color formed thereon may be inverted and, after removing the mother substrate, the micro-LED array of a single color may be contacted with a temporary substrate in order to form the micro-LED array of a single color on the temporary substrate.

The temporary substrate is a substrate coated with a material (e.g., TRT, UV tape) the adhesively of which can be controlled from outside.

Advantageous Effects

A method for transfer and assembly of a RGB micro-light-emitting diode using vacuum suction force according to the present disclosure provides physical bonding and electrical connection between a micro-light-emitting diode and a target substrate at the same time through a process of aligning and transferring micro-light-emitting diodes of red, blue and green colors formed on a mother substrate to desired positions on a target substrate coated with a transfer member, and deforming the transfer member by applying an external force onto the transferred micro-light-emitting diodes using any means.

That is to say, a RGB display or LED patch allowing driving of the individual micro-light-emitting diodes is realized by aligning and mounting the micro-light-emitting diodes of the three primary colors or the micro-light-emitting diodes of the same color formed on the integrated mother substrate or temporary substrate or on different mother substrates or temporary substrates onto the desired positions on the target substrate.

After cutting and grinding the mother substrate including the packaged RGB chip-type micro-LEDs, it is transferred to the target substrate by a roll-type external force-applying means using a micro-vacuum module.

BEST MODE

Figure 1:
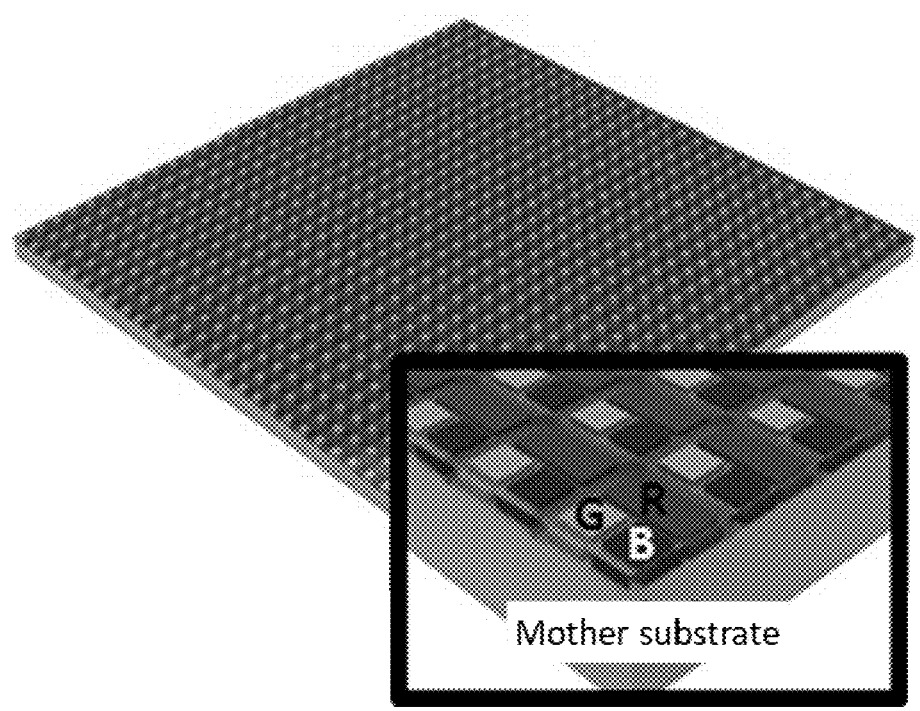
FIGS. 1-8 illustrate a process of transferring chip-type RGB micro-LEDs packaged on a mother substrate according to an exemplary embodiment of the present disclosure.

Hereinafter, the present disclosure will be described in detail through examples. However, the following examples are for illustrative purposes only and it will be apparent to those of ordinary skill in the art that the scope of the present disclosure is not limited by the examples.

All the factors relating to the processes in the present disclosure, including a mother substrate on which micro-LEDs are formed, a target substrate to which the micro-LEDs are transferred, a transfer member coated on the target substrate, an external force-applying means applying external force to the micro-LEDs transferred onto the target substrate, etc. are applied identically to both chip-type micro-LEDs and thin film-type micro-LEDs.

A micro-vacuum module performing micro-vacuum adsorption in the present disclosure has a process substrate on which a first connection hole connected to an external pump module and a second connection hole connected to a vacuum controller are formed, a base substrate on which adsorption holes are formed below the process substrate with being spaced apart, and an intermediate layer on which a single or a plurality of vacuum flow channel(s) are formed to correspond to the adsorption holes between the process substrate and the base substrate. That is to say, the intermediate layer having the vacuum flow channels formed between the process substrate and the base substrate serves as a support layer and the plurality of channels are communicated with the adsorption holes therebelow.

For selective transfer for each vacuum flow channel, vacuum should be created in each channel pattern or line pattern formed along the plurality of vacuum flow channels. Here, the channel pattern or the line pattern may be defined as a structure wherein the vacuum flow channels and the adsorption holes are connected.

In order to separate devices to be transferred onto a target substrate for different channels, the devices should be lifted with adsorption force delivered through the adsorption holes existing in the channel. Therefore, the width of the vacuum flow channel covering the adsorption holes should be designed such that the adsorption holes existing on another vacuum flow channel pattern are not affected.

According to the present disclosure, the LEDs of red, green and blue colors formed on a mother substrate or a temporary substrate are aligned and transferred to a target substrate optionally coated with a transfer member using a micro-vacuum module.

That is to say, the transfer of micro-LED arrays using a micro-vacuum module is achieved through a layout structure between a mother substrate or a temporary substrate, a target substrate, a micro-LED array and a micro-vacuum module. And, a RGB display or a LED patch in which the micro-LEDs on the target substrate can be driven individually is realized by physically bonding and electrically connecting the electrode and LEDs formed on the target substrate through a process of deforming the transfer member by applying external force onto the micro-LEDs aligned on the target substrate coated with the transfer member.

The basic concept used in the present disclosure is as follows.

The micro-LED refers to an inorganic light-emitting diode with a size of 100 μm or smaller. The micro-LED is classified into a chip-type micro-LED and a thin film-type micro-LED, and the thin film-type micro-LED is classified into a horizontal, flip chip, or vertical thin film micro-LED.

The chip-type micro-LED refers to a packaged inorganic light-emitting diode with a thickness of 50 μm or greater and a size of 100 μm or smaller.

The thin film micro-LED refers to an inorganic light-emitting diode with a thickness 5 μm or smaller and a size of 100 μm or smaller.

The micro-LED with a flip chip structure is a micro-LED wherein both an n-contact pad and a p-contact pad are exposed on one side of the LED chip and light is emitted toward the surface with no electrode formed. Meanwhile, the micro-LED with a vertical structure is a micro-LED where the n-contact pad and the p-contact pad are exposed on the sides parallel to the LED chip.

The external force applied in a state whether the transfer member and the micro-LED array are stacked on the target substrate may be one of a group including heat, pressure, ultrasound, physical force, van der Waals force and rolling.

The mother substrate may be one of a group including GaAs, sapphire, Si, glass and a substrate on which an inorganic light-emitting diode layer can grow.

The temporary substrate may be one of a group including a substrate coated with a material (e.g., TRT, UV tape) the adhesively of which can be controlled from outside, a substrate with a eutectic bonding layer formed, and a copper plate for mechanical detachment.

The transfer member may be one of a group including a conductive adhesive material including ACF, ACA, SOCF and solder and a nonconductive adhesive material.

The target substrate may be one of a group including an electrode-patterned substrate, a substrate on which semiconductor device arrays have been formed, and a backplane. The target substrate may be flexible or hard.

In the present disclosure, transfer is possible using the micro-vacuum module regardless of whether the micro-LED has a chip-type structure or a thin film-type structure.

On the surface of a red micro-LED formed on the mother substrate in the form of a chip, a vacuum hole of the micro-vacuum module is contacted. The vacuum hole may refer to an array of holes constituting the micro-vacuum module.

After forming suction force by creating a vacuum state in the adsorption holes contacted with the micro-LED array of a single color, the micro-LED array of a single color is detached collectively or selectively from the mother substrate or the temporary substrate.

The detached micro-LED array is aligned and then released collectively or selectively onto the target substrate coated with the transfer member.

By repeatedly performing the same process of detachment, alignment and release of the micro-LED array for micro-LED arrays of the same or different colors formed on another mother substrate or temporary substrate, micro-LED arrays of red, green and blue colors or a micro-LED array of a single color from among them are transferred collectively or selectively to the desired positions on the target substrate coated with the transfer member.

The micro-LED arrays aligned on the target substrate is physically contacted and electrically connected to the target substrate by deforming the transfer member using an external force-applying means.

FIGS. 1-8 illustrate a process of transferring chip-type RGB micro-LEDs packaged on a mother substrate according to an exemplary embodiment of the present disclosure.

First, referring to FIG. 1, packaged chip-type RGB micro-LEDs of the three primary colors are formed on a mother substrate.

Figure 2:
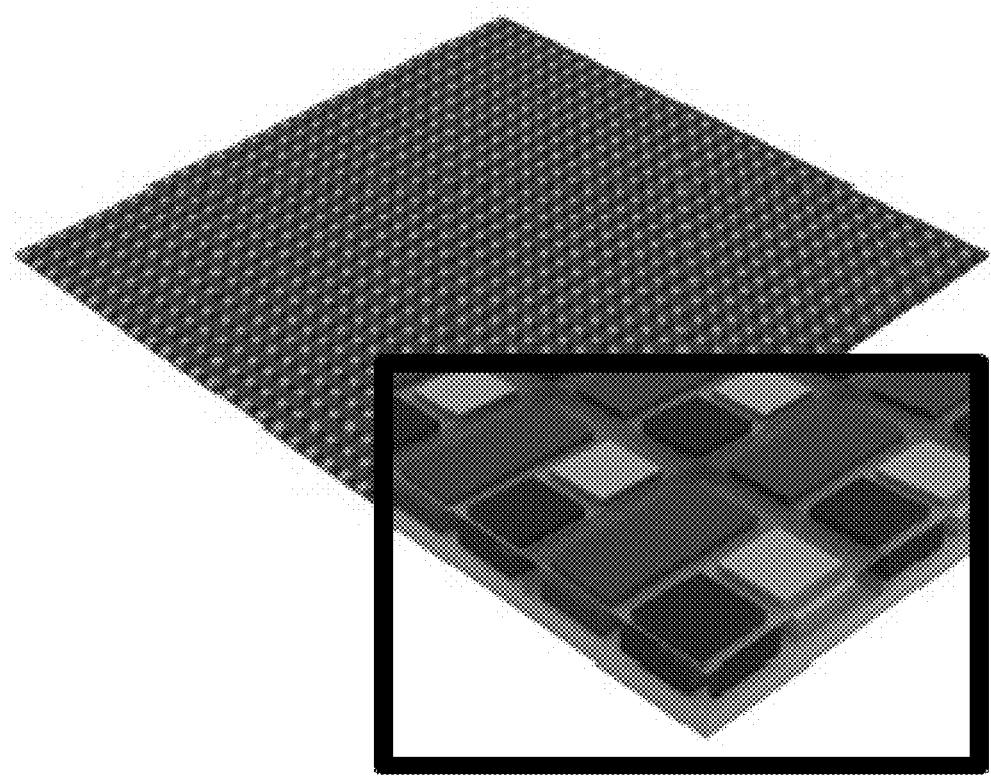

Referring to FIG. 2, the chip-type RGB micro-LEDs of the three primary colors are grinded by grinding the mother substrate to a thickness of tens to several micrometers.

Figure 3:
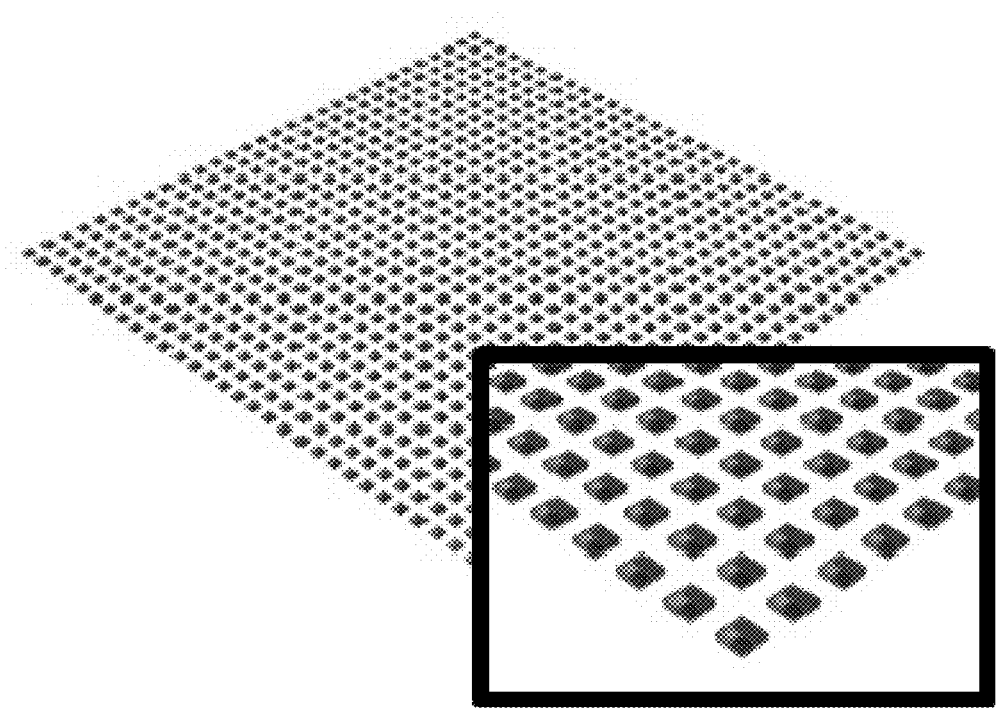

Referring to FIG. 3, the packaged chip-type micro-LEDs are cut into chip forms including the mother substrate. The cutting may be performed by laser cutting, wafer sawing or plasma dicing. Through this process, the mother substrate may be grinded to a thickness of tens to several micrometers.

Figure 4:
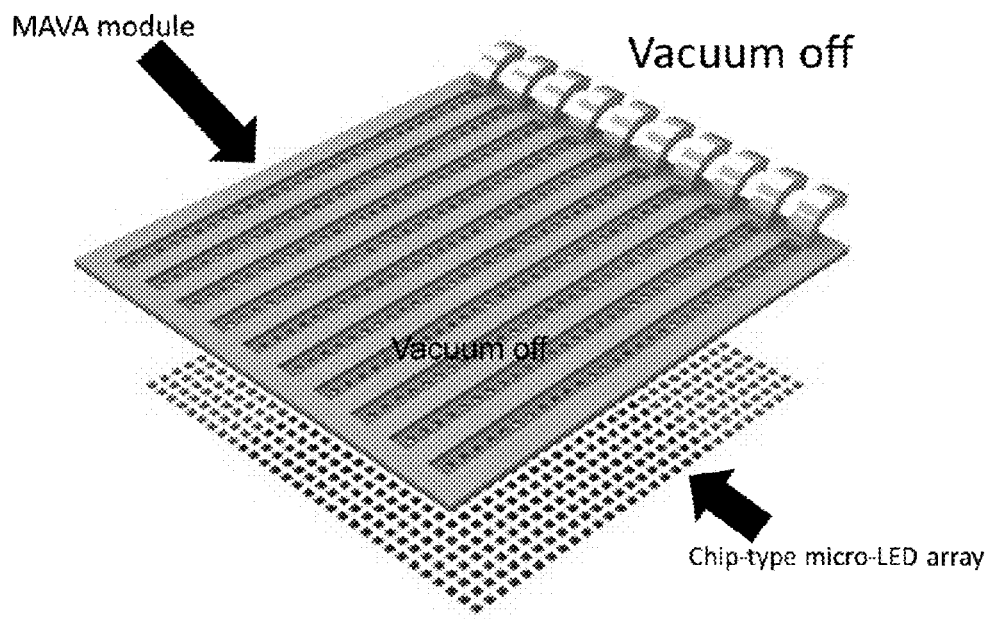

Then, referring to FIG. 4, a MAVA module, which is a micro-vacuum module, is positioned on the chip-type micro-LED array.

Figure 5:
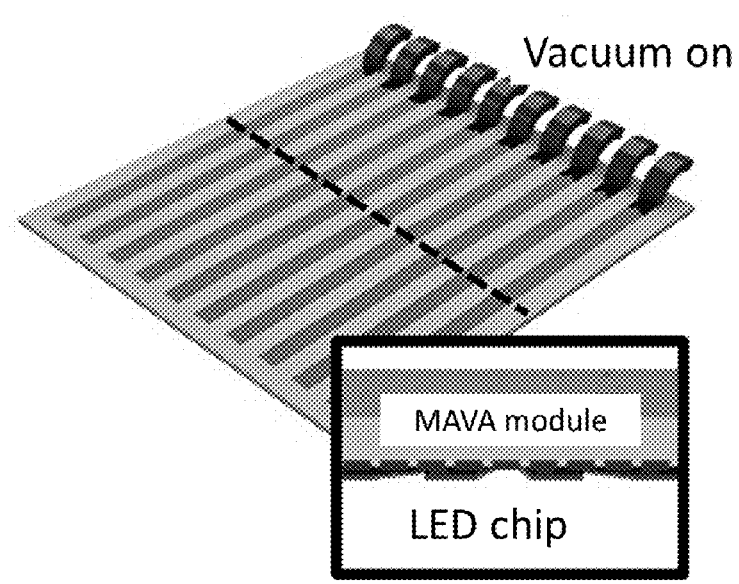

Referring to FIG. 5, in the state where the micro-vacuum module is positioned on the chip-type micro-LED array, the chip-type micro-LEDs are lifted by contacting with the chip-type micro-LEDs and forming vacuum.

Figure 6:
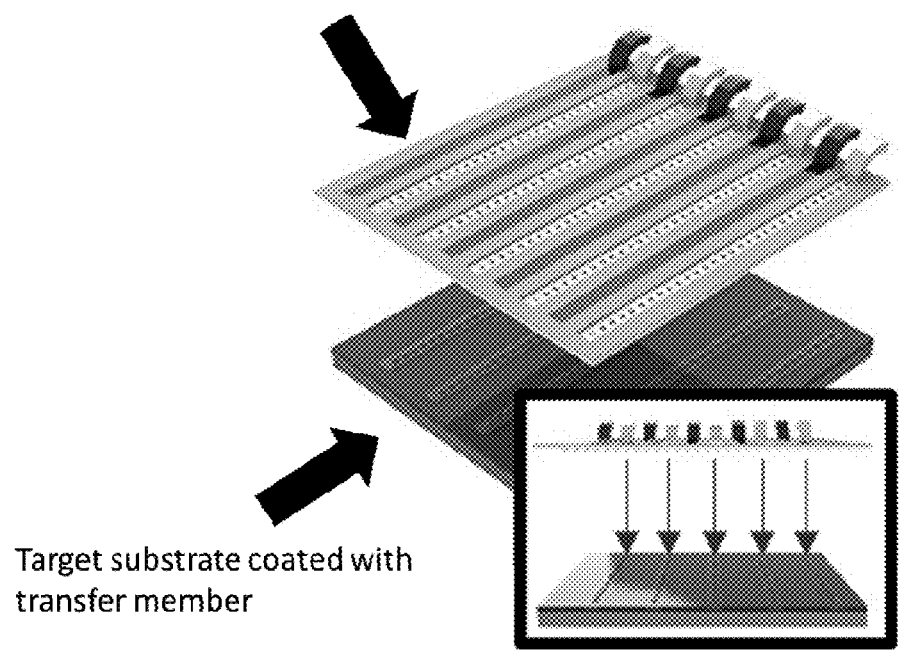

Referring to FIG. 6, the chip-type micro-LEDs are aligned and transferred onto a target substrate coated with a transfer member using the micro-vacuum module capable of selectively adsorbing the chip-type micro-LEDs.

Figure 7:
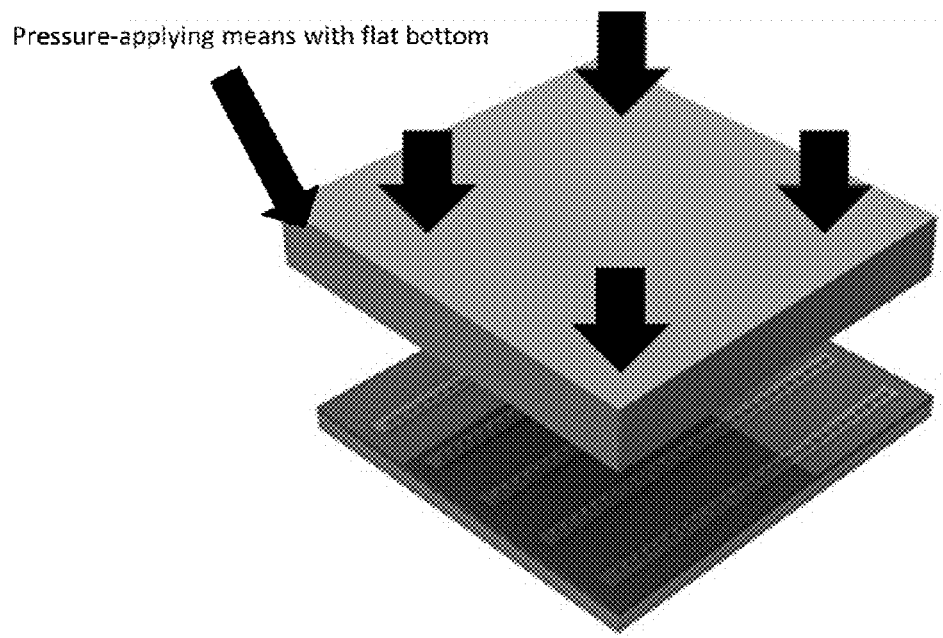

Referring to FIG. 7, the target substrate and the chip-type micro-LEDs are connected electrically and physically by deforming the conductive transfer member during a process of applying pressure to the chip-type micro-LEDs transferred onto the target substrate using an external force-applying means.

Figure 8:
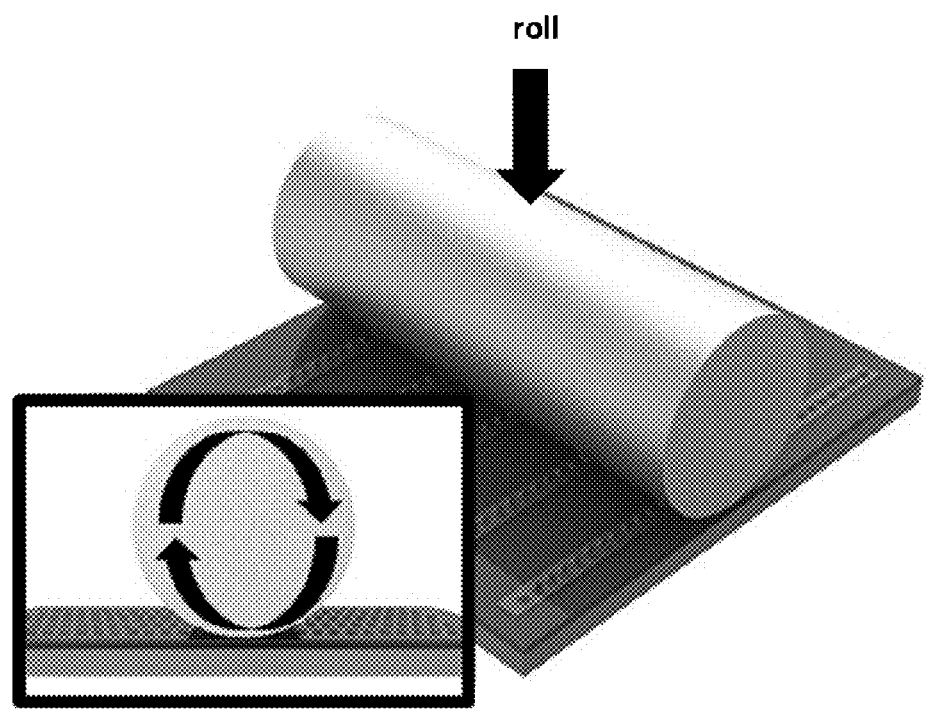

Referring to FIG. 8, in an exemplary embodiment of the present disclosure, the transfer member is deformed and the micro-LEDs and the target substrate are connected by applying external force to the transferred chip-type micro-LEDs using a roll as the external force-applying means.

The existing micro-LED technologies have the problem that it is difficult to realize a large-sized RGB display because pressure is applied to the whole surface of the target substrate when connecting the micro-LEDs and the target substrate. In contrast, the present disclosure enables realization of a large-sized RGB display with much smaller pressure than the existing micro-LED technologies because pressure is applied linearly to the target substrate by pressing with a roll as described above.

Hereinafter, the transfer process of micro-LEDs with a thin film-type flip chip/vertical structure is described in detail.

First, the transfer process of micro-LEDs with a thin film-type flip chip structure is described.

An n-electrode and a p-electrode for electrical connection with the n-contact pad and the p-contact pad of each micro-LED should be formed on the target substrate. The temporary substrate for the micro-LED with a flip chip structure refers to a transfer substrate coated with a material (e.g., TRT, UV tape) the adhesively of which can be controlled from outside, which is used to transfer of the micro-LED from the mother substrate to the target substrate.

Figure 9:
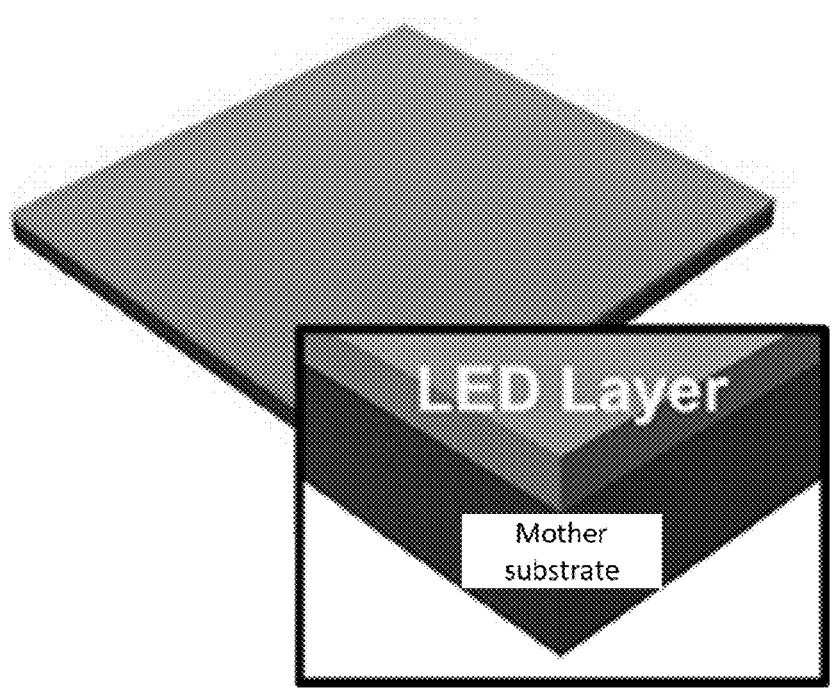
FIGS. 9-45 illustrate a process of transferring micro-LEDs of thin film-type vertical structure according to another exemplary embodiment of the present disclosure.
Figure 10:
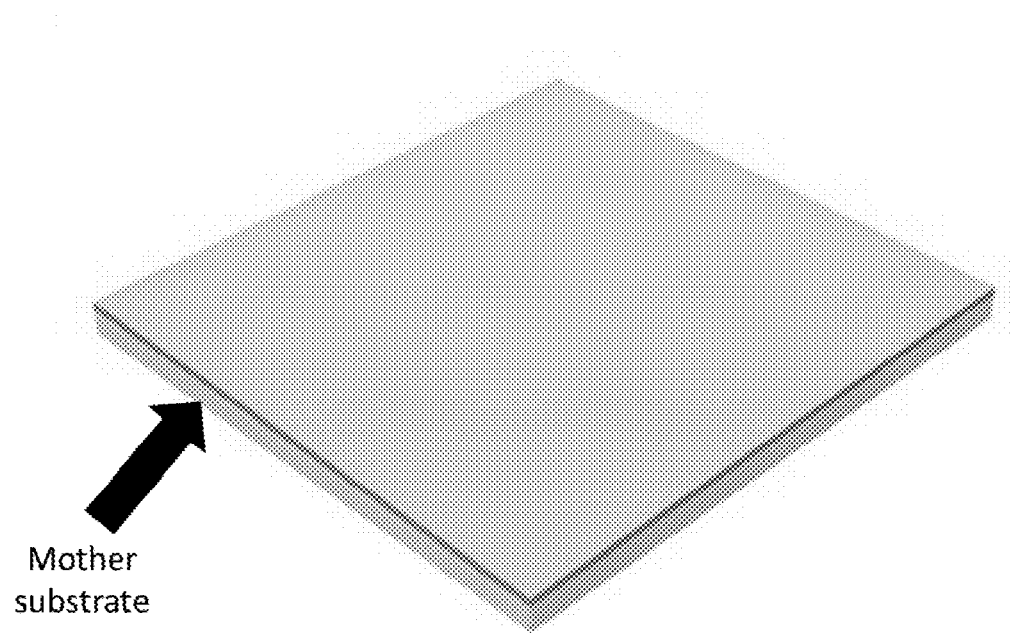
Figure 11:
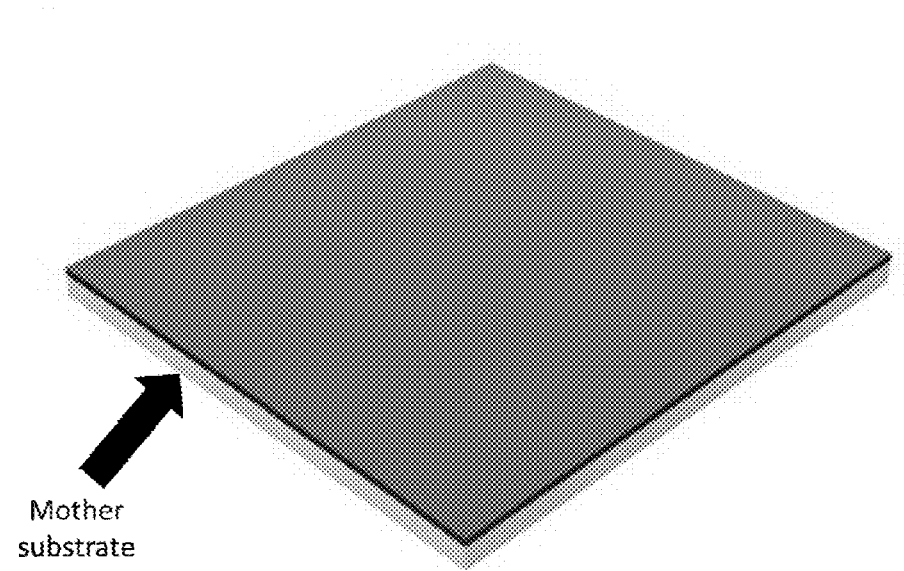

Referring to FIGS. 9-11, red, green and blue LED layers are formed on mother substrates. That is to say, red, green and blue μLED epitaxy layers are formed on first, second and third mother substrates, respectively.

Figure 12:
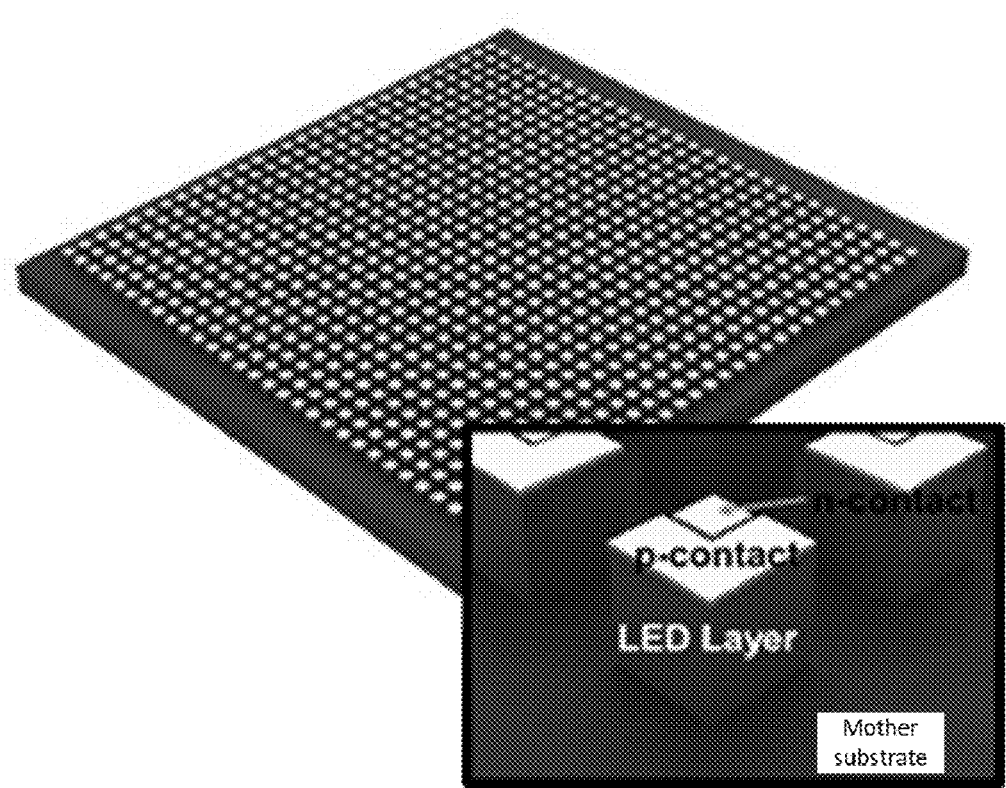
Figure 13:
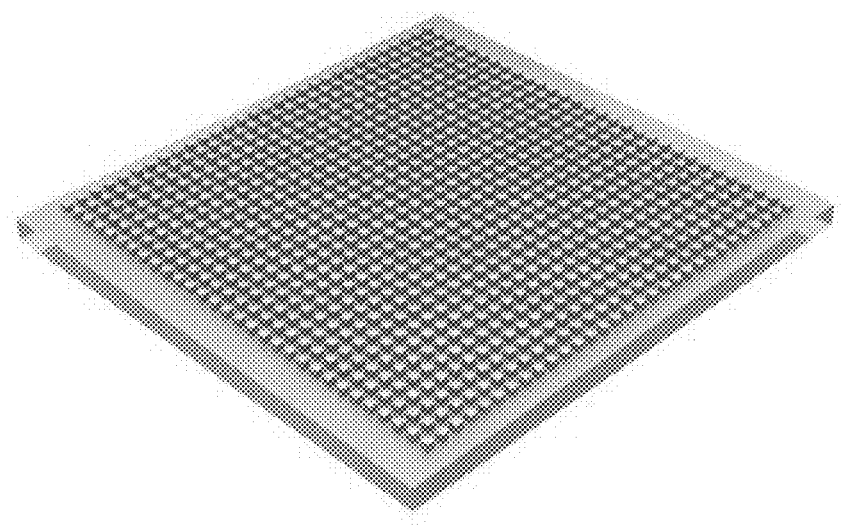
Figure 14:
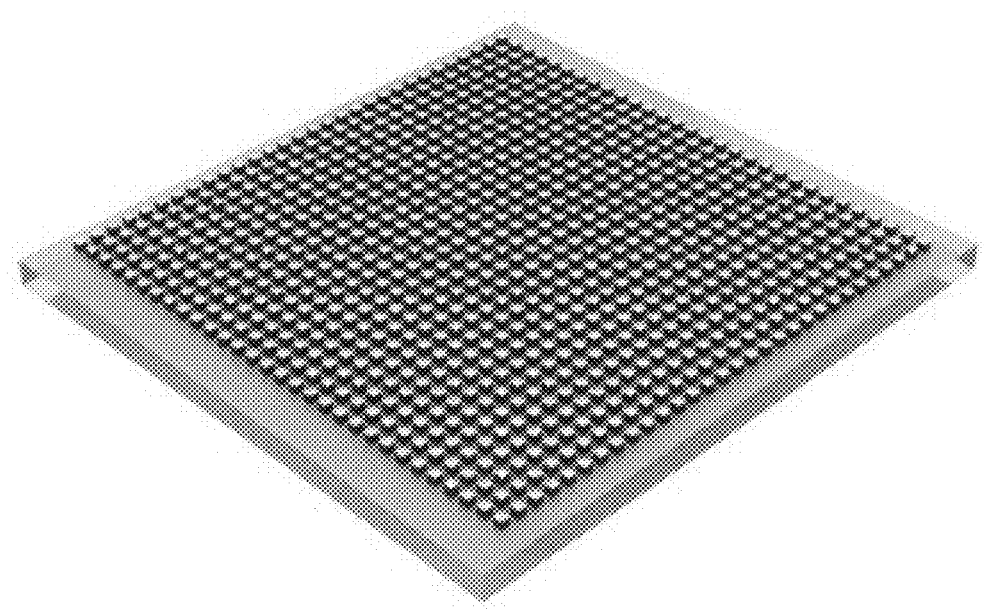

Referring to FIGS. 12-14, the red, green and blue LED layers are etched into flip chips and ohmic contact layers are formed. That is to say, a plurality of μLEDs are formed by patterning and etching the LED layers.

A photosensitizer or a UV-cured polymer is patterned on each epitaxy layer in the form of LED chips. The μLEDs of the three colors are formed by dry-etching the μLED epitaxy layer, and the patterned photosensitizer or UV-cured polymer is removed.

Figure 15:
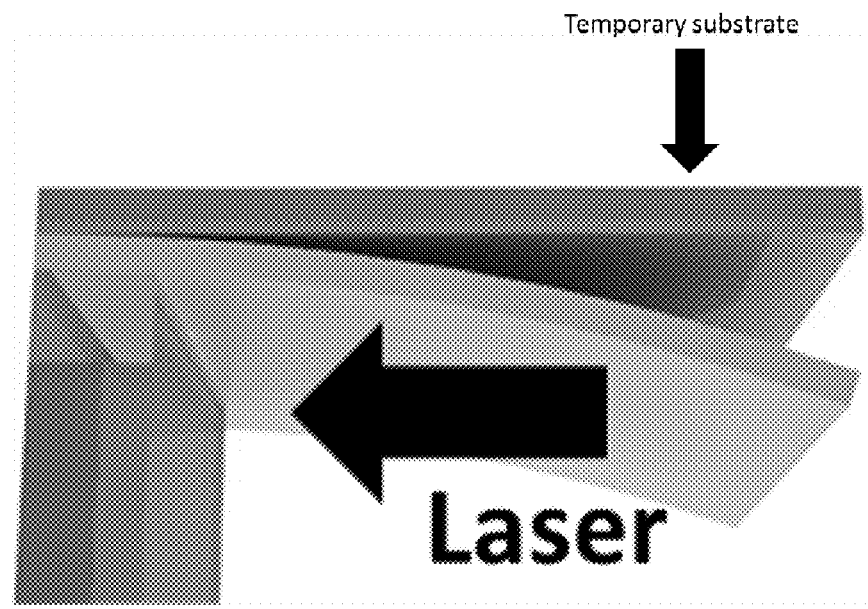
Figure 16:
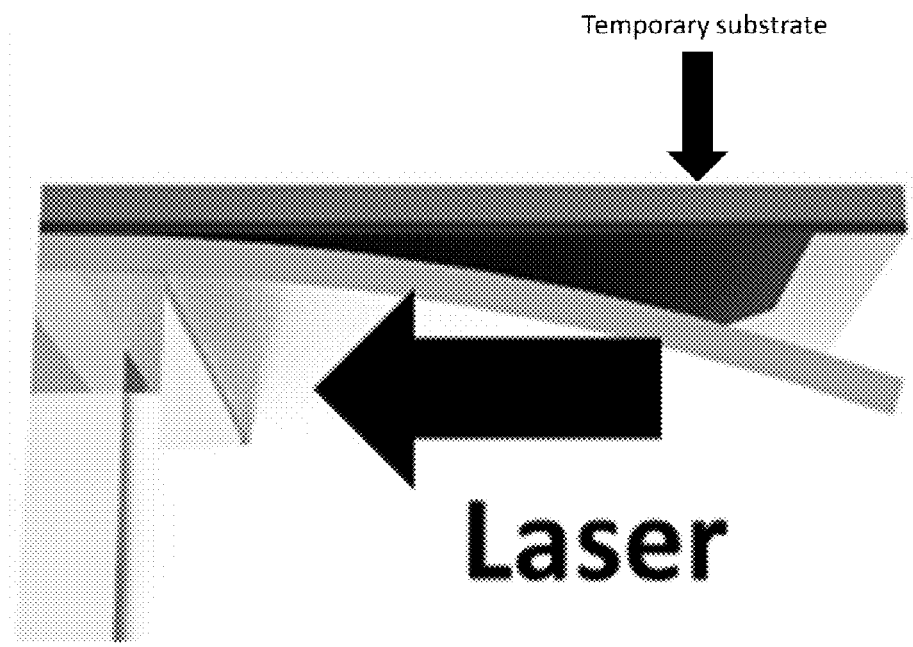

Referring to FIGS. 15-16, after attaching a temporary substrate on the surface of the red and blue LED layers, the mother substrate is removed by irradiating laser between the mother substrate and the LED layer. The mother substrate with the LED layer formed thereon is inverted and then the LED layer is aligned and contacted on the temporary substrate. An adhesive material for physical bonding between the LED layer and the temporary substrate may be coated on the temporary substrate.

Figure 17:
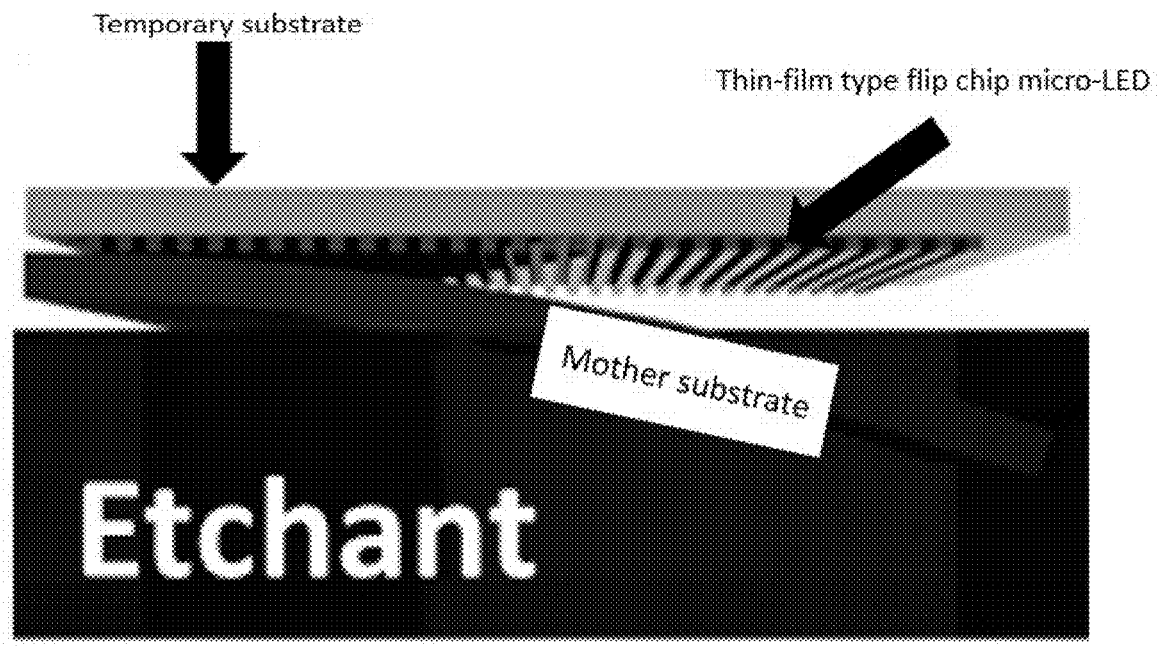

Referring to FIG. 17, a temporary substrate is attached on the surface of the red LED layer and then the mother substrate is removed through chemical etching. The mother substrate is removed by wet etching using a chemical solution.

The temporary substrate may be stacked on the plurality of micro-LEDs by eutectic bonding.

Figure 18:
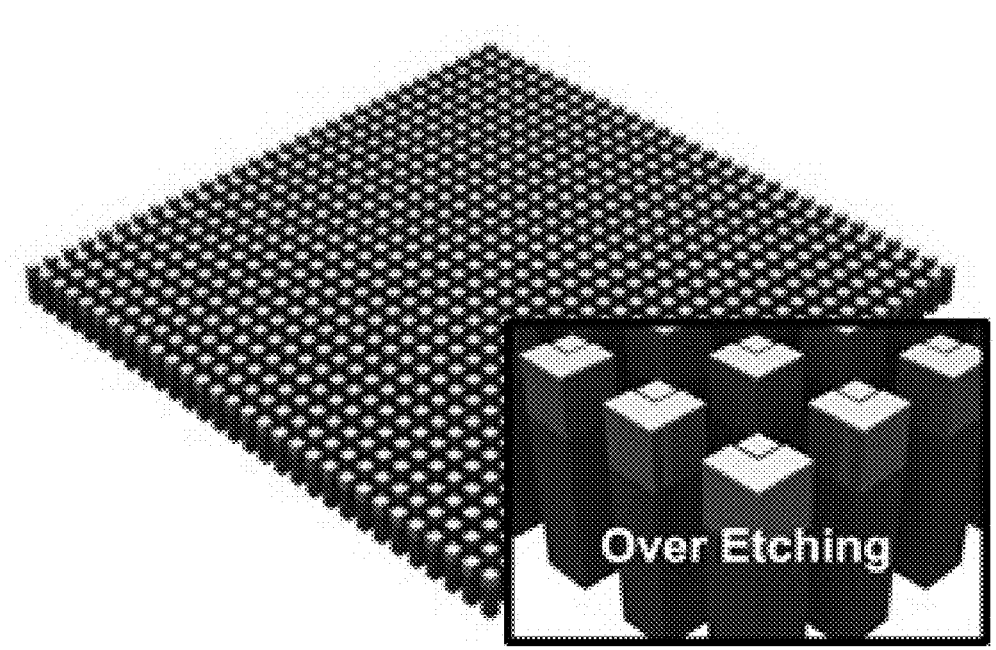

FIG. 18 shows an over-etched temporary substrate below the flip chip-type red micro-LEDs wherein contact pads face downward.

Figure 19:
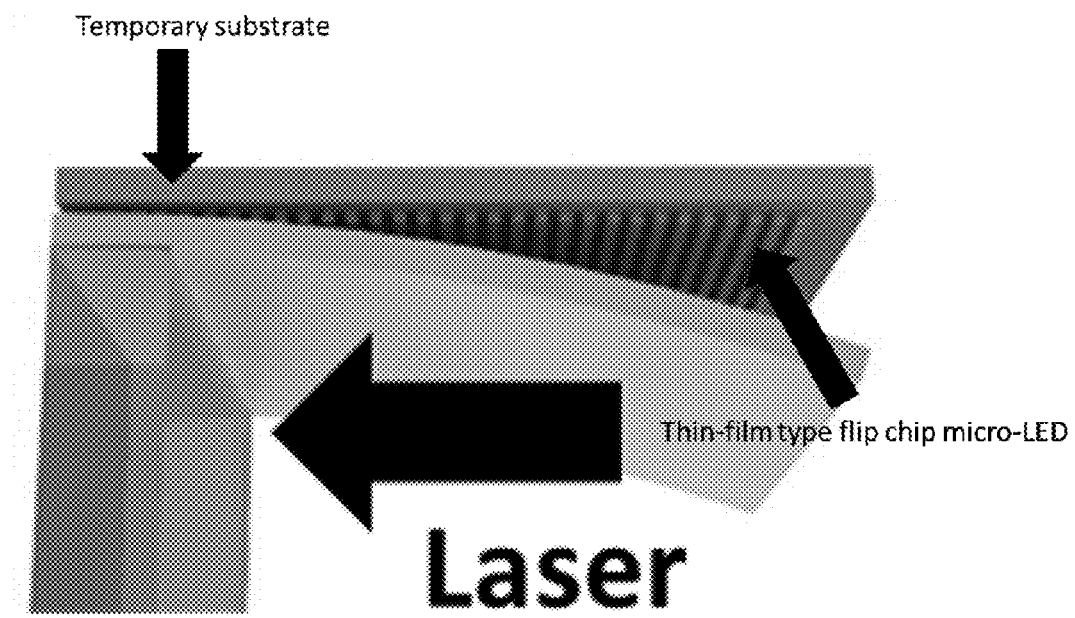
Figure 20:
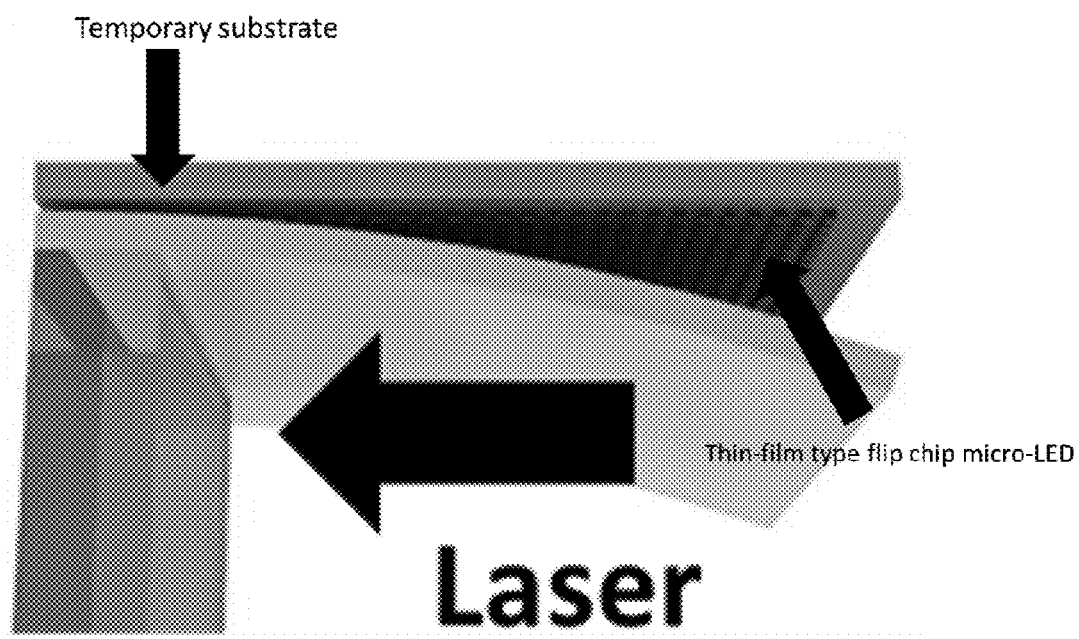

Referring to FIGS. 19-20, a temporary substrate is attached on the surface of the green and blue thin film-type flip chip micro-LED chips formed on the mother substrate and then the mother substrate is removed using laser.

The mother substrate including the μLEDs of the three colors is removed by laser lift-off, wet etching, CMP, etc. and the μLEDs are formed on the temporary substrate in an inverted state. That is to say, the n-contact and the p-contact face toward the temporary substrate.

Figure 21:
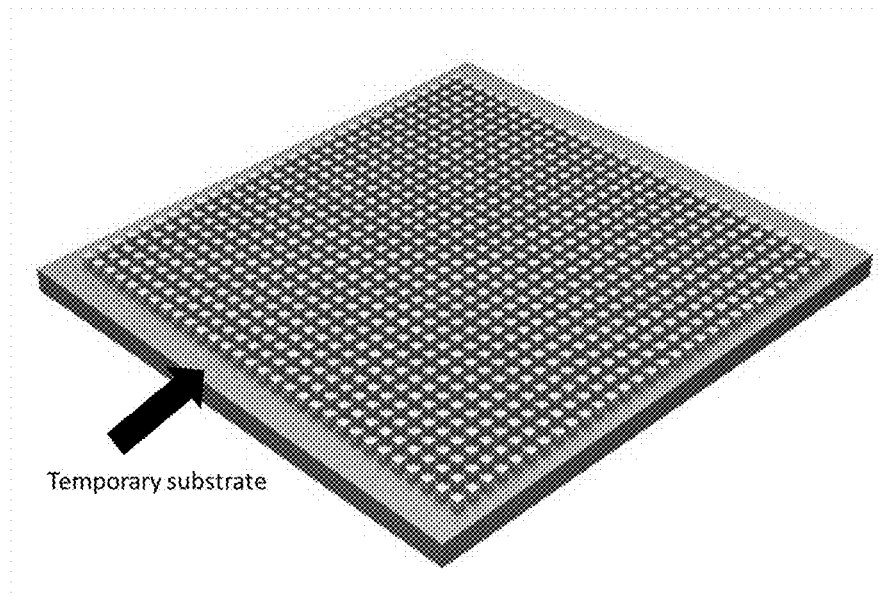
Figure 22:
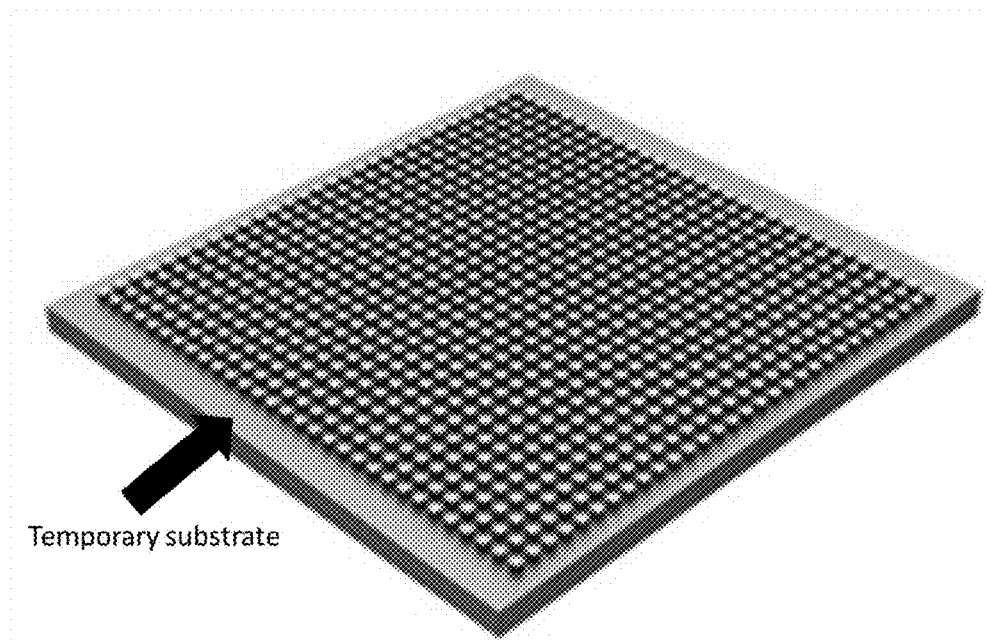

Referring to FIGS. 21-22, green and blue LED layers formed on temporary substrates are etched into flip chips and ohmic contact layers are formed. A photosensitizer or a UV-cured polymer is patterned on chip-type μLEDs formed through dry etching in the form of a p-contact, and then dry etching is performed to expose the n-contact layer of each LED chip. Then, the patterned photosensitizer or UV-cured polymer is removed. An ohmic contact Layer is formed on the n-contact layer and the p-contact layer of all the μLEDs.

Figure 23:
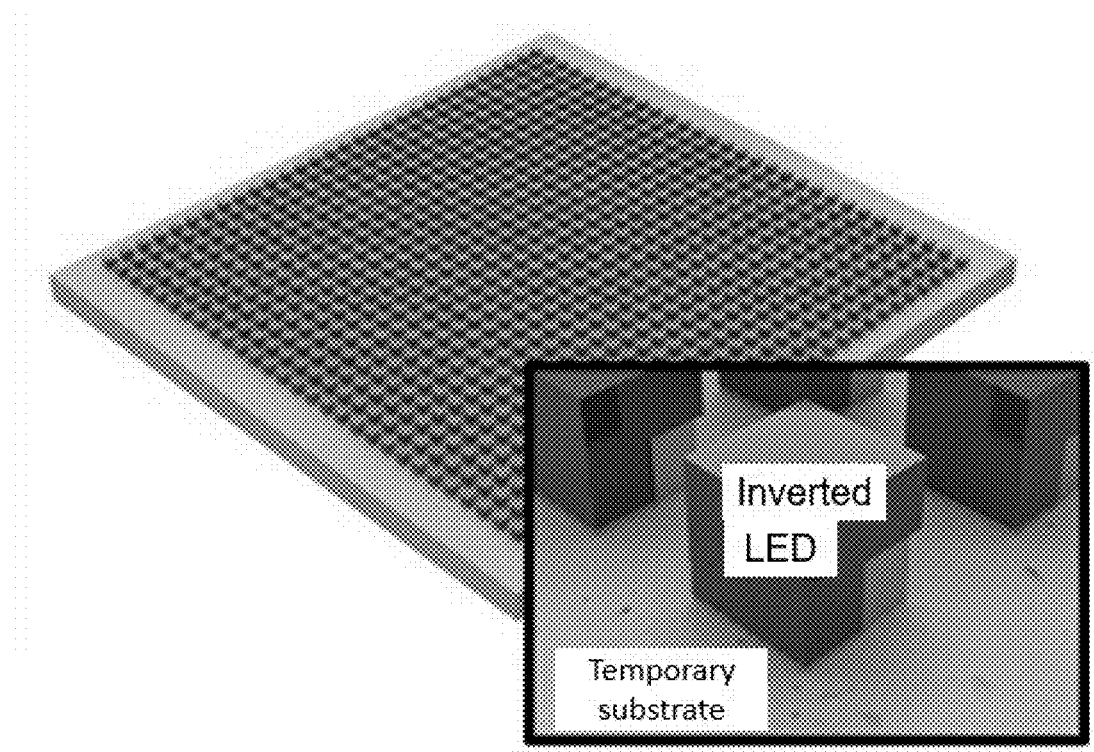
Figure 24:
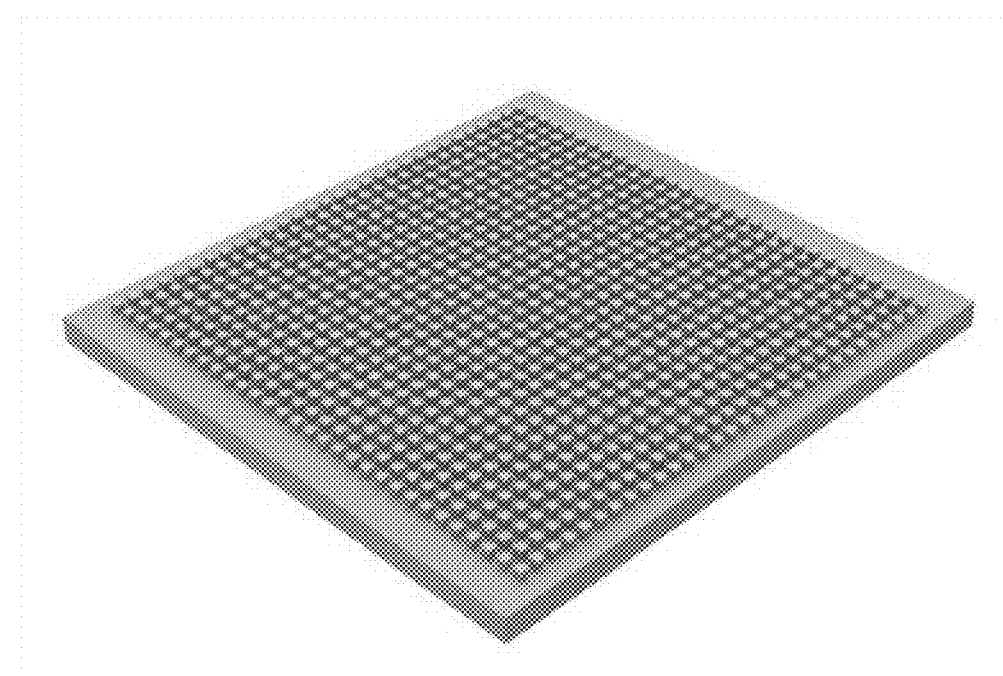
Figure 25:
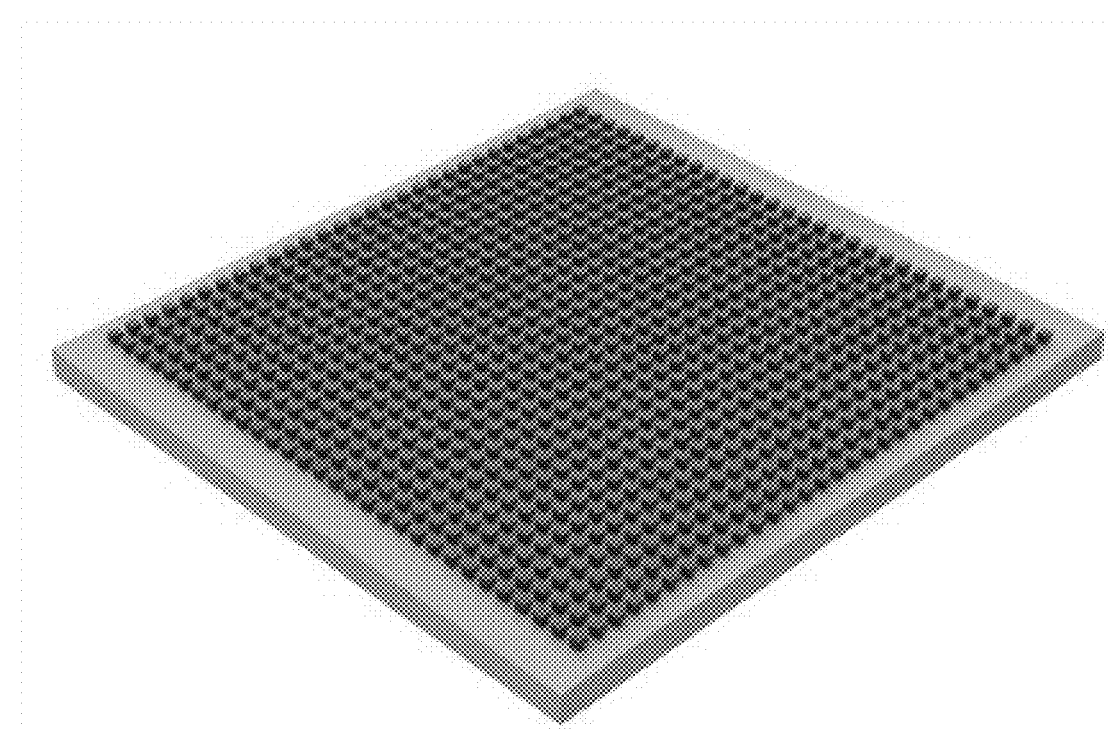

FIGS. 23-25 show red, green and blue thin film-type flip chip micro-LEDs on a temporary substrate, which are inverted so that ohmic contact layers face downward.

Figure 26:
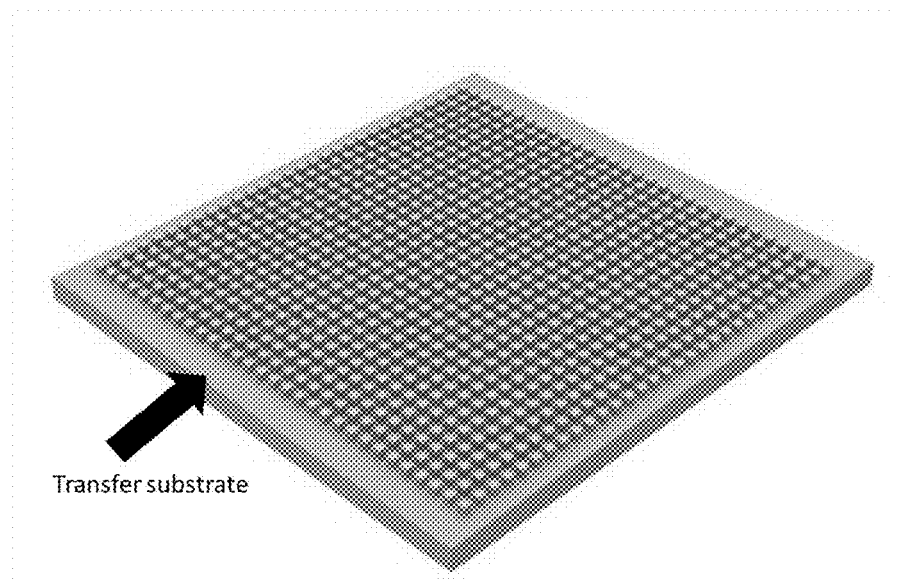
Figure 27:
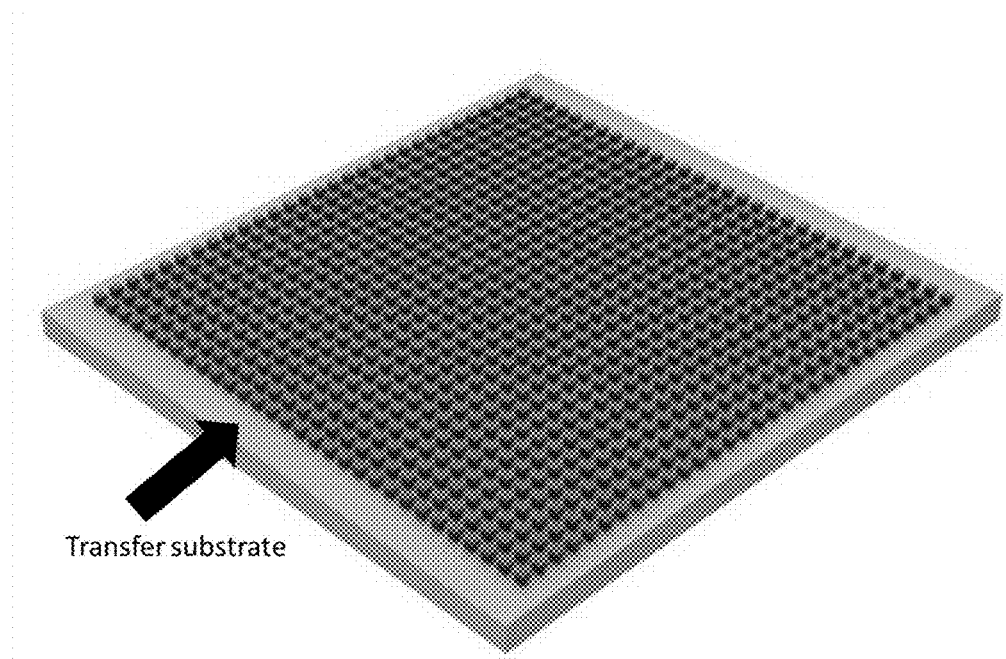

FIGS. 26-27 show green and blue flip chip micro-LEDs formed on a transfer substrate by attaching thin film-type flip chip micro-LEDs on a transfer substrate and then removing a temporary substrate.

Figure 28:
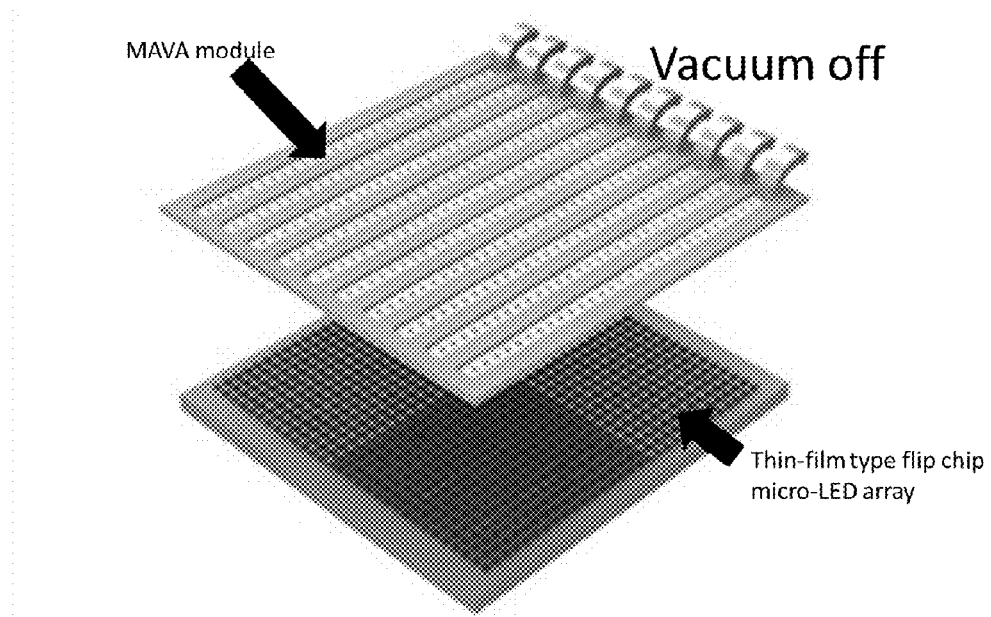
Figure 29:
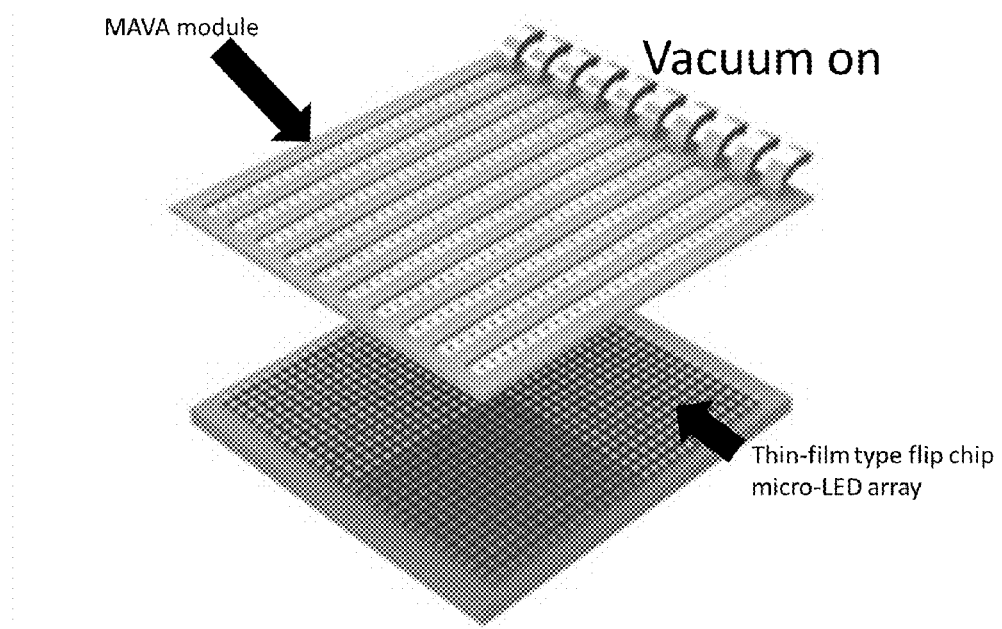
Figure 30:
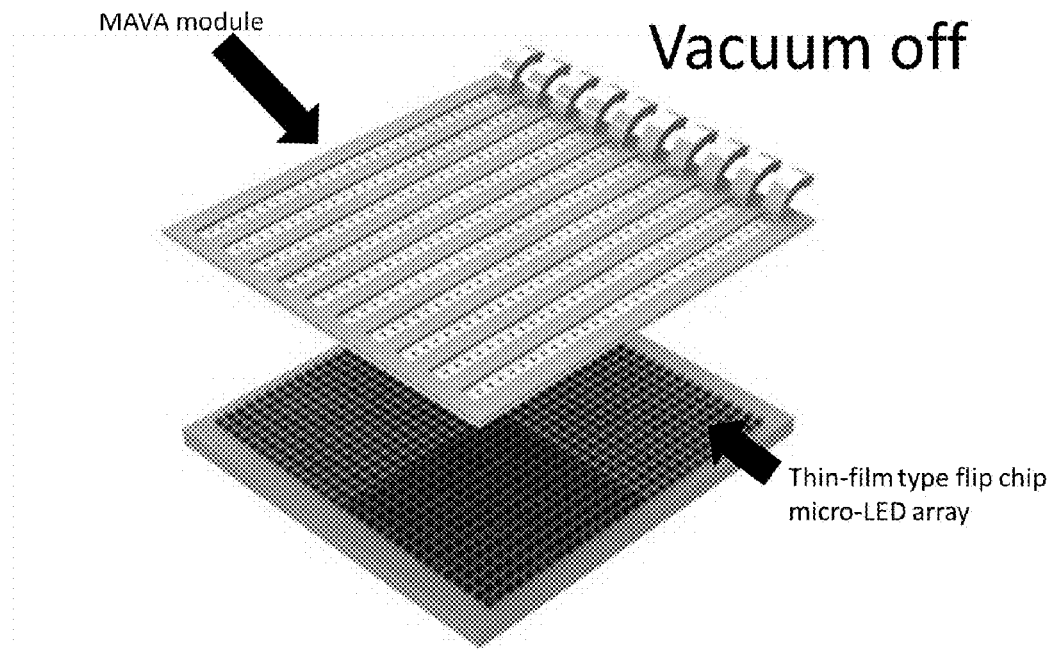

Referring to FIGS. 28-30, application of vacuum is prepared in a state where red, green and blue thin film-type flip chip micro-LEDs attached on a transfer substrate and a micro-vacuum module are aligned.

Figure 31:
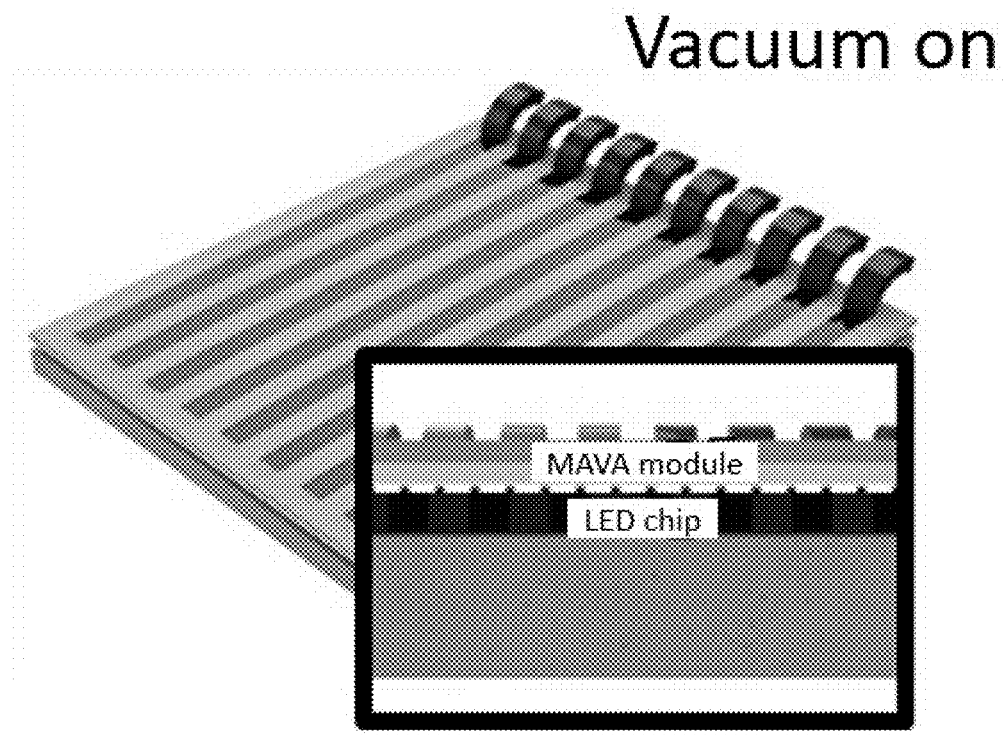
Figure 32:
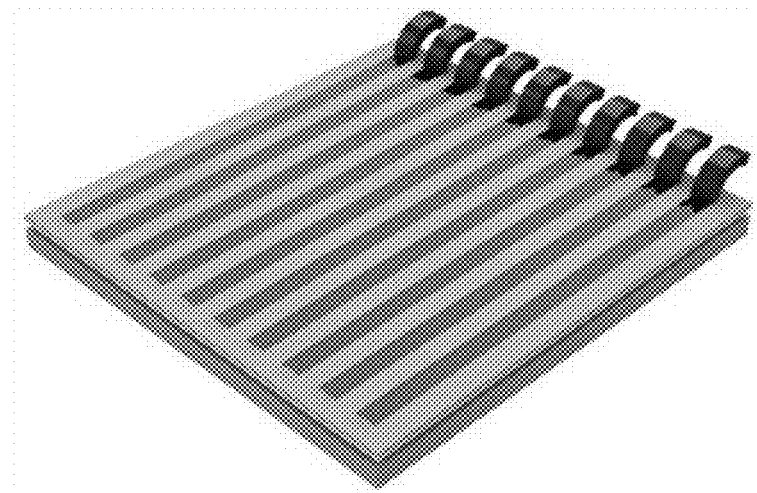
Figure 33:
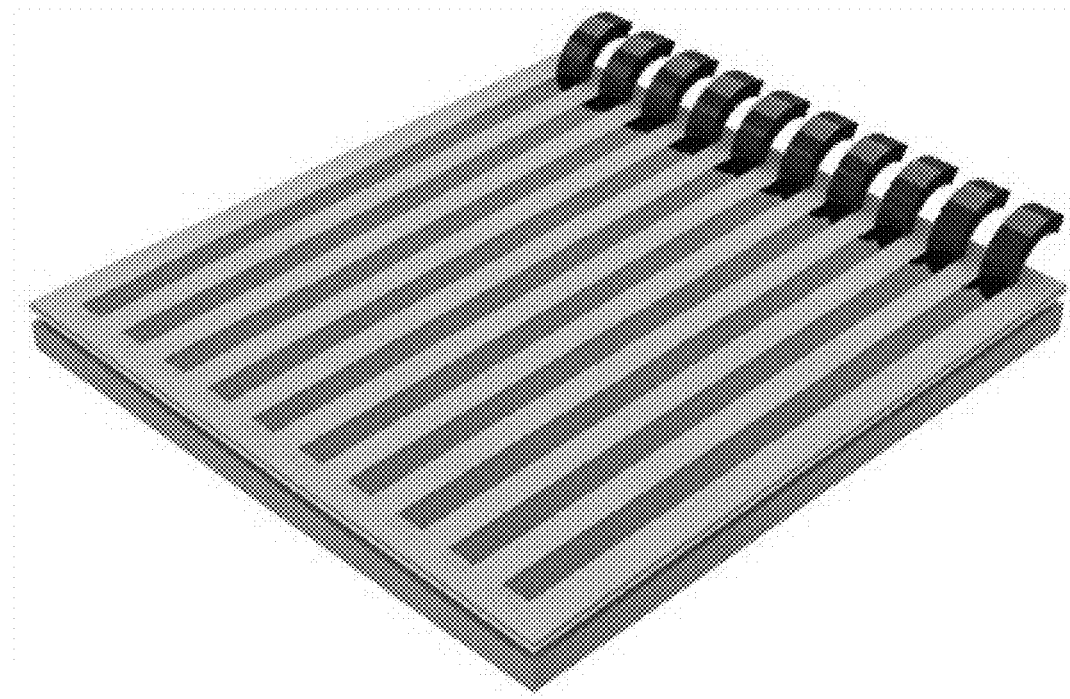

Referring to FIGS. 31-33, a micro-vacuum module is contacted with red, green and blue thin film-type flip chip micro-LED arrays and the micro-LEDs are attached by forming vacuum.

Figure 34:
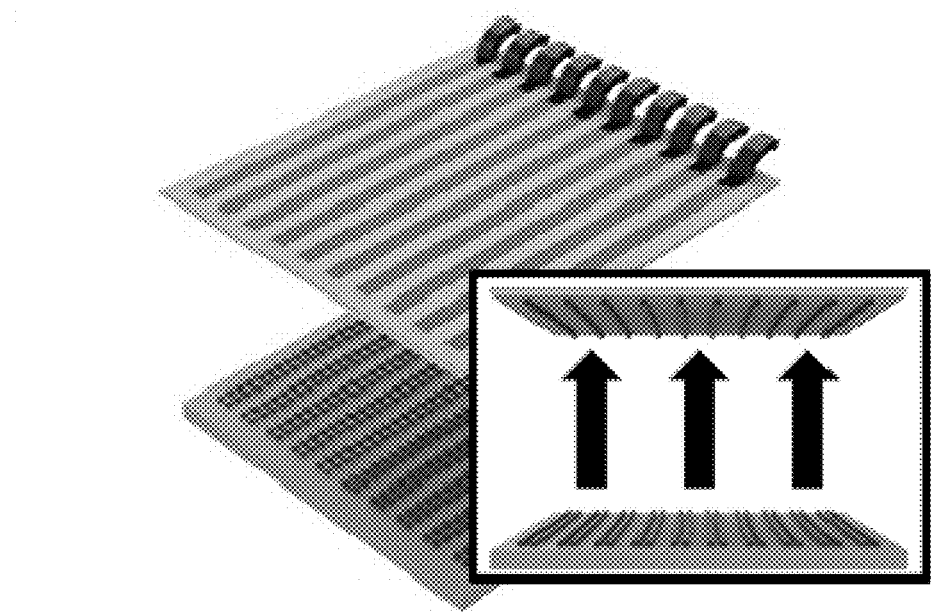
Figure 35:
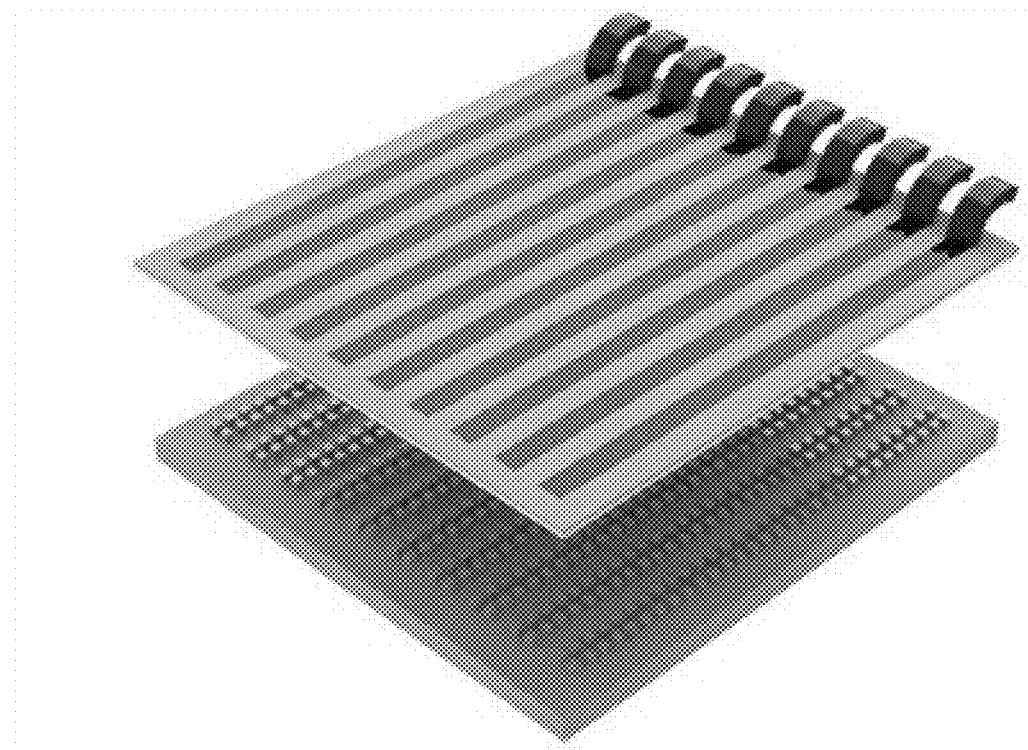
Figure 36:
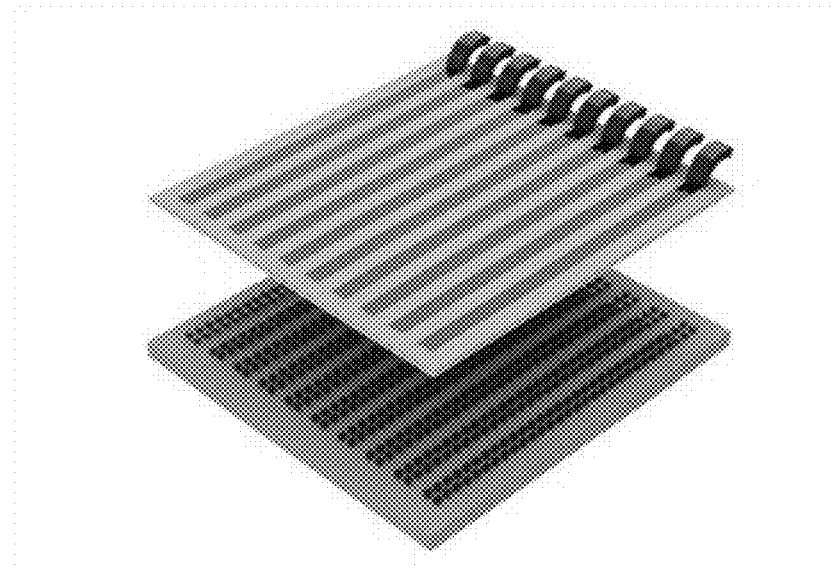

Referring to FIGS. 34-36, after a micro-vacuum module is contacted with red, green and blue thin film-type flip chip micro-LED arrays, the micro-LEDs are lifted by forming vacuum. After contacting the adsorption holes of the micro-vacuum module with the surface of the micro-LEDs formed on a temporary substrate in the form of chips, suction force is formed by creating a vacuum state in the adsorption holes contacted with the micro-LEDs and the micro-LEDs are detached from the temporary substrate using the same.

Figure 37:
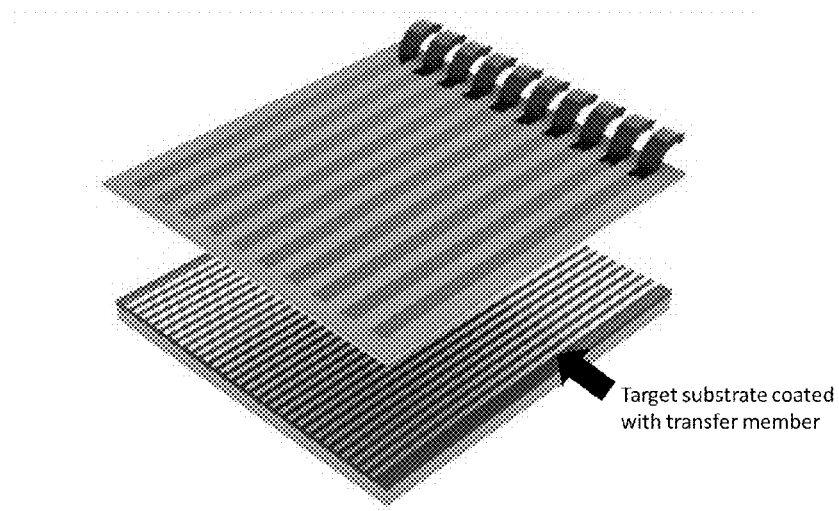
Figure 38:
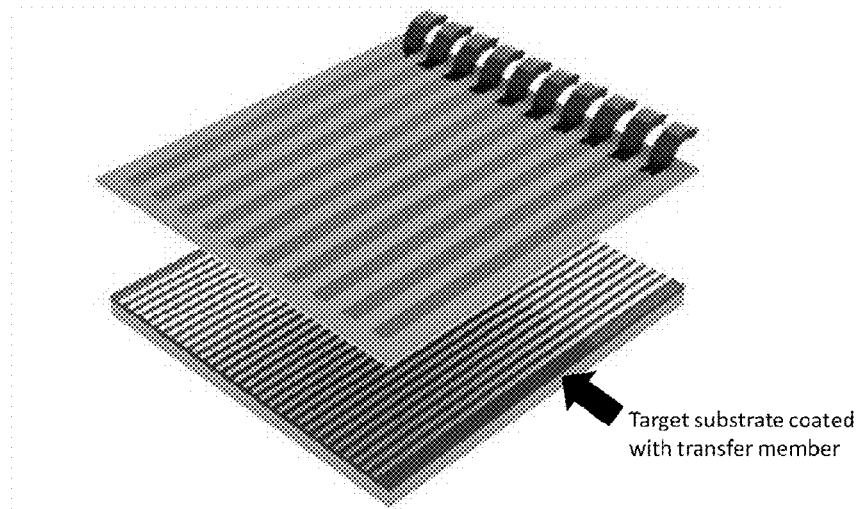
Figure 39:
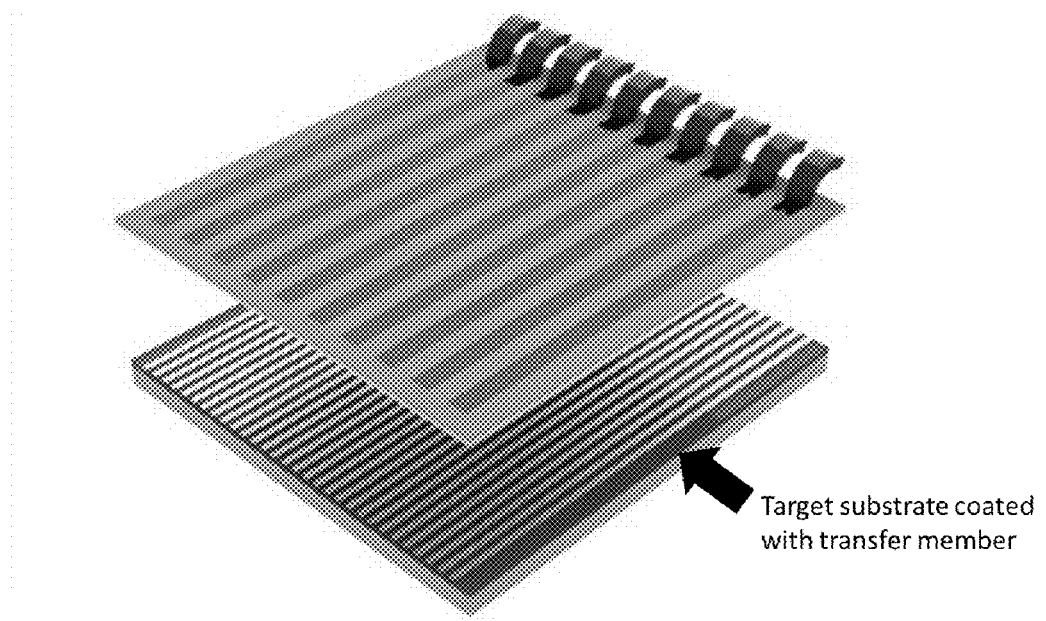

Referring to FIGS. 37-39, red, green and blue thin film-type flip chip micro-LED arrays on a micro-vacuum module and a target substrate coated with a transfer member are aligned.

Figure 40:
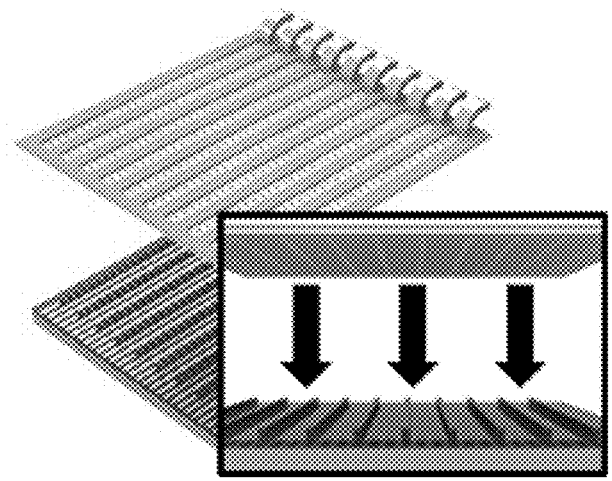
Figure 41:
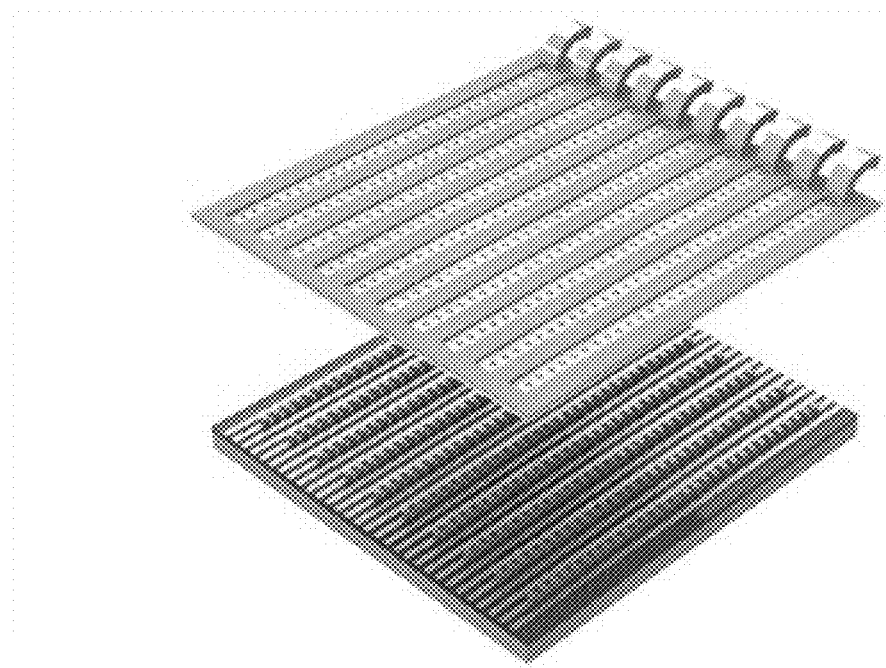
Figure 42:

Referring to FIGS. 40-42, red, green and blue thin film-type flip chip micro-LEDs are released from a micro-vacuum module to a target substrate by releasing vacuum in the vacuum flow channels constituting the micro-vacuum module.

Figure 43:
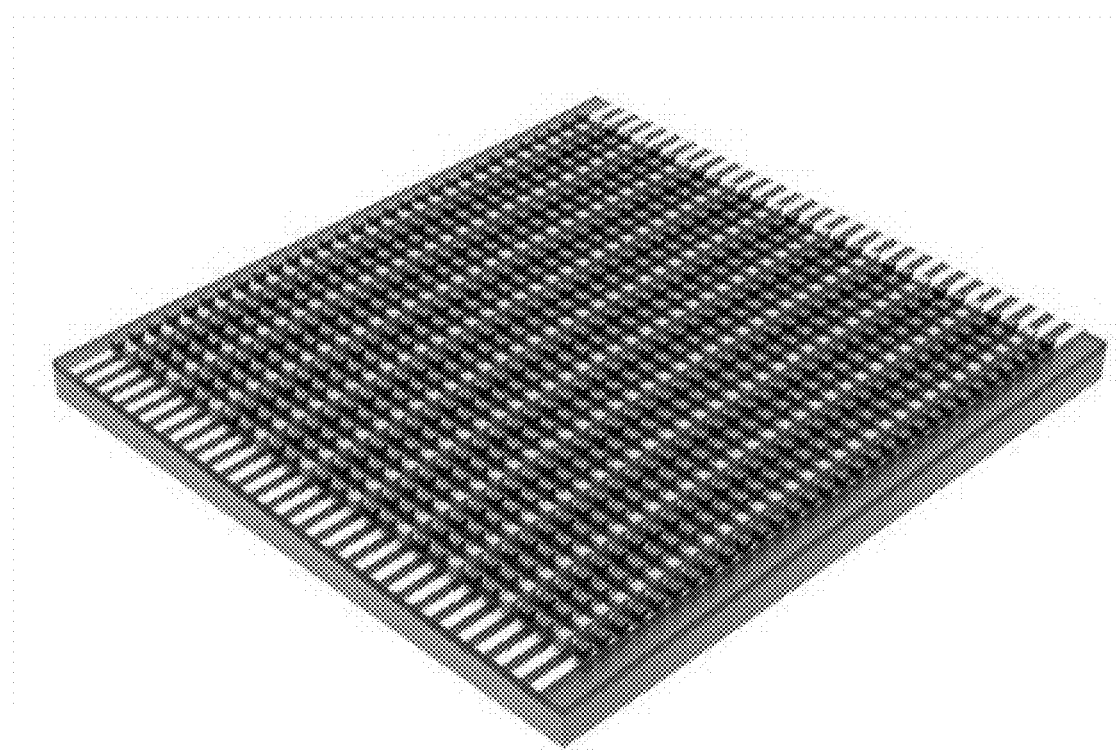

FIG. 43 shows RGB thin film-type flip chip micro-LED arrays of the three primarily colors embodied on a target substrate.

Figure 44:
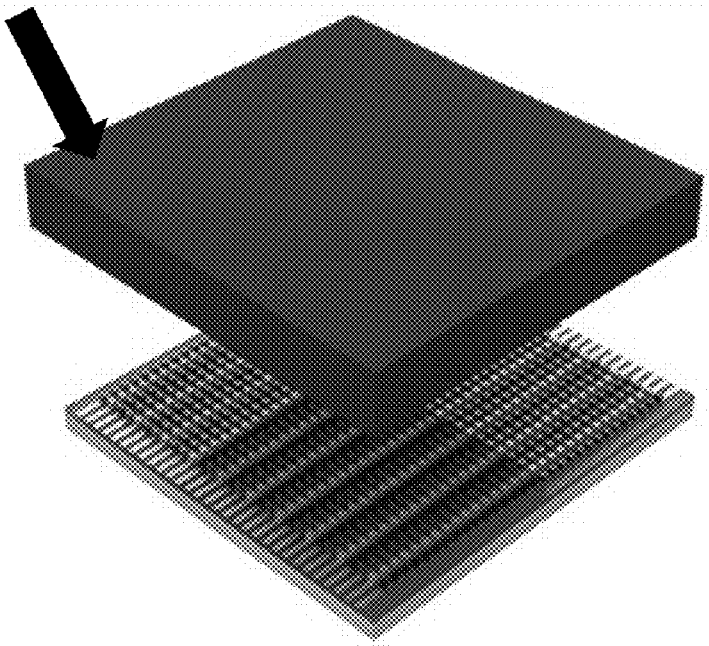

FIG. 44 shows electrical and physical connection of RGB thin film-type flip chip micro-LEDs transferred onto a target substrate and the target substrate by deforming the transfer member by applying external force to the micro-LEDs using an external force-applying means.

Figure 45:
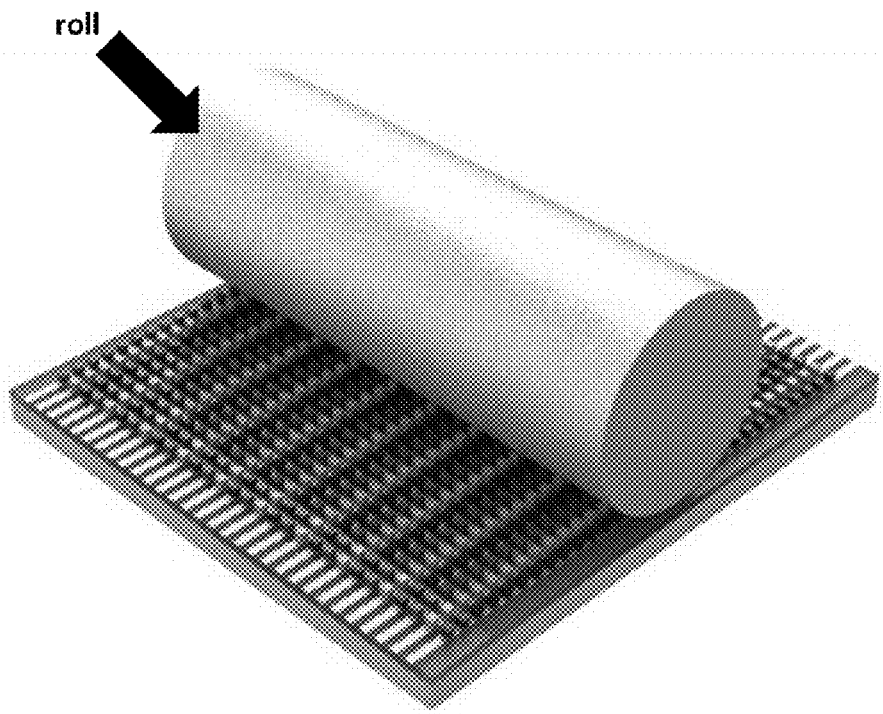

FIG. 45 shows electrical and physical connection of RGB thin film-type flip chip micro-LEDs transferred onto a target substrate and the target substrate by deforming the transfer member by applying external force to the micro-LEDs using a roll as an external force-applying means.

In the existing method of connecting micro-LEDs and a target substrate, micro-LEDs are provided on a target substrate coated with a transfer member and then compressed using an external force-applying means with a flat bottom. In the existing method, the pressure required to connect the micro-LED chips to the target substrate should increase in proportion to the number of the micro-LED chips and the area of the micro-LED display. Thus, it is difficult to realize a large-sized display such as a notebook computer or a TV with this method.

In contrast, if the micro-LEDs is compressed on the target substrate coated with the transfer member using a roll, the micro-LED array is compressed in the form of a line as the roll moves on the micro-LED chips. Thus, the micro-LED chips of the same area can be connected to the target substrate with much weaker pressure as compared to when the external force-applying means with a flat bottom is used. Therefore, when the micro-LED chips are compressed using a roll, a large-sized display can be realized with less pressure.

Next, a transfer of micro-LEDs with a thin film-type vertical structure is described.

Figure 46:
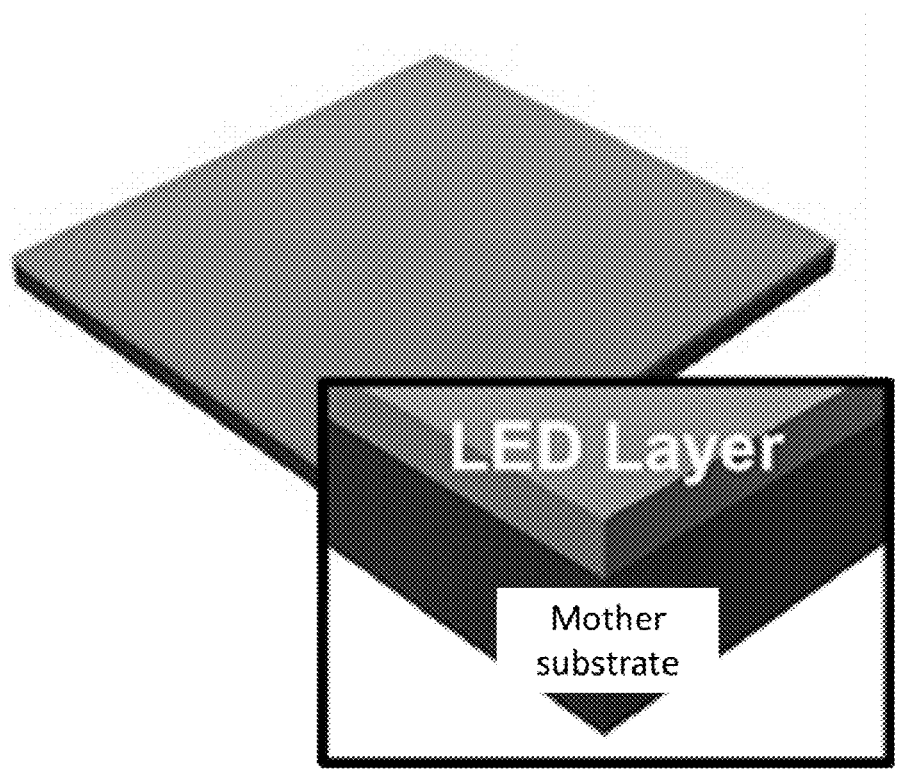
FIGS. 46-74 illustrate a process of transferring micro-LEDs according to another exemplary embodiment of the present disclosure.
Figure 47:
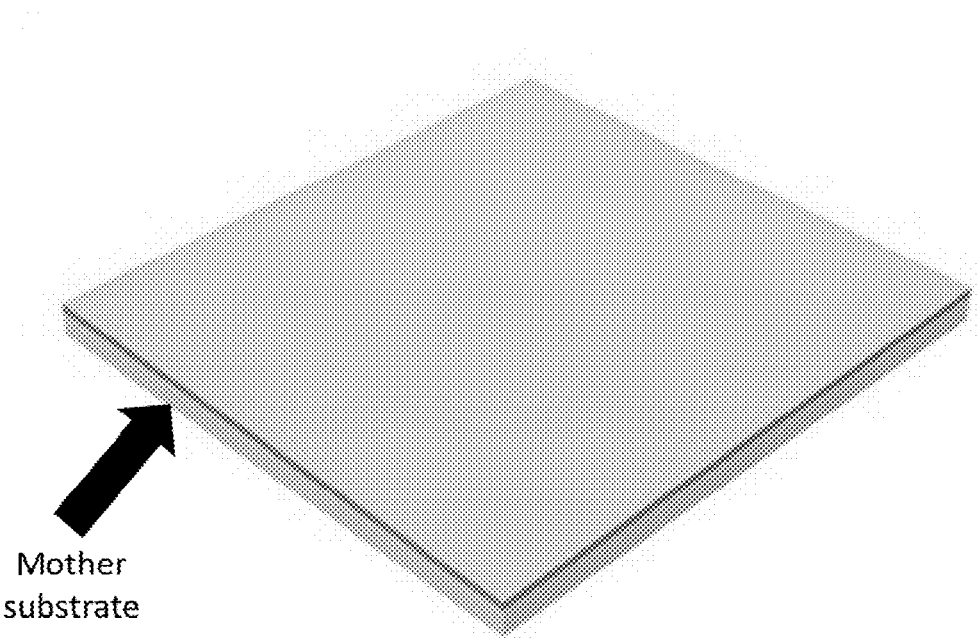
Figure 48:
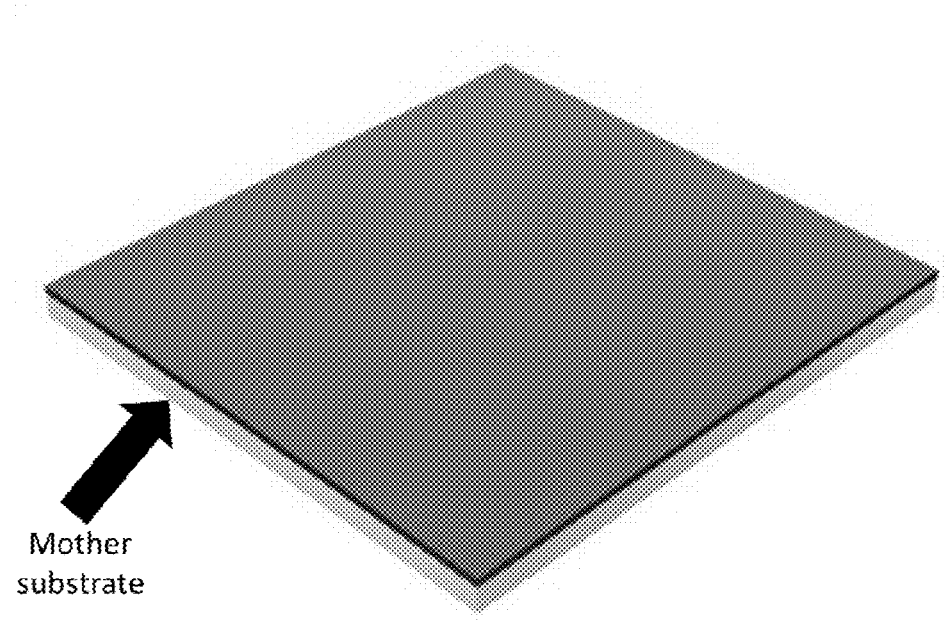

Referring to FIGS. 46-48, red, green and blue LED layers are formed on a mother substrate.

Figure 49:
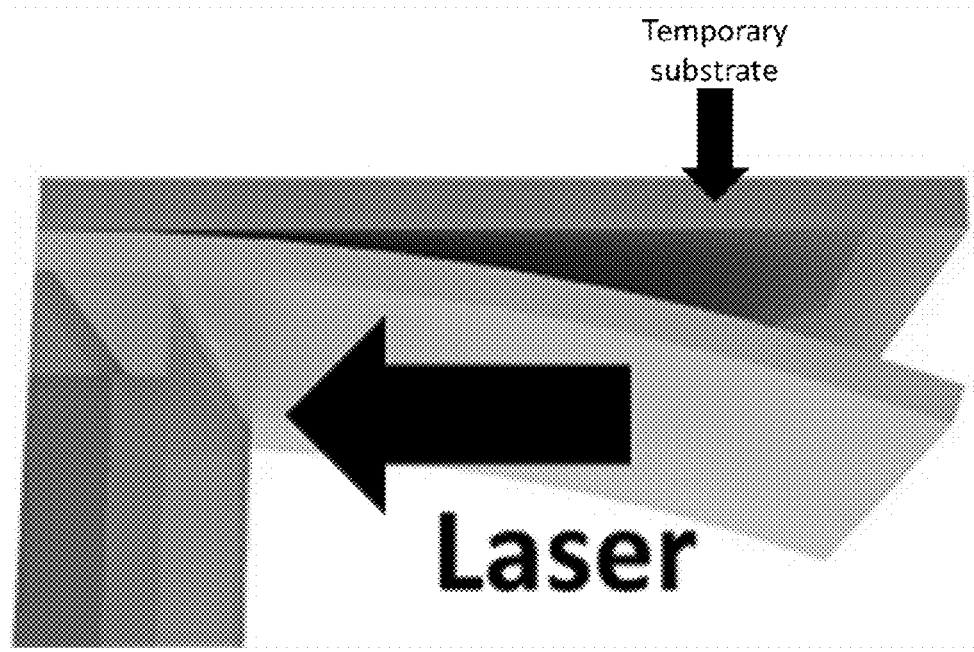
Figure 50:
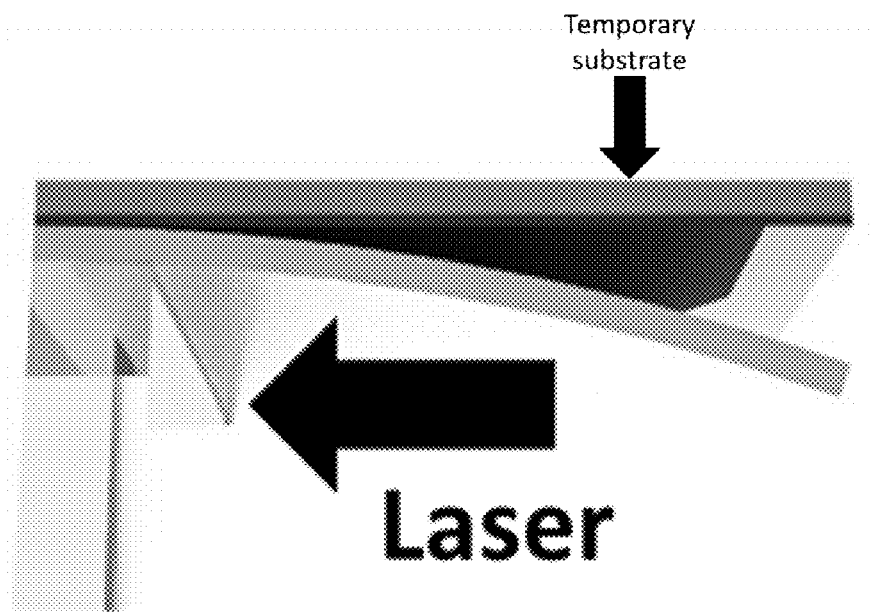

FIGS. 49-50 show attachment of temporary substrates on the surface of green and blue LED layers and removal of the mother substrate by irradiating laser between the mother substrate and the LED layer.

Figure 51:
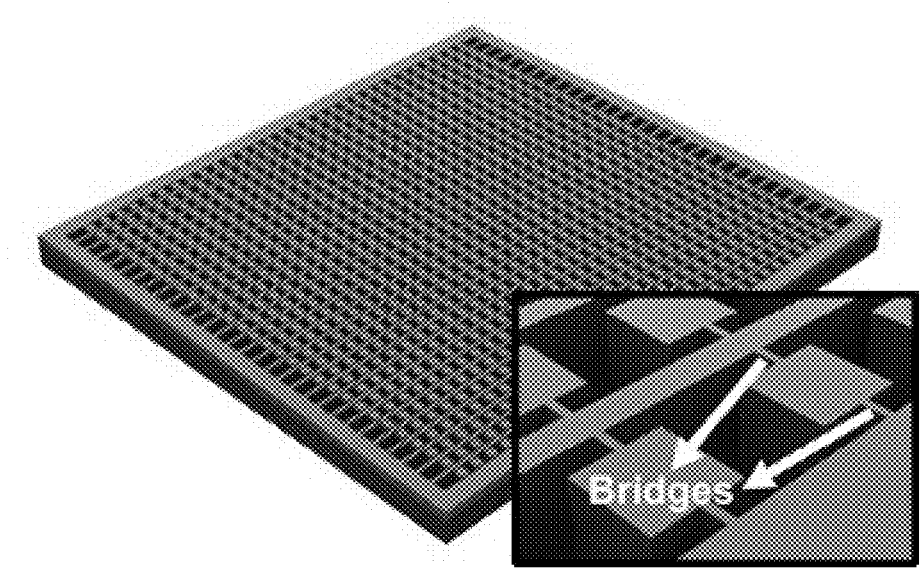
Figure 52:
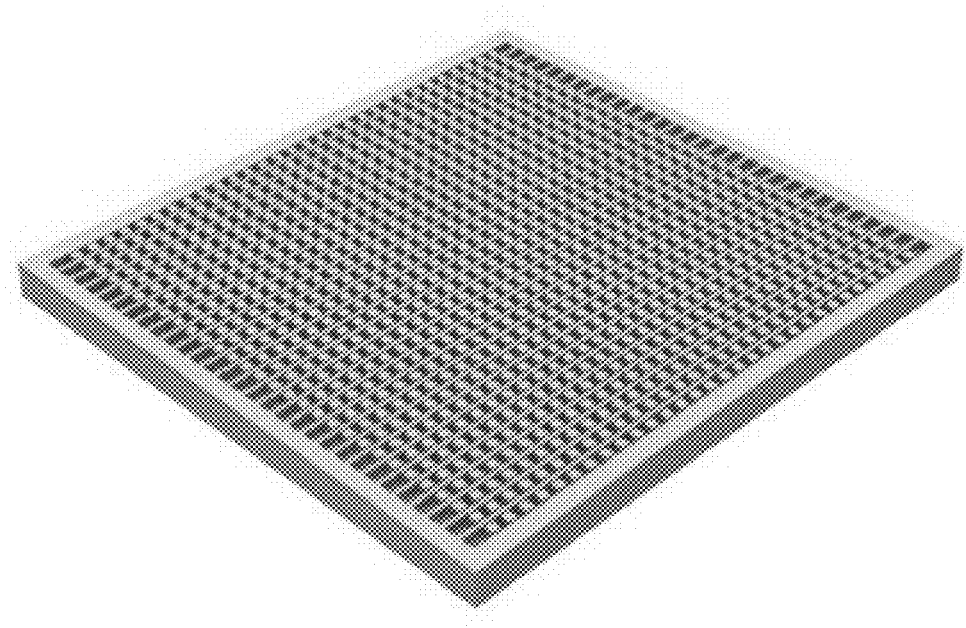
Figure 53:
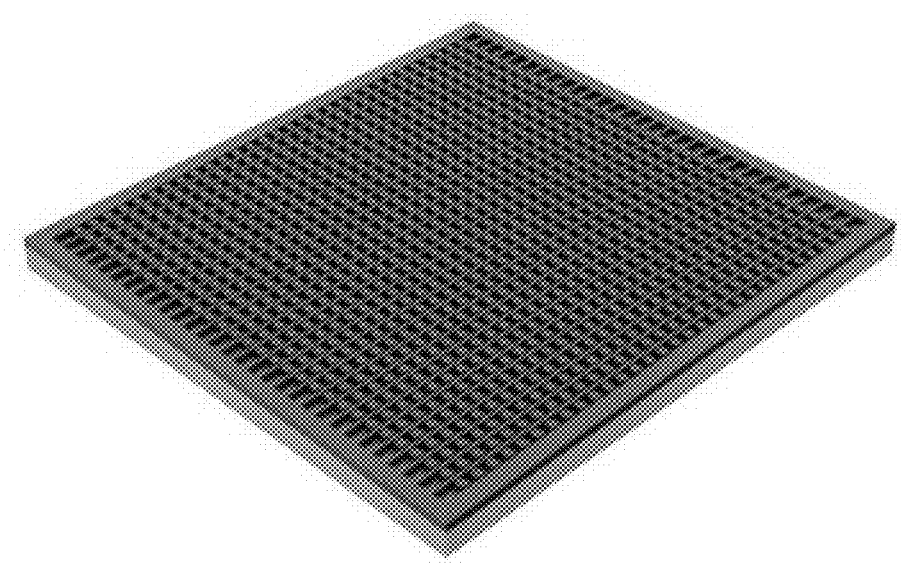

FIGS. 51-53 show formation of red, green and blue LED layers as chips including bridges through dry etching.

Figure 54:
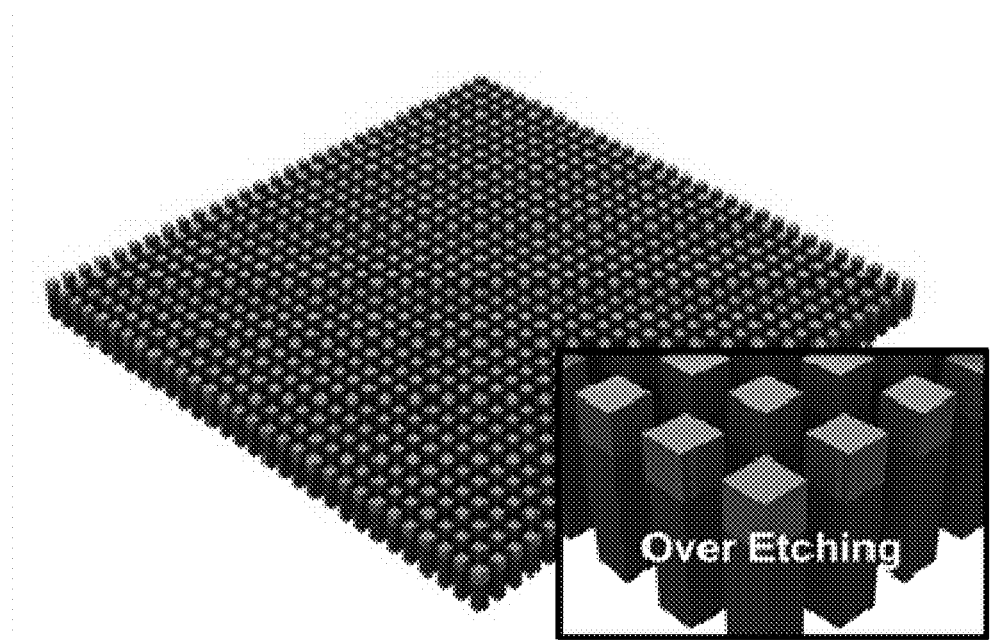

FIG. 54 shows an over-etched temporary substrate below red micro-LEDs etched as chips.

Figure 55:
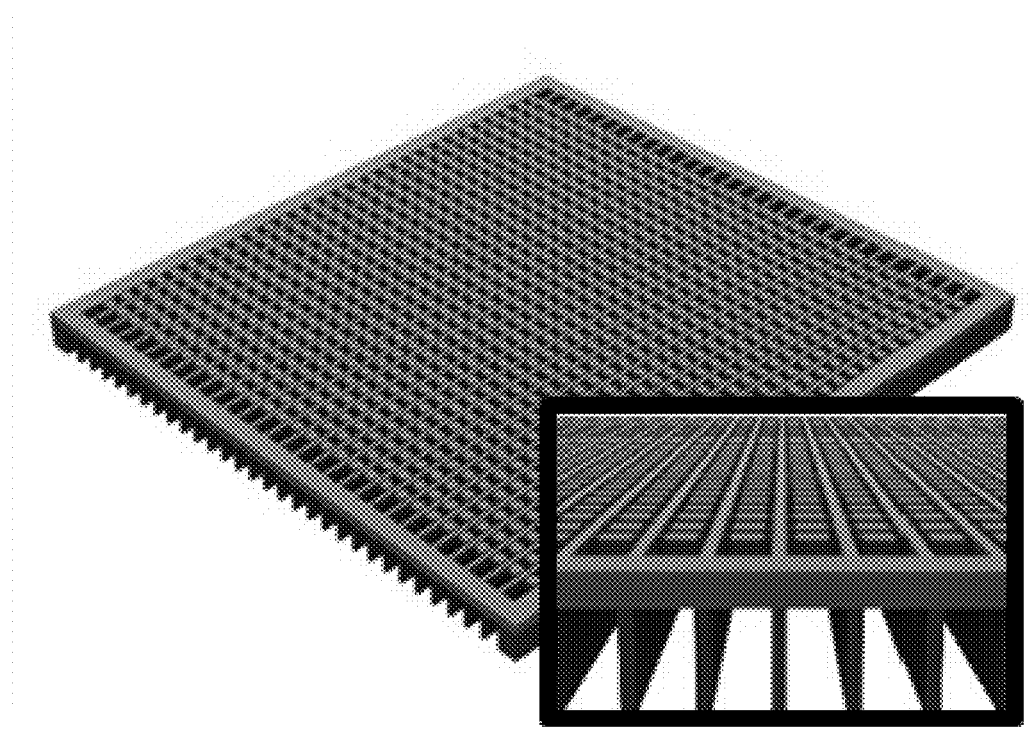
Figure 56:
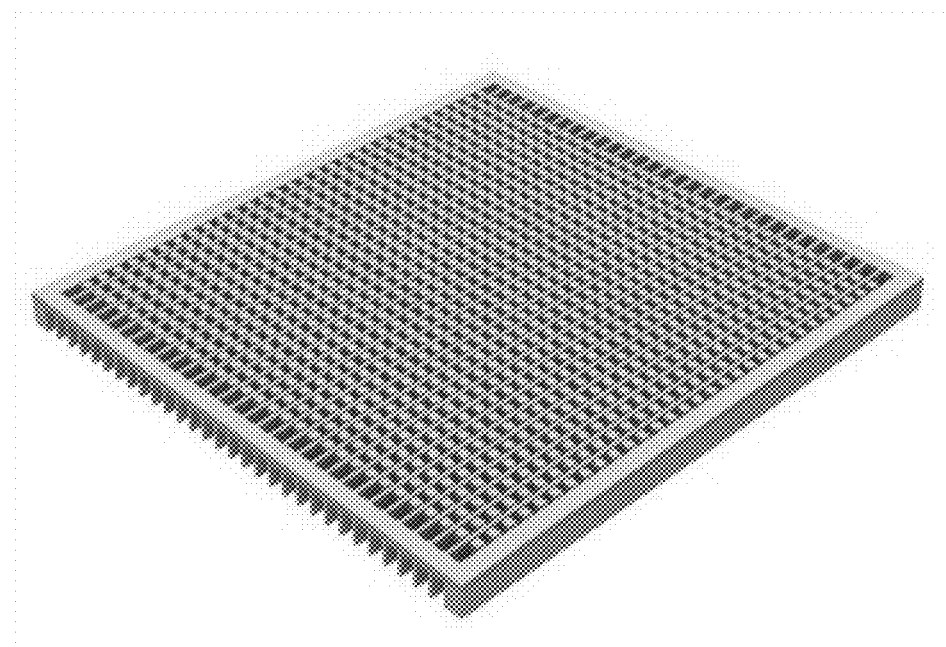
Figure 57:
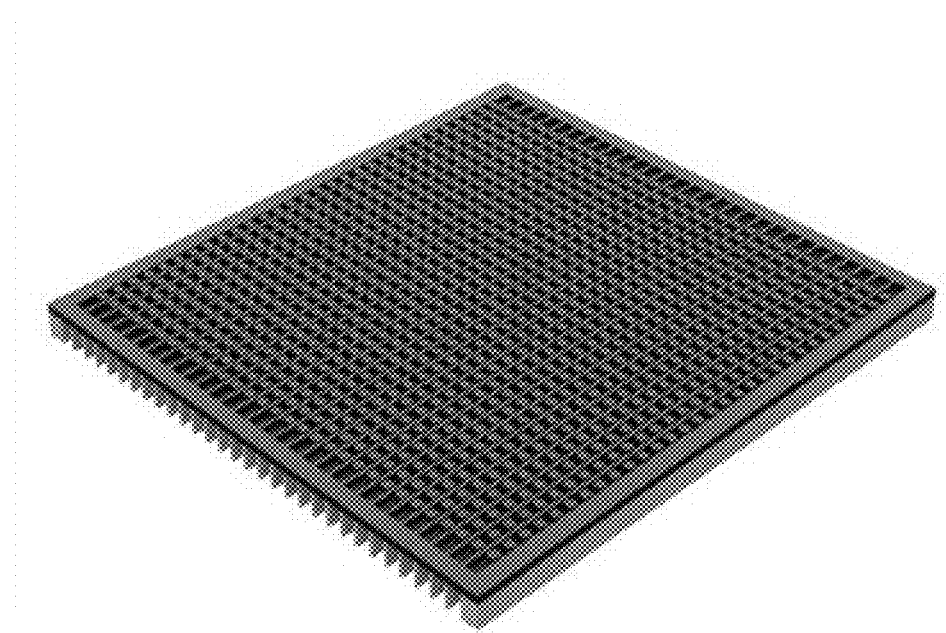

FIGS. 55-57 show red, green and blue thin film-type vertical micro-LED arrays including bridges, which are formed to stand freely on a mother substrate or a temporary substrate by partly etching the mother substrate or the temporary substrate.

Figure 58:
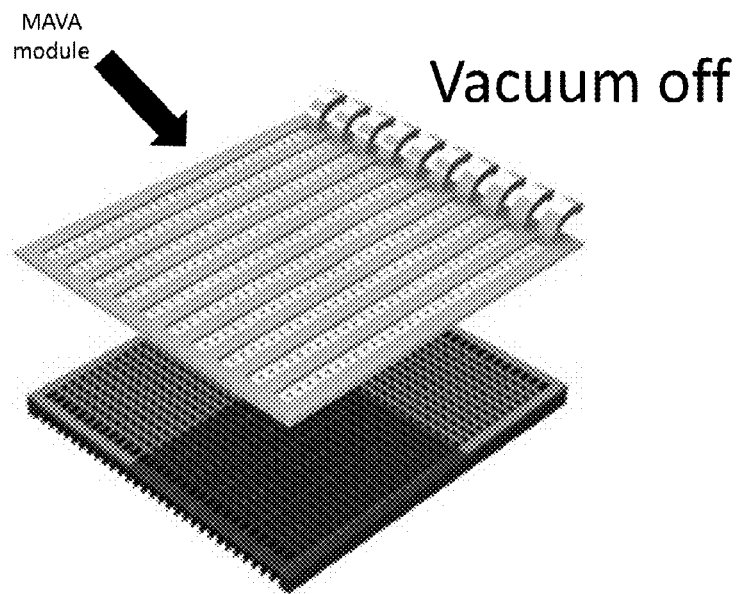
Figure 59:
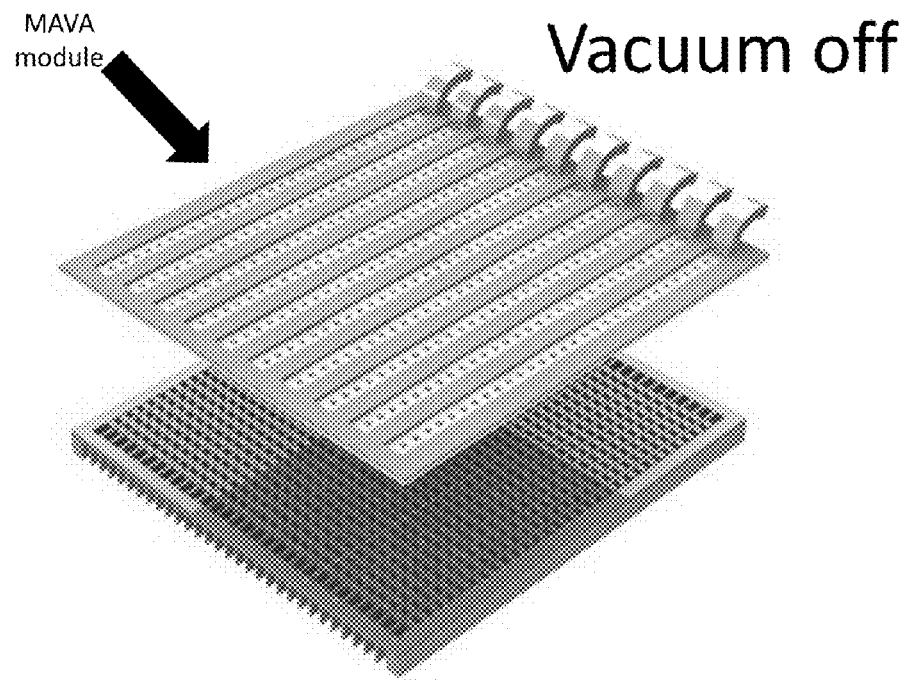
Figure 60:
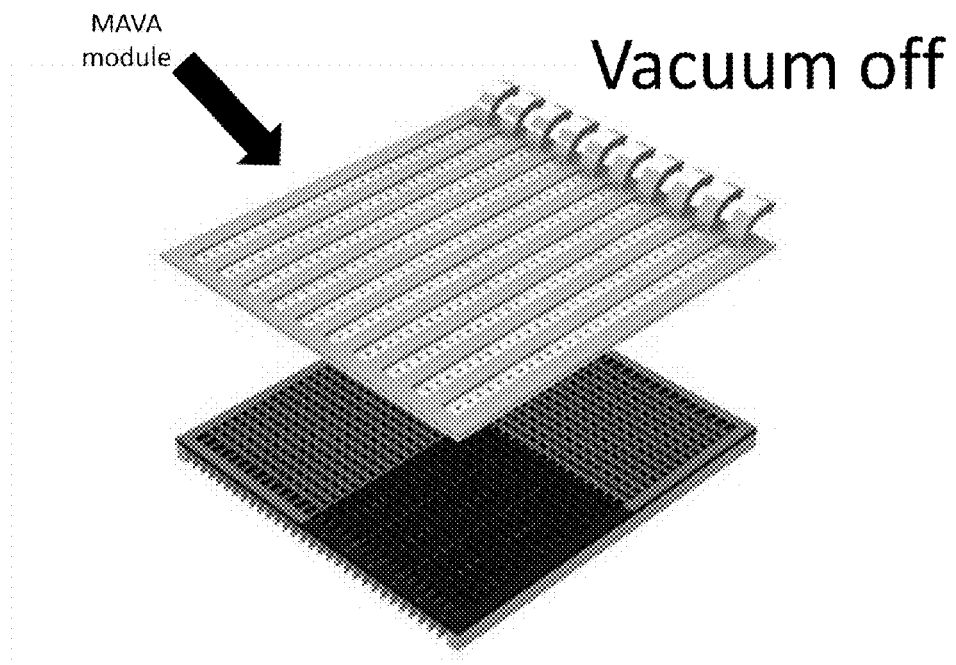

Referring to FIGS. 58-60, after aligning red, green and blue thin film-type vertical micro-LEDs attached onto a mother substrate or a temporary substrate and a micro-vacuum module, vacuum application is prepared.

Figure 61:
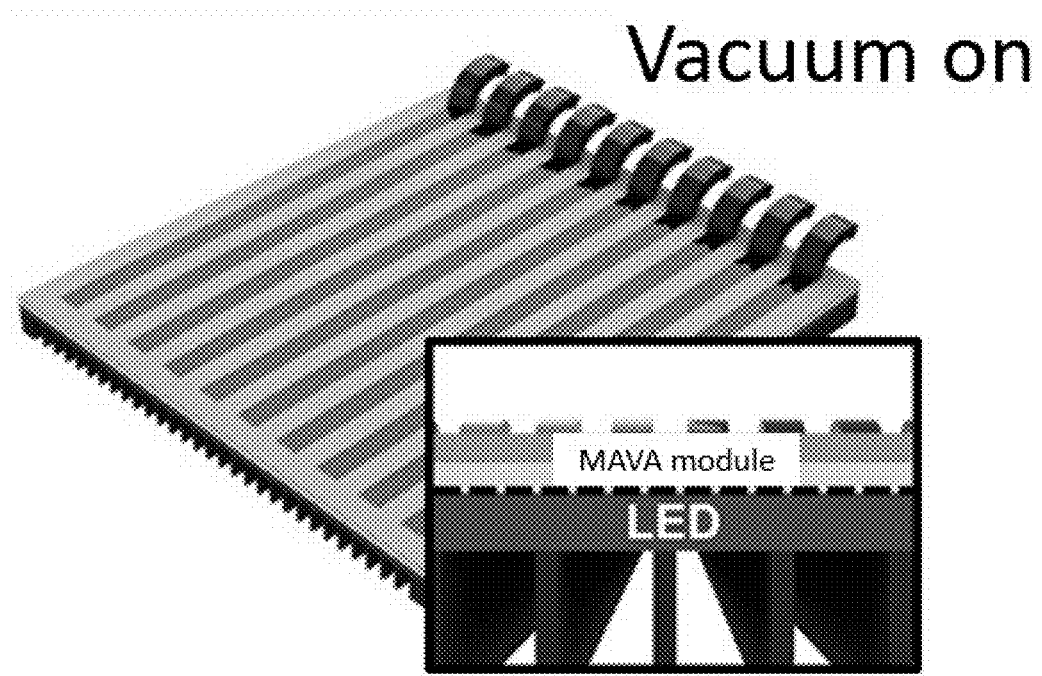
Figure 62:
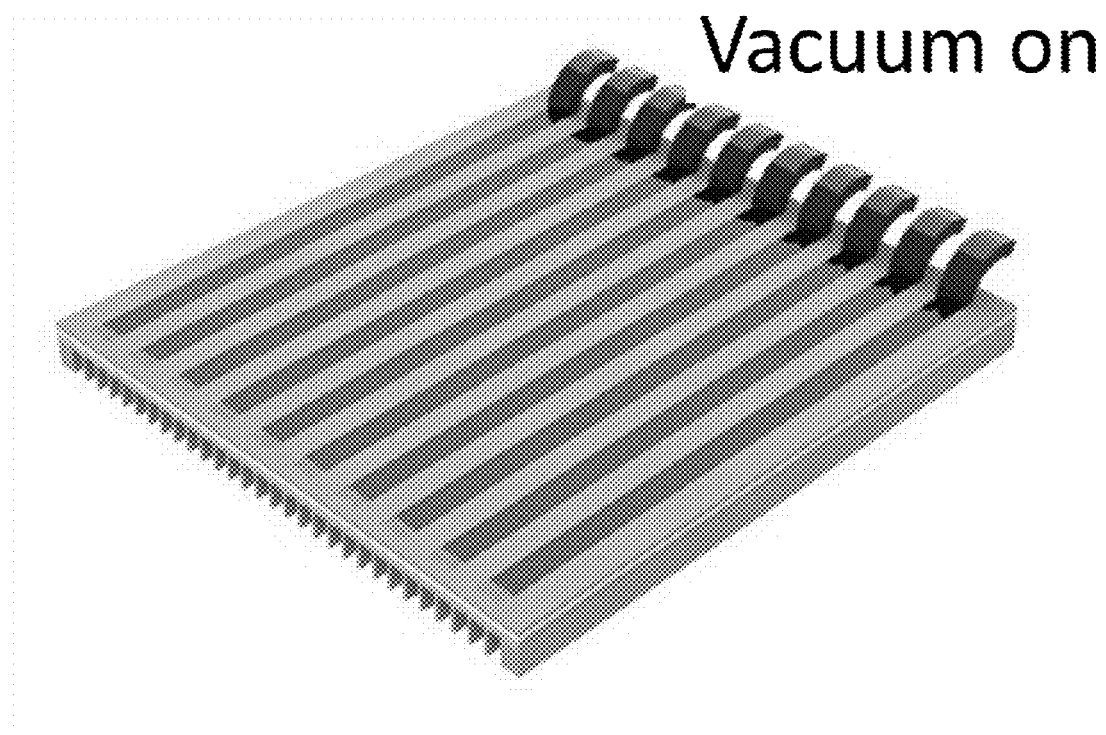
Figure 63:
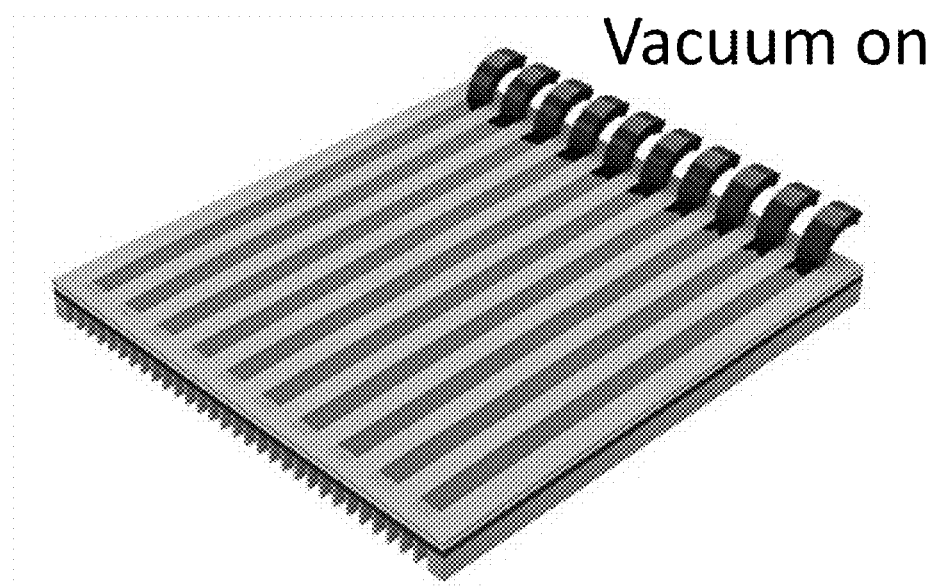

FIGS. 61-63 show a micro-vacuum module attached to red, green and blue thin film-type vertical micro-LED arrays by creating vacuum.

Figure 64:
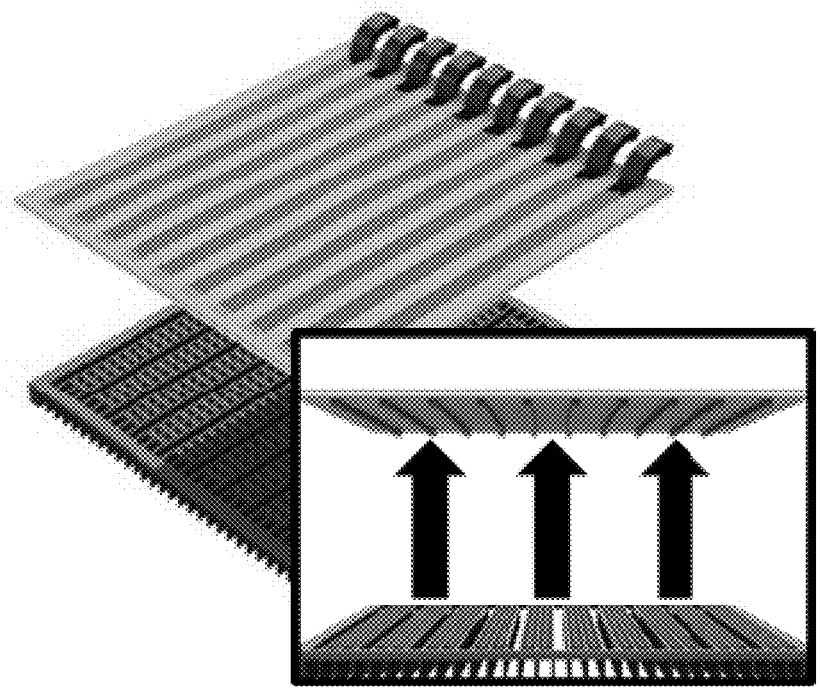
Figure 65:
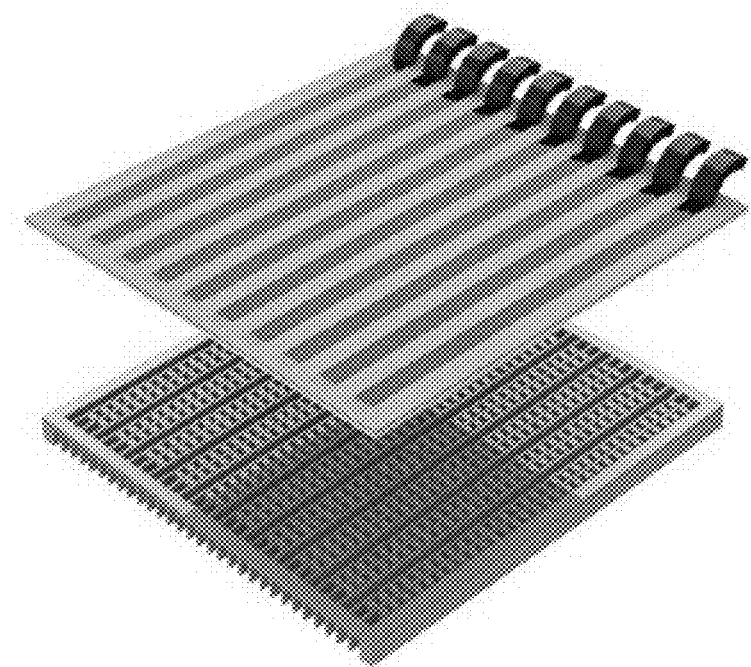
Figure 66:
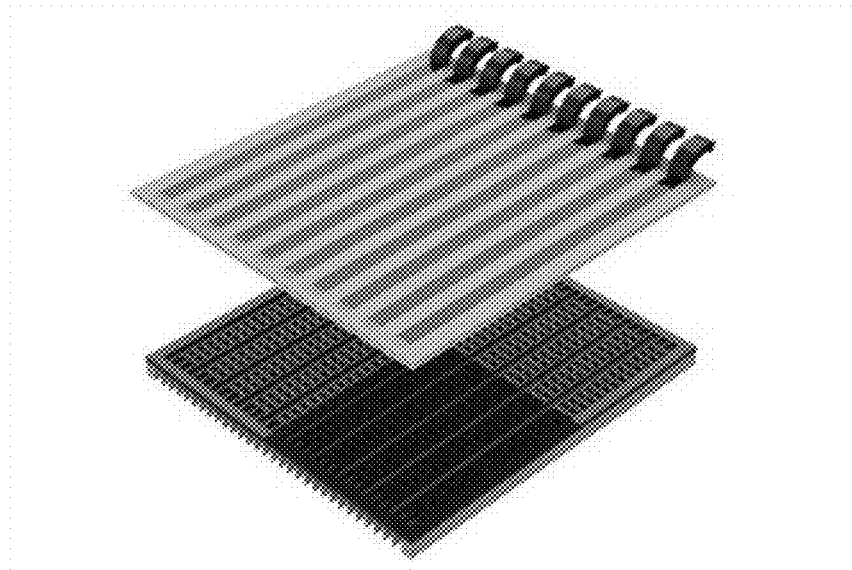

FIGS. 64-66 show lifting of micro-LEDs in a state where a micro-vacuum module is contacted with red, green and blue thin film-type vertical micro-LED arrays and vacuum is formed. After the adsorption holes of a micro-vacuum module are contacted with the surface of micro-LEDs formed on a mother substrate or a temporary substrate as chips, suction force is formed by creating a vacuum state in the adsorption holes contacted with the micro-LEDs and the micro-LEDs are detached from the mother substrate or the temporary substrate using the same.

Figure 67:
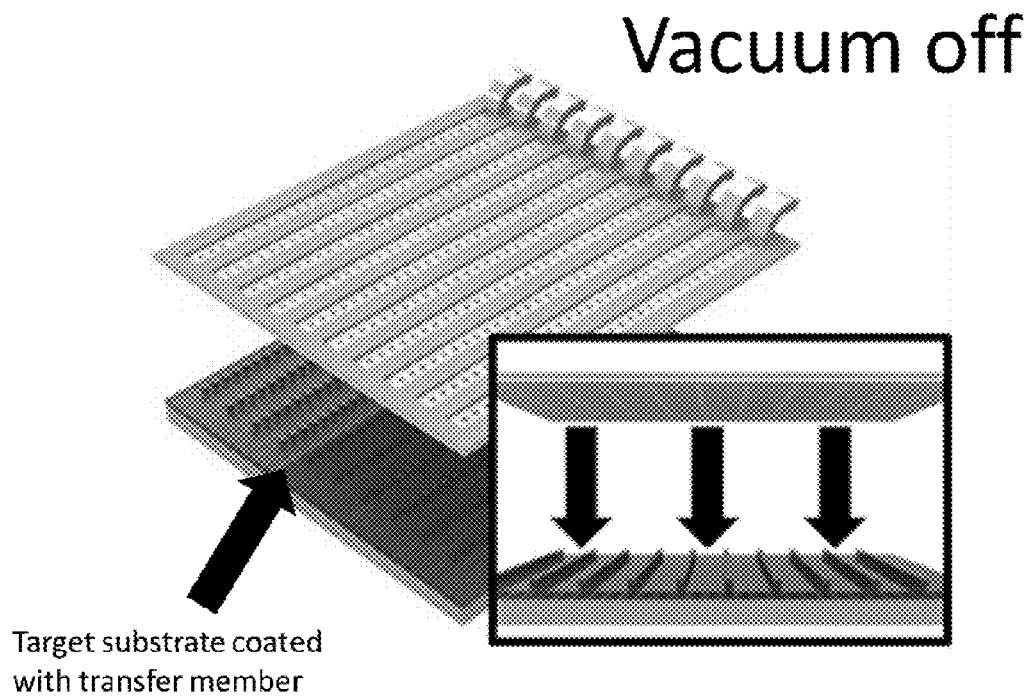
Figure 68:
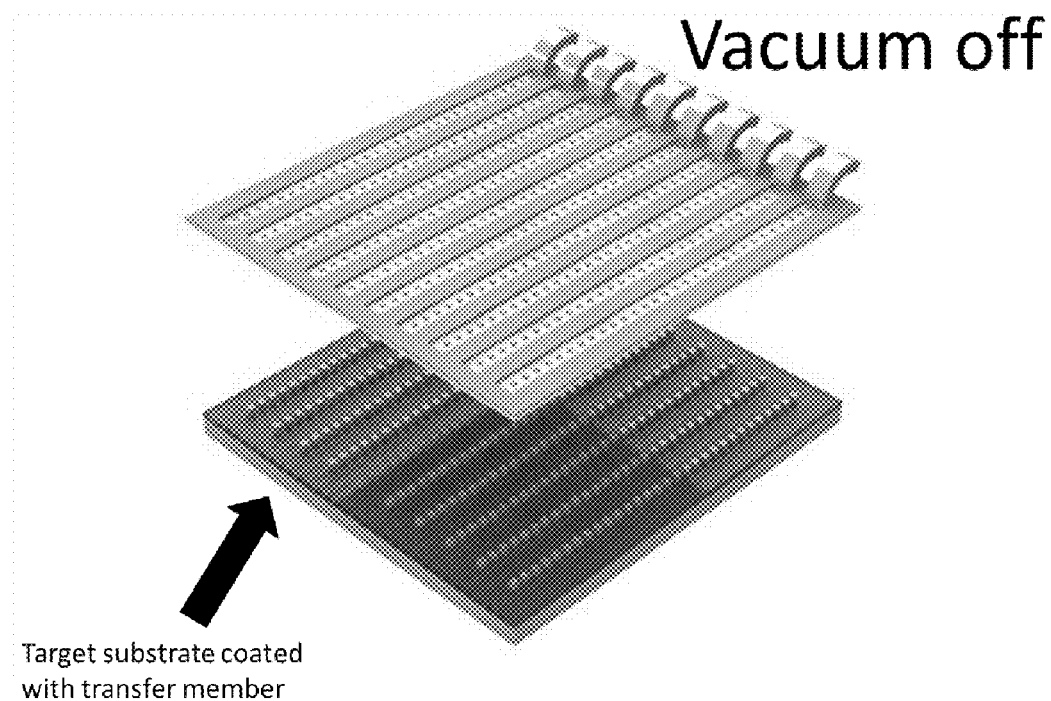
Figure 69:
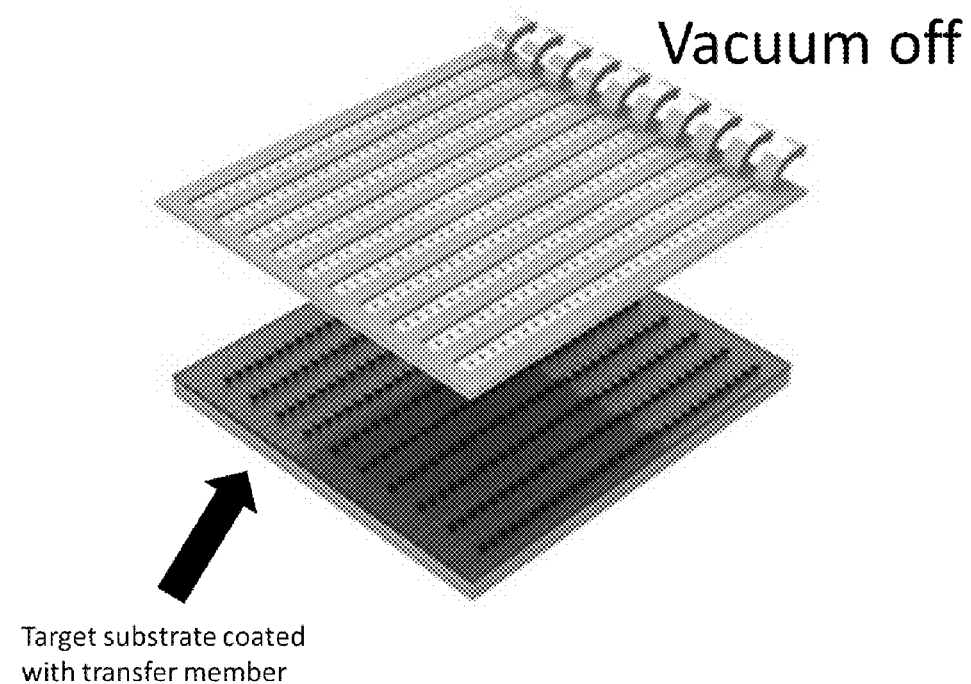

Referring to FIGS. 67-69, after red, green and blue thin film-type vertical micro-LED arrays attached to a micro-vacuum module and a target substrate coated with a transfer member are aligned, the red, green and blue thin film-type vertical micro-LEDs are released from the micro-vacuum module to a target substrate by releasing vacuum from the vacuum flow channels constituting the micro-vacuum module.

Figure 70:
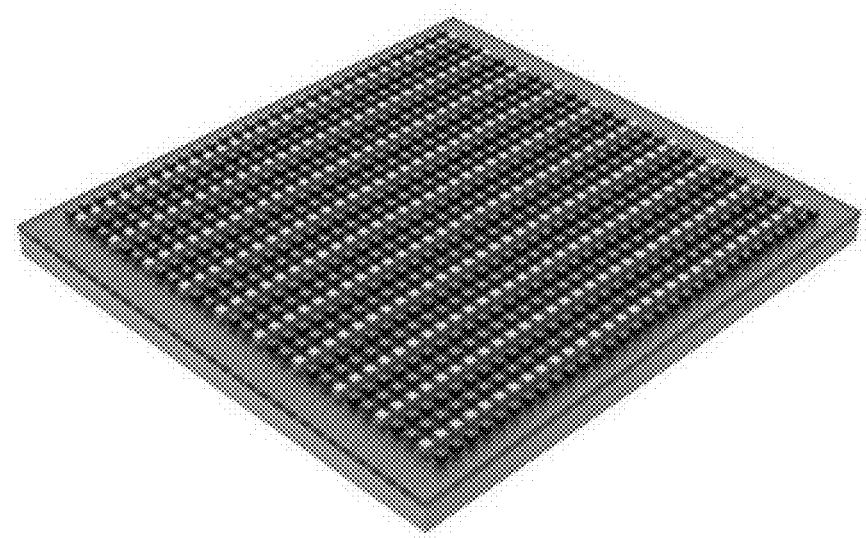

FIG. 70 shows RGB thin film-type vertical micro-LED arrays of the three primary colors embodied on a target substrate.

Figure 71:
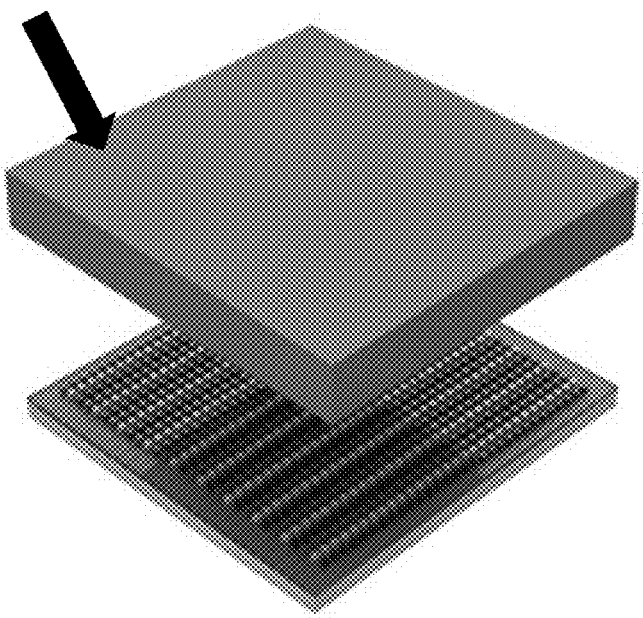

Referring to FIG. 71, a transfer member is deformed by applying external force to RGB thin film-type vertical micro-LEDs transferred onto a target substrate using an external force-applying means, and the micro-LEDs and the target substrate are connected electrically and physically.

Figure 72:
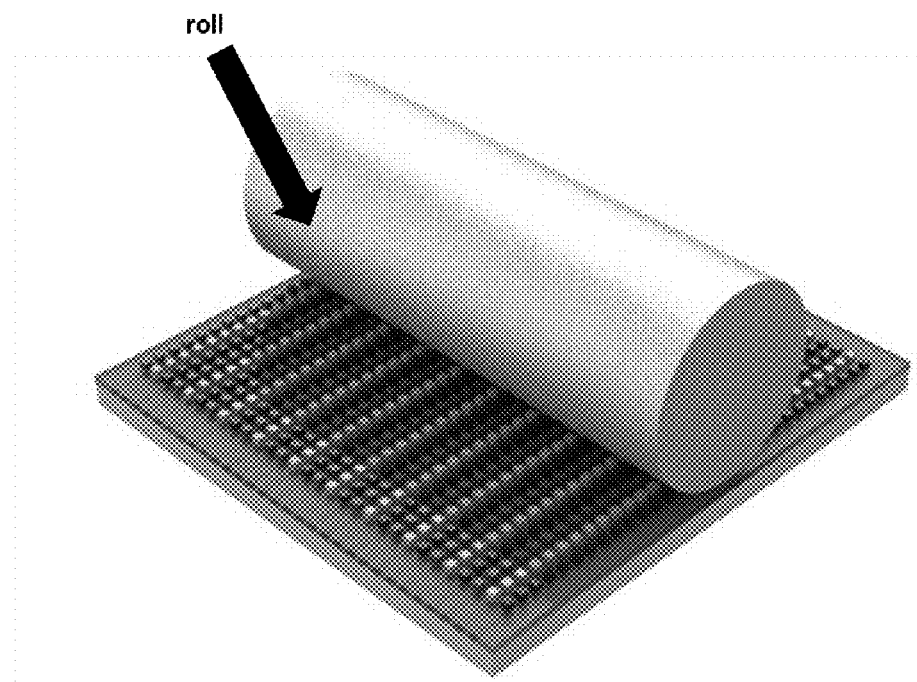

Referring to FIG. 72, a transfer member is deformed by applying external force to RGB thin film-type vertical micro-LEDs transferred onto a target substrate using a roll as an external force-applying means, and the micro-LEDs and the target substrate are connected electrically and physically.

In the existing method of connecting micro-LEDs and a target substrate, micro-LEDs are provided on a target substrate coated with a transfer member and then compressed using an external force-applying means with a flat bottom. In the existing method, the pressure required to connect the micro-LED chips to the target substrate should increase in proportion to the number of the micro-LED chips and the area of the micro-LED display. Thus, it is difficult to realize a large-sized display such as a notebook computer or a TV with this method.

In contrast, if the micro-LEDs is compressed on the target substrate coated with the transfer member using a roll, the micro-LED array is compressed in the form of a line as the roll moves on the micro-LED chips. Thus, the micro-LED chips of the same area can be connected to the target substrate with much weaker pressure as compared to when the external force-applying means with a flat bottom is used. Therefore, when the micro-LED chips are compressed using a roll, a large-sized display can be realized with less pressure.

Figure 73:
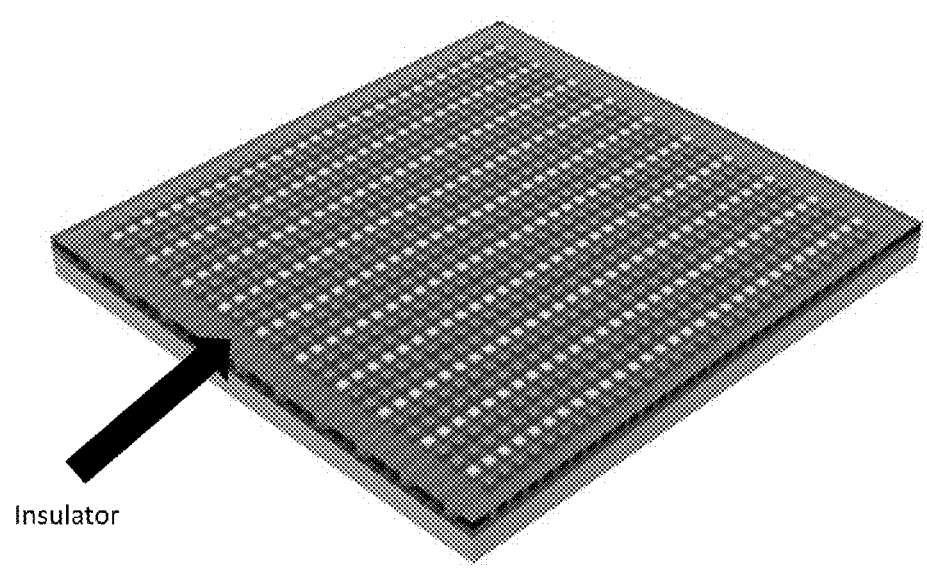

FIG. 73 shows RGB thin film-type vertical micro-LEDs sealed using an insulator. After sealing the micro-LEDs connected to the target substrate with the insulator, through-holes are formed on the surface of the micro-LEDs at the region to be contacted with electrodes. The through-holes may be formed by photolithography, laser, etc.

Figure 74:
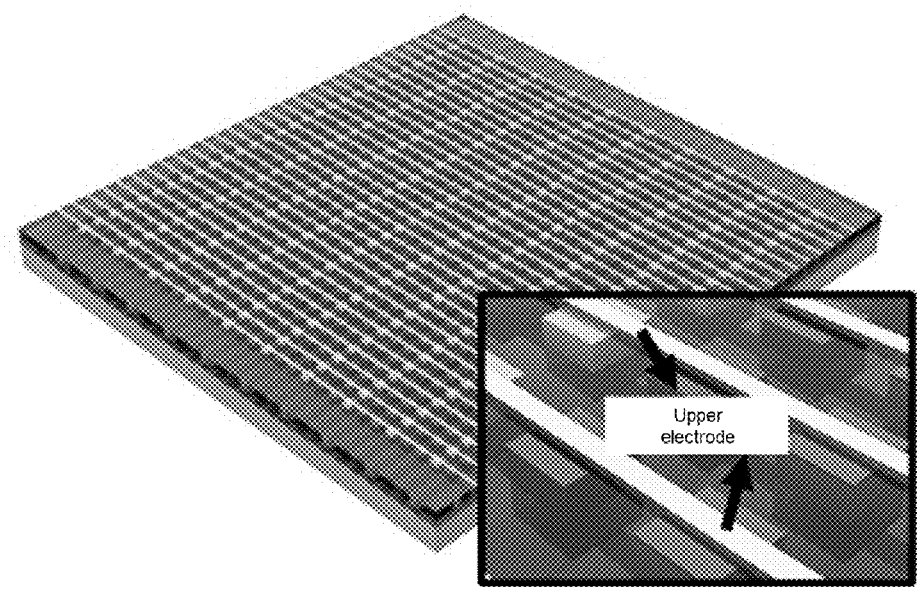

Referring to FIG. 74, upper electrodes are formed on the sealed RGB thin film-type vertical micro-LEDs. After the upper electrodes of the micro-LEDs are formed on the insulator, it is sealed finally with an insulator.

Figure 75:
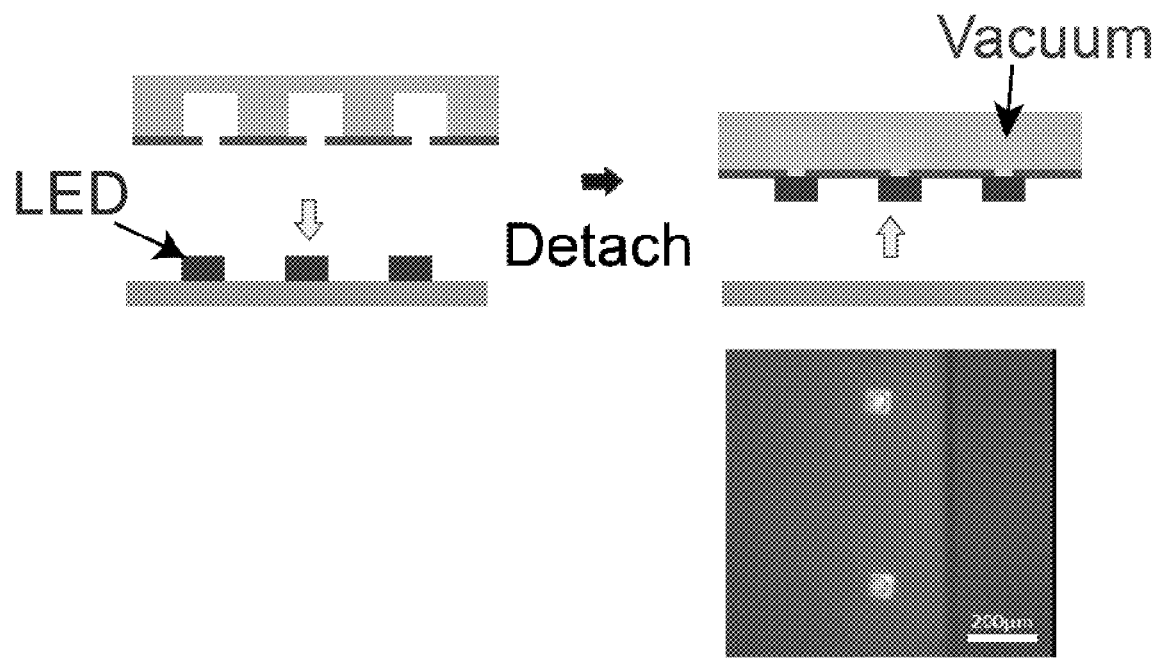
FIGS. 75-83 show experimental results for carrying out the present disclosure.

FIG. 75 shows a process of detaching micro-LEDs from a substrate using a micro-vacuum module, and an optical microscopic image of the detached micro-LEDs.

Figure 76:
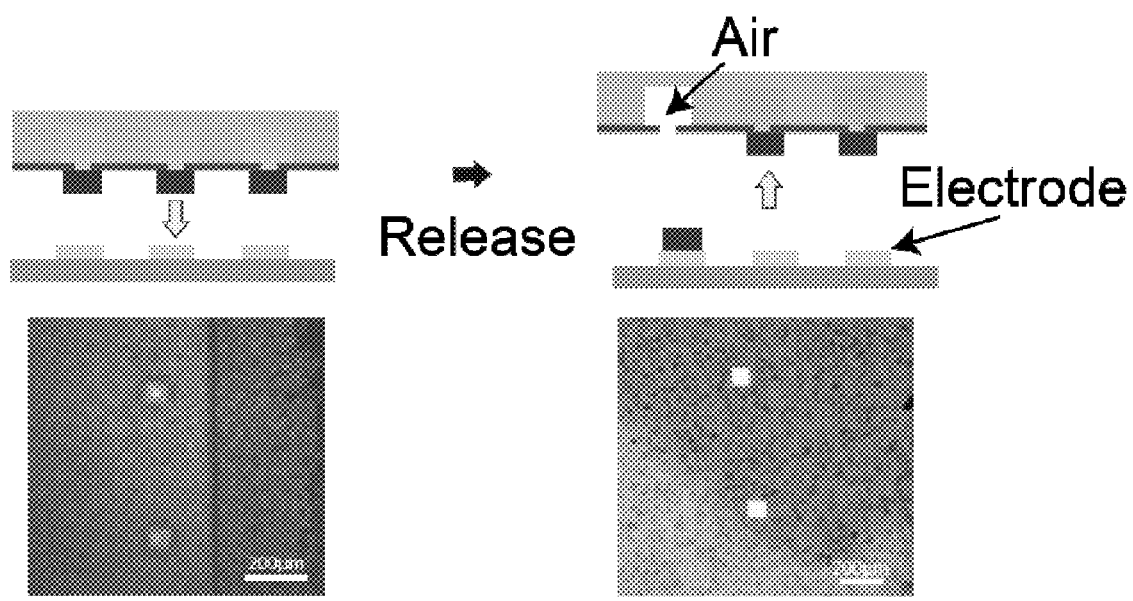

FIG. 76 shows a process of transferring micro-LEDs attached to a micro-vacuum module onto a target substrate having electrodes, and an optical microscopic image of the transferred micro-LEDs.

Figure 77:
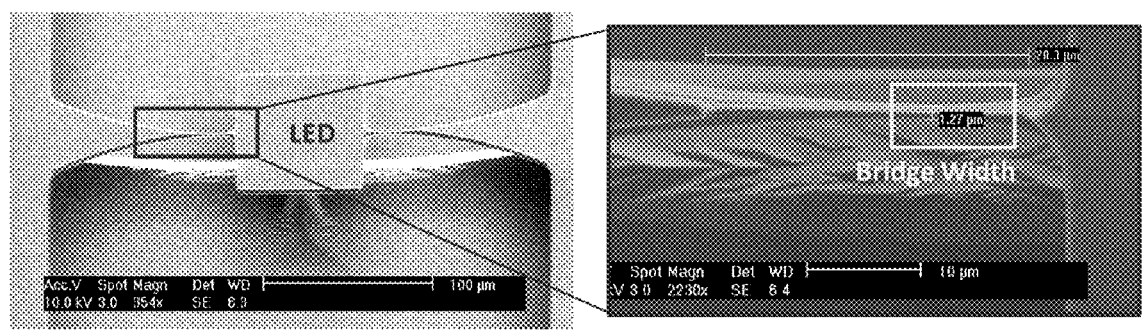

FIG. 77 shows scanning electron microscopic images of micro-LEDs including bridges, which are formed on a mother substrate to stand freely.

Figure 78:
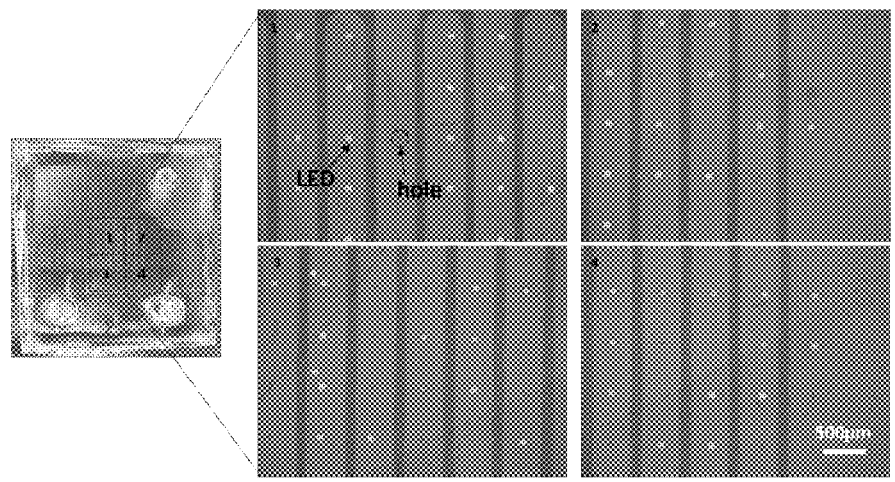

FIG. 78 shows a micro-vacuum module including micro-LEDs detached from a mother substrate, adsorption holes and vacuum flow channels.

Figure 79:
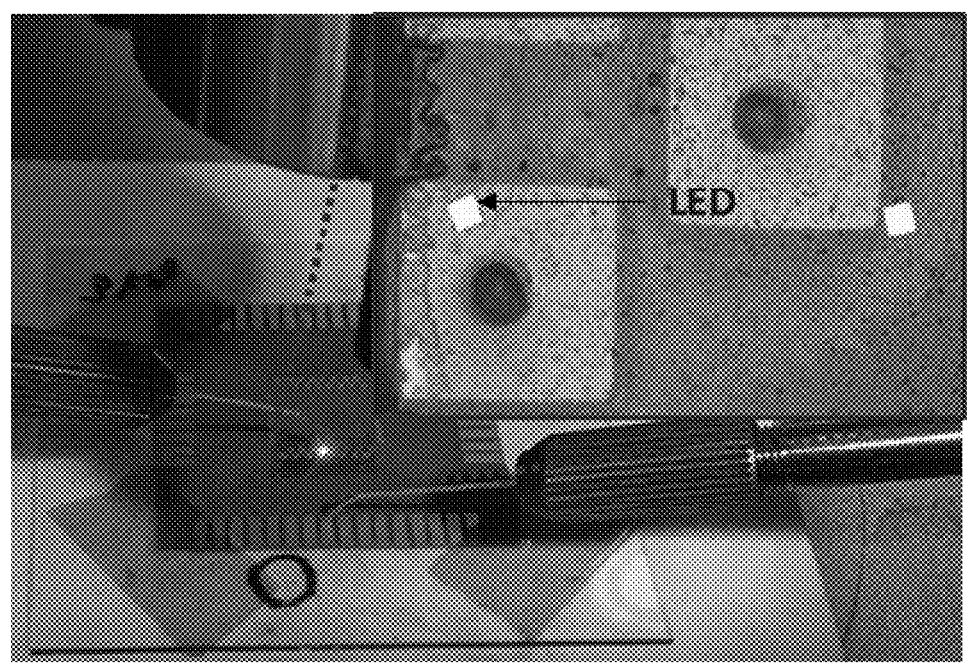

FIG. 79 is an optical microscopic image showing light emission from red thin film micro-LEDs transferred to a target substrate using a micro-vacuum module and connected electrically and physically to the target substrate.

Figure 80:
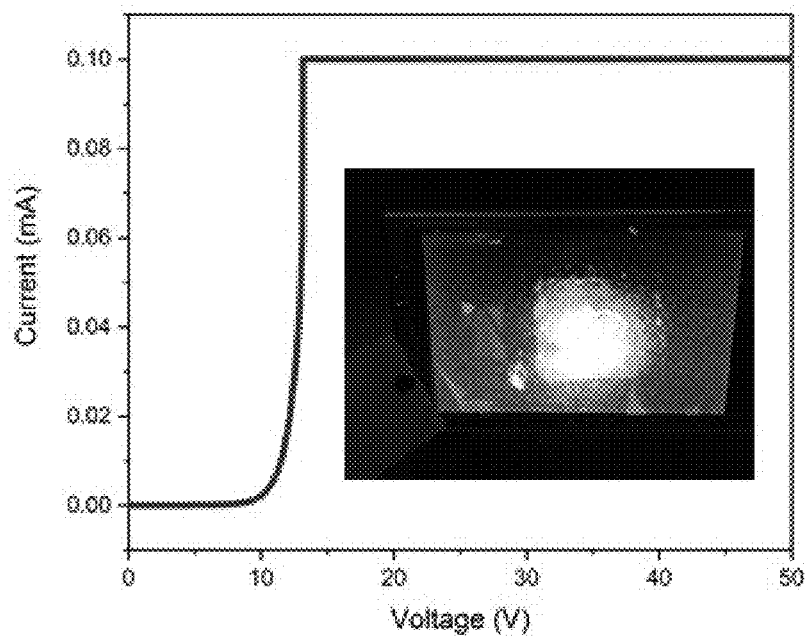

FIG. 80 shows light emission from red thin film micro-LEDs transferred to a target substrate using a micro-vacuum module and connected electrically and physically to the target substrate as well as I-V characteristics.

Figure 81:
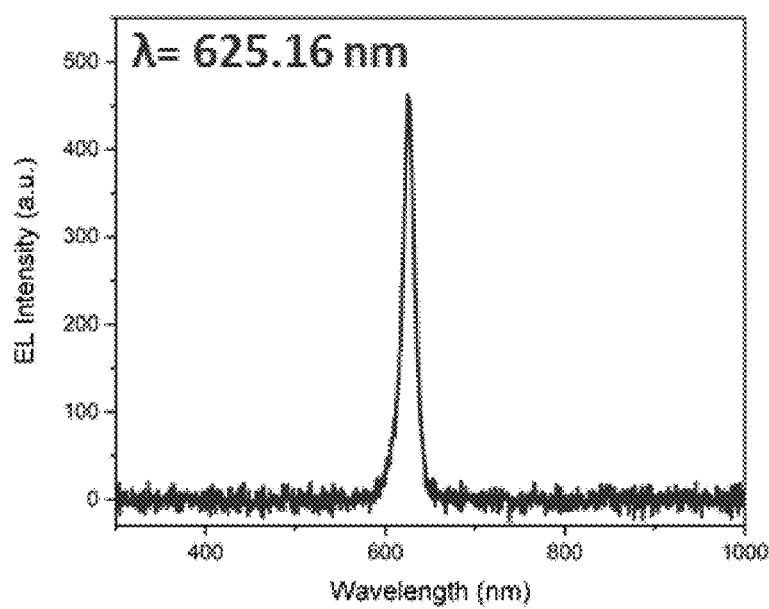

FIG. 81 shows the EL spectrum of red thin film micro-LEDs transferred to a target substrate using a micro-vacuum module and connected electrically and physically to the target substrate.

Figure 82:
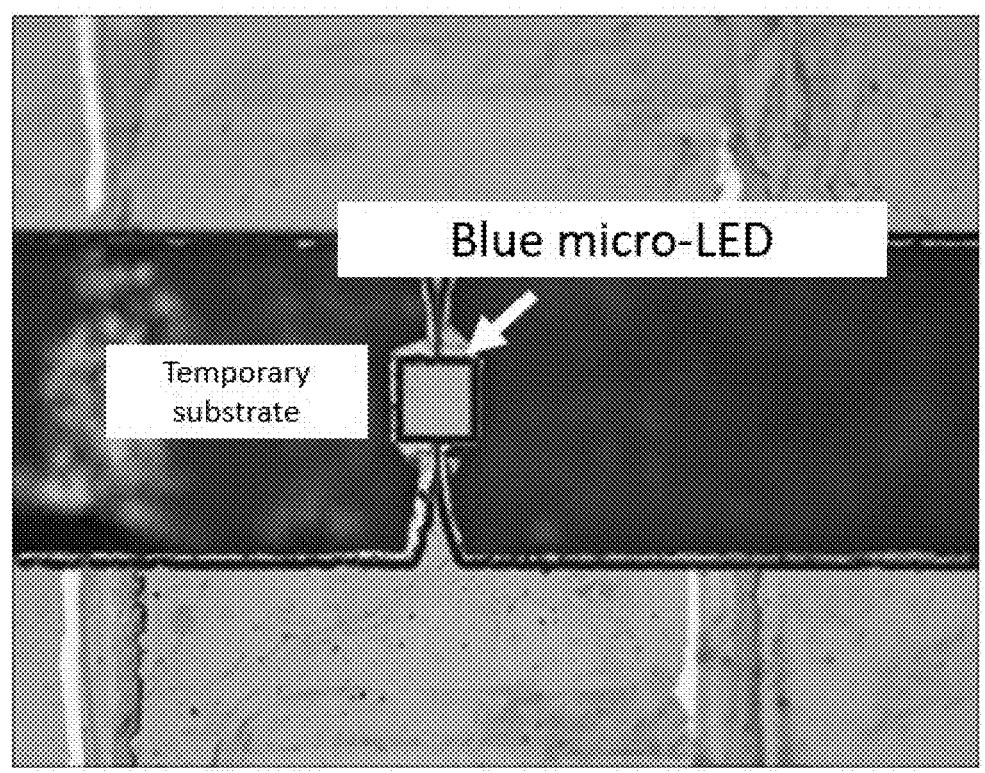

FIG. 82 shows an optical microscopic image of blue thin film micro-LEDs including bridges, which are formed on a temporary substrate to stand freely.

Figure 83:
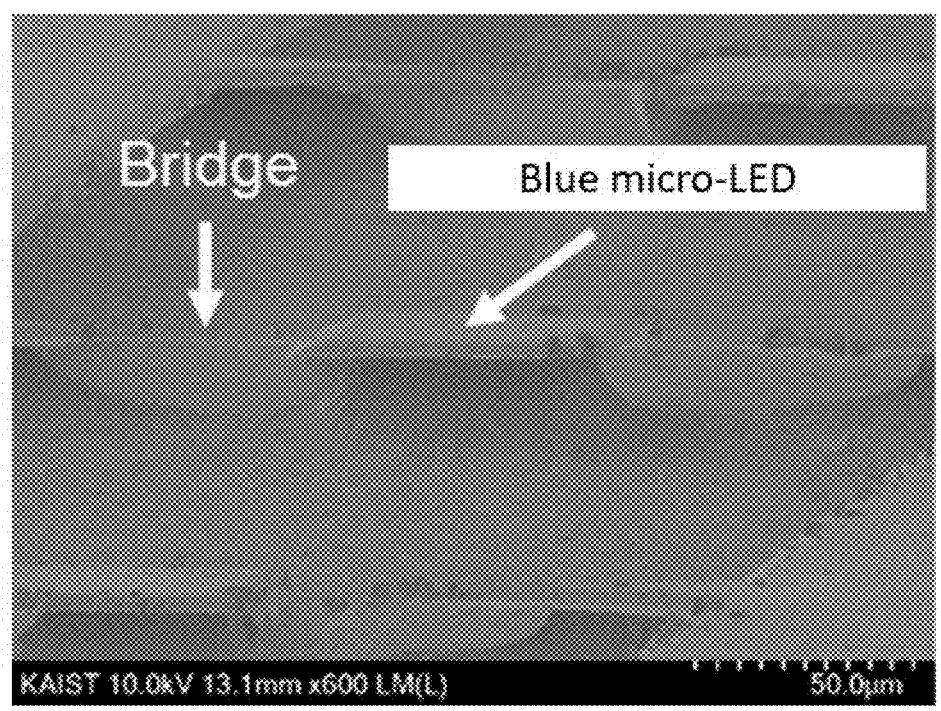

FIG. 83 shows a scanning electron microscopic image of blue thin film micro-LEDs including bridges, which are formed on a temporary substrate to stand freely.

According to the present disclosure, a single monochromatic micro-LED array from among the three primary colors of RGB should be able to be detached selectively using a micro-vacuum module. Through this, the RGB micro-LED arrays can be picked up for respective line when manufacturing a RGB micro-LED display.

Figure 84:
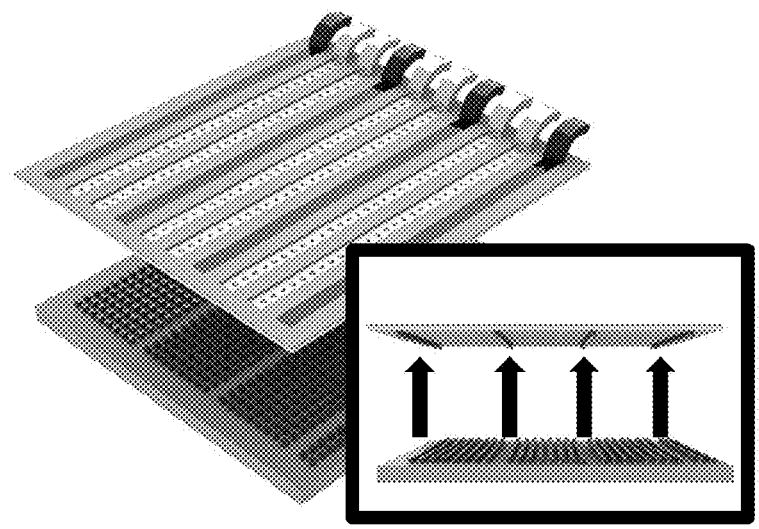
FIGS. 84-89 illustrate a process of selective detachment of micro-LED arrays using a micro-vacuum module.
Figure 85:
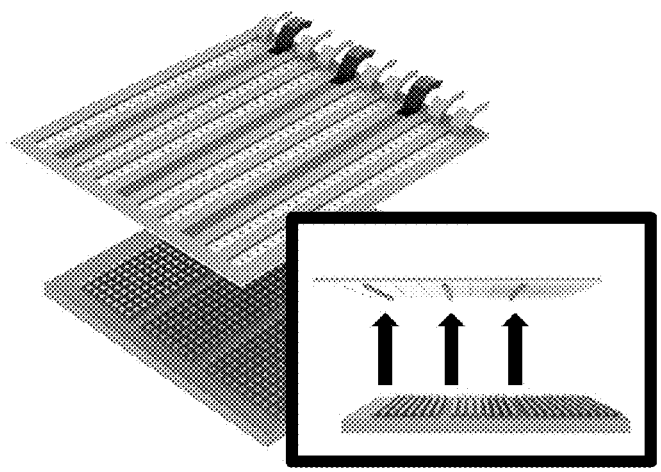
Figure 86:
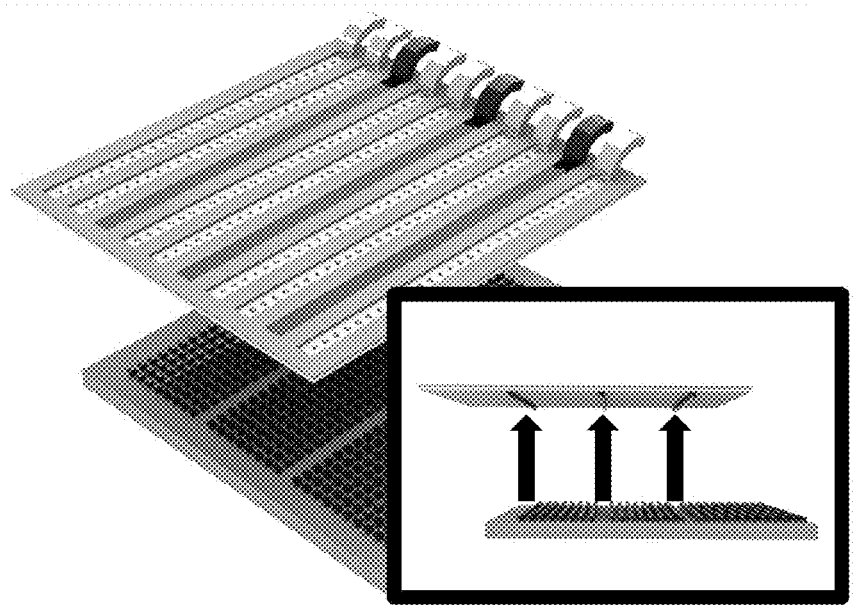

FIGS. 84-86 show selective detachment of red, green and blue thin film-type flip chip micro-LED arrays from a mother substrate or a temporary substrate using a micro-vacuum module.

Figure 87:
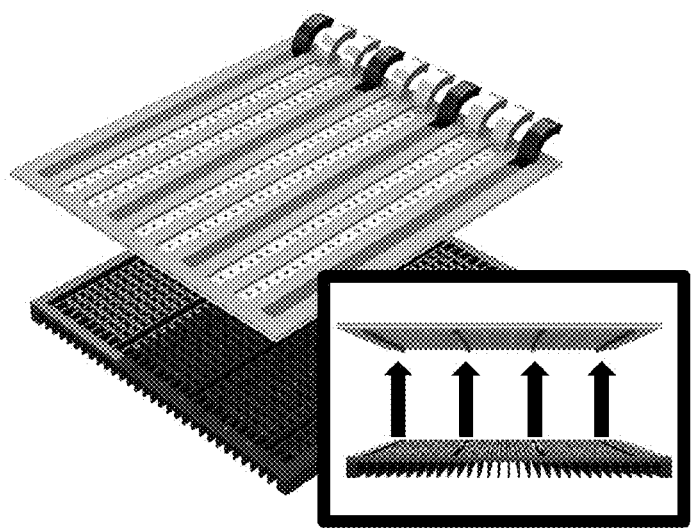
Figure 88:
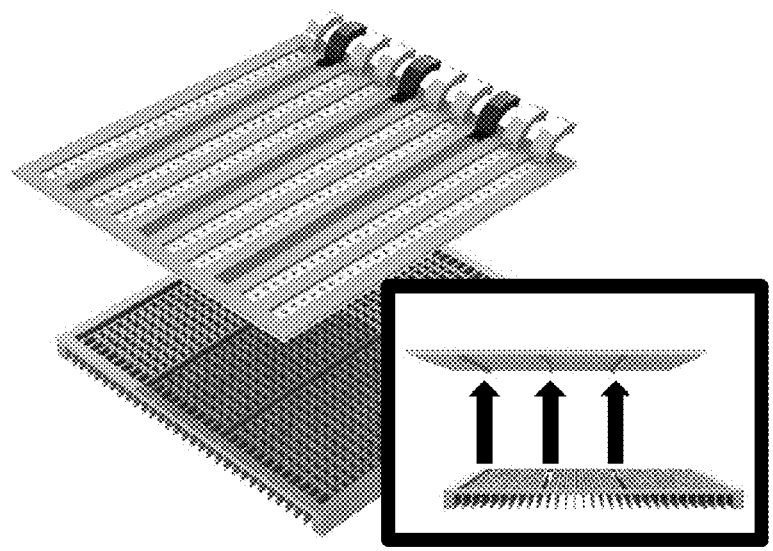
Figure 89:
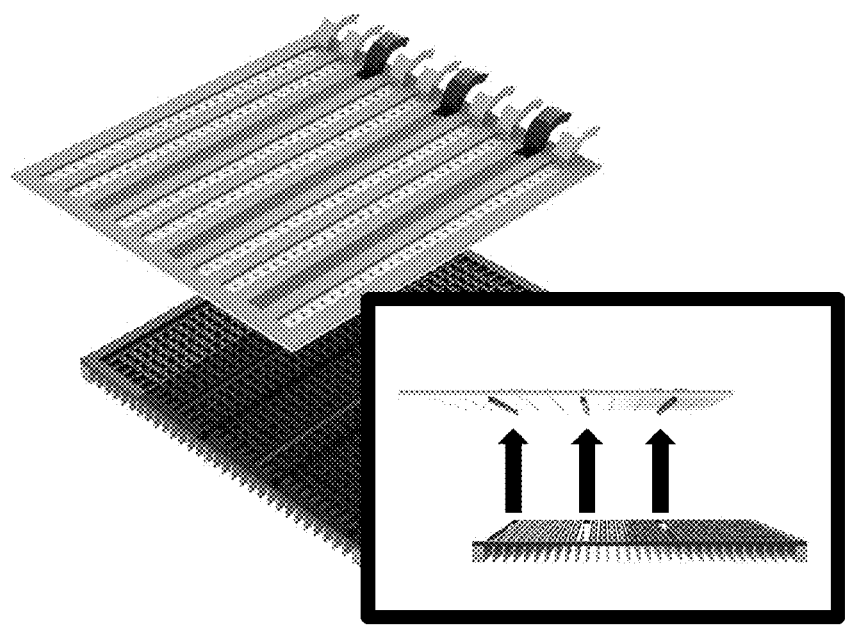

FIGS. 87-89 show selective detachment of red, green and blue thin film-type vertical micro-LED arrays from a mother substrate or a temporary substrate using a micro-vacuum module.

Figure 90:
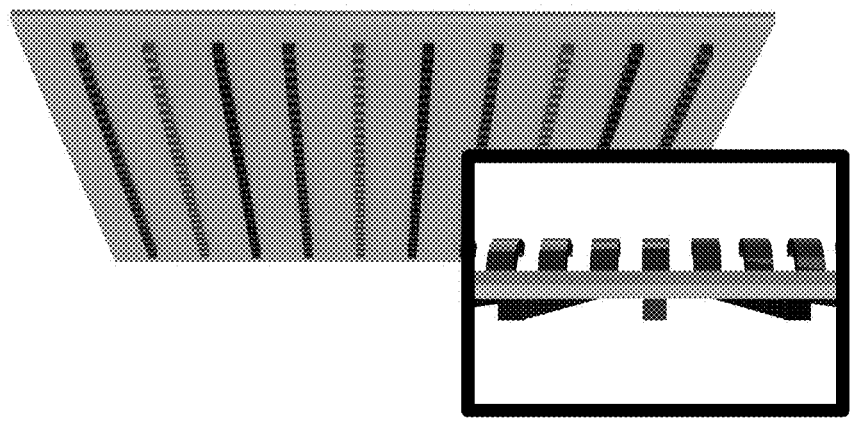
FIG. 90 illustrates a micro-vacuum module to which micro-LED arrays of red, green and blue colors are attached through selective detachment of the micro-LED arrays using the micro-vacuum module.

FIG. 90 shows a micro-vacuum module with RGB micro-LED arrays of the three primary colors attached through selective detachment.

Figure 91:
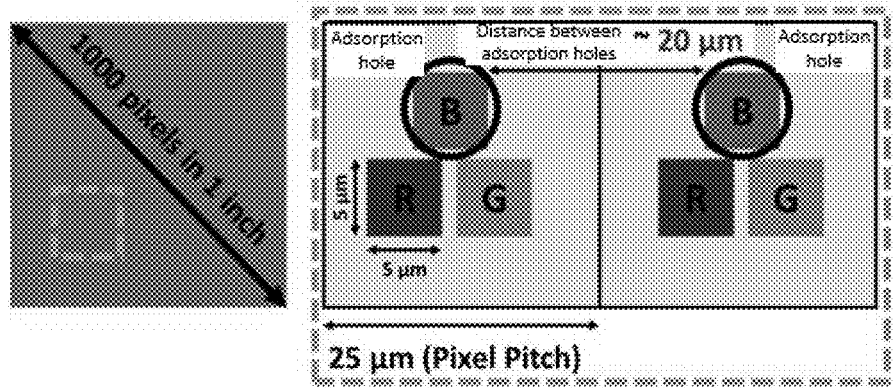
FIGS. 91-93 illustrate a gap between adsorption holes necessary for realizing a micro-LED display and a LED patch using a micro-vacuum module.

FIG. 91 shows the relationship between the PPI of a micro-LED display and the gap between adsorption holes of a micro-vacuum module.

The relationship between the PPI of a micro-LED display and the gap between the adsorption holes of a micro-vacuum module is as follows.

Assuming a square display of 1000 PPI, the size of one pixel of the display is 25 µm because "there are 1000 pixels per 1 inch of the diagonal". And, suppose that red, green and blue sub-pixel micro-LEDs have is a square a size of 5 µm×5 µm, the gap between the sub-pixels of the same color is 20 µm. And, the required gap between the adsorption holes of the micro-vacuum module is 20 µm or smaller.

Figures 92, 93:
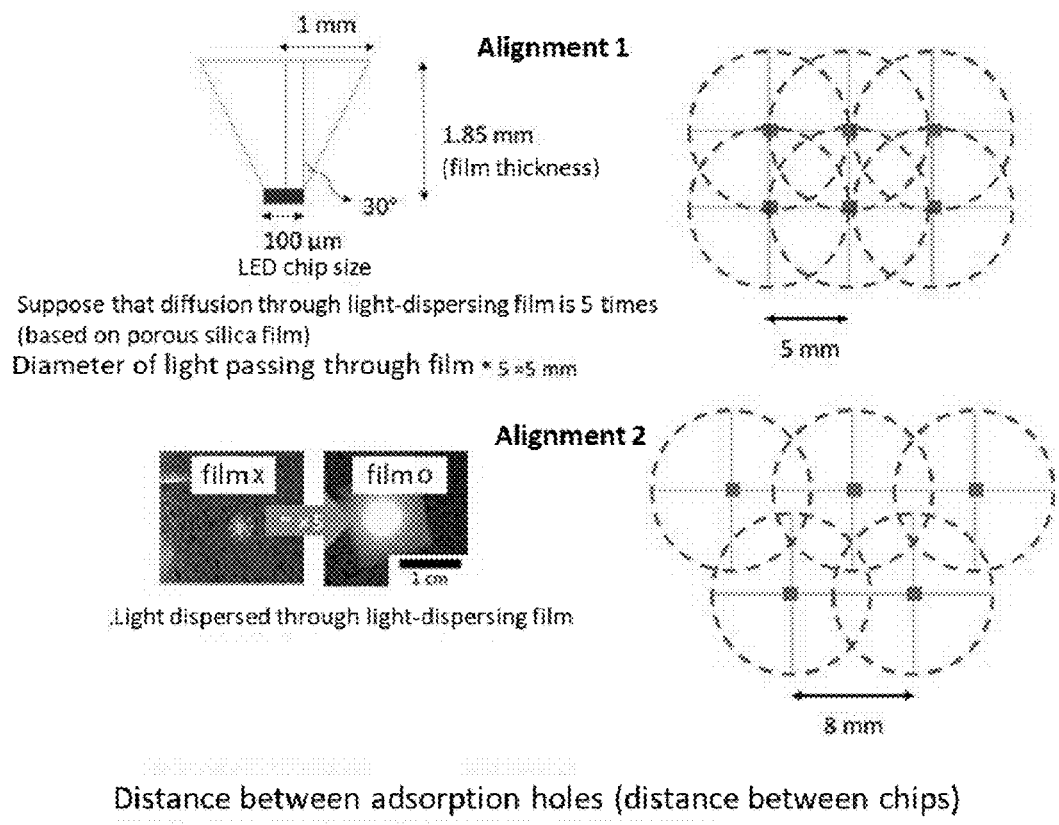

FIG. 92 shows the PPI of electronic devices wherein a LED display is used and the expected gap between the adsorption holes of the micro-vacuum module.

The display PPI, pixel pitch, and required gap between the adsorption holes of the micro-vacuum module required for a high-definition TV of 4K resolution or higher, a tablet PC, a smartphone, a VR, and a next-generation VR/AR being developed currently, calculated according to FIG. 91, are shown in FIG. 92.

The gap between the adsorption holes should be 5 µm or greater and 300 µm or smaller in order to allow for transfer of micro-LED arrays using a micro-vacuum module from a high-definition TV of 4K resolution or higher to a 2500-ppi high-definition AR/VR.

When considering the size of micro-LED chips developed thus far, the required size of the adsorption holes will be 5 µm or greater and 100 µm or smaller.

FIG. 93 shows the maximum gap between the adsorption holes of the micro-vacuum module allowing the manufacturing of a micro-LED-based LED patch.

Because the existing beauty care device using LED (e.g., a LED mask) irradiates light to human skin from a distance of 2 cm or longer, a large amount of the light is lost while the light generated by the device reaches the skin. Therefore, the LED is driven with a higher power than necessary for phototherapy and, thus, a lot of heat is generated. This worsens portability and makes long-term phototherapy impossible.

In contrast, the micro-LED-based LED patch irradiates light in the state of being attached to the skin at a very short distance of 0-8 mm. Therefore, the loss of light is much less as compared to the existing beauty care device using LED which irradiates light from a relatively long distance of 2 cm or longer. As a result, it requires less power and generates less heat as compared to the existing beauty care device using LED. In addition, the patch is smaller in size than the existing beauty care device using LED. For this reason, the micro-LED-based LED patch has excellent portability and can be used not only for short-term phototherapy but also for long-term phototherapy.

If the micro-LED-based LED patch is embodied using a micro-vacuum module, the number of LED patches that can be manufactured with one LED wafer increases remarkably. Therefore, the improvement in the LED patch manufacturing speed and efficiency and cost reduction can be expected.

The gap between the adsorption holes necessary for embodying a micro-LED-based LED patch using a micro-vacuum module is shown in FIG. 93.

First, suppose that the size of a micro-LED chip is 100 µm, the light radiation angle from the LED chip is 60°, the thickness of a light-dispersing film is 1.85 mm, and the radius of the light increases 5 times after passing through the light-dispersing film, the radius of the light emitted from the micro-LED becomes 1 mm at a distance of 1.85 mm from the micro-LED. It is increased to 5 mm when the light-dispersing layer is used.

If the micro-LEDs are aligned as in the alignment 2 with a larger gap between the LEDs in the LED patch, the gap between the micro-LEDs becomes 8 mm.

However, the LED patch does not require the dense LED alignment of high resolution unlike the display (for a micro-LED-based LED patch, the gap between the micro-LEDs is expected to be about 10 µm or greater).

Because the gap between the micro-LEDs in the LED patch is equal to or greater than the gap between the adsorption holes of the micro-vacuum module, the gap between the adsorption holes should be 10 µm or larger and 8 mm or smaller in order to embody a micro-LED-based LED patch using a micro-vacuum module.

According to the present disclosure, LEDs formed on a mother substrate or a temporary substrate may be detached at once using a micro-vacuum module and then selectively aligned and transferred onto a plurality of target substrates coated with a transfer member.

Figure 94:
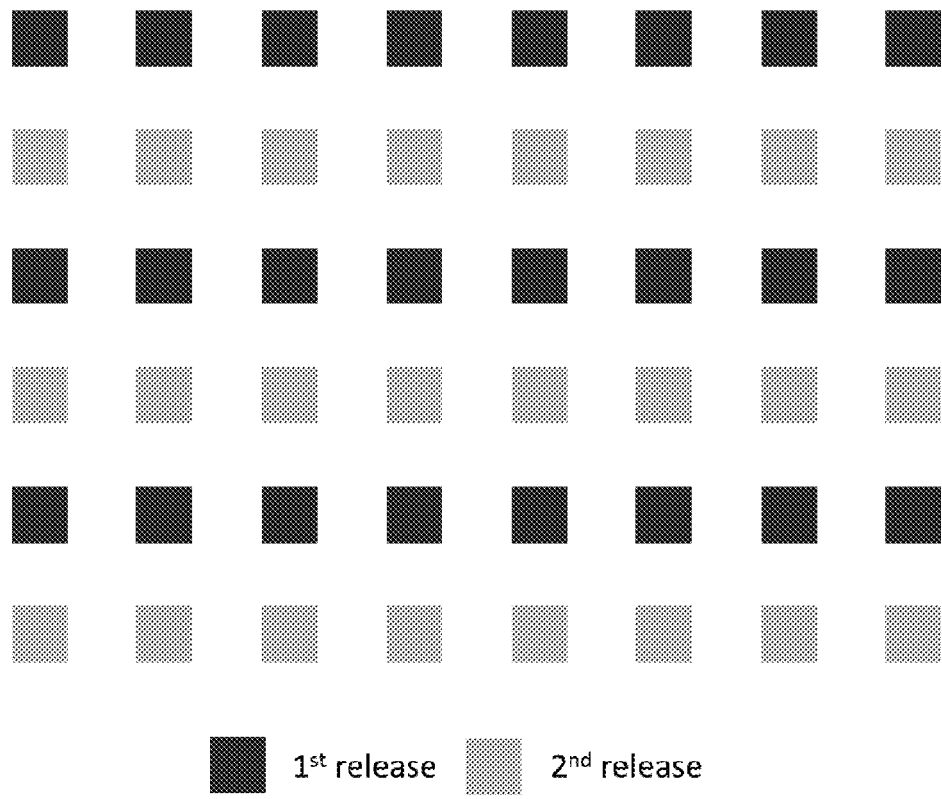
FIGS. 94-96 illustrate detachment of micro-LED arrays or red and green colors from a mother substrate or a temporary substrate using a micro-vacuum module and selective alignment and transfer onto a plurality of target substrates coated with a transfer member.
Figure 95:
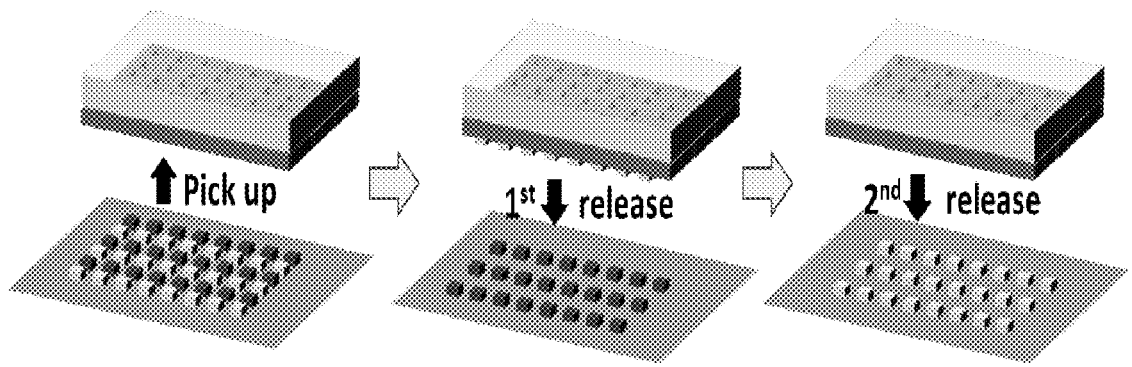
Figure 96:
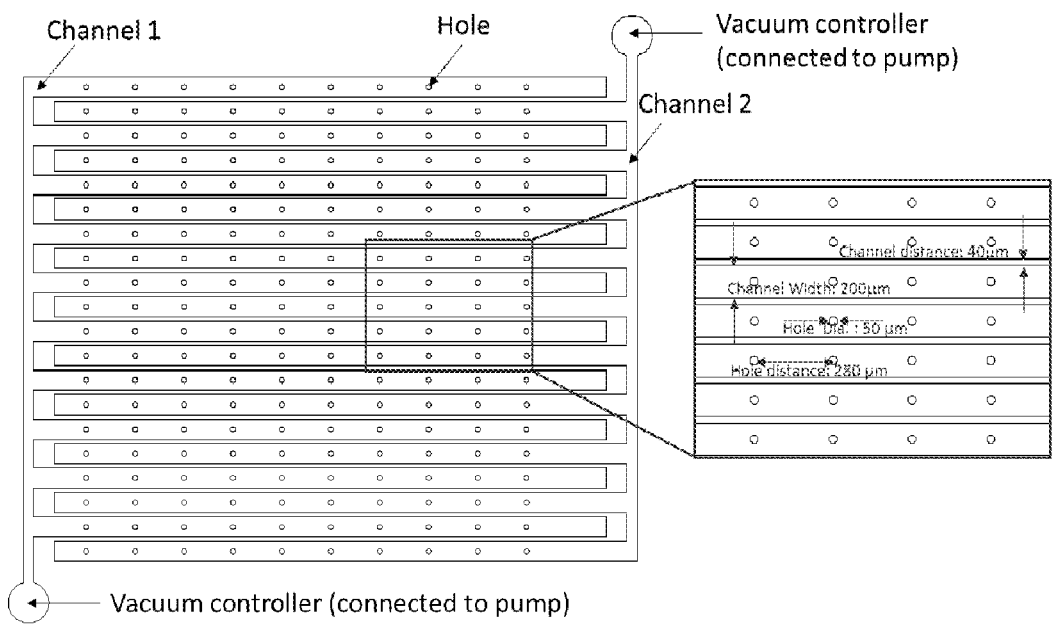

FIGS. 94-96 show detachment of micro-LED arrays at once from a mother substrate or a temporary substrate using a micro-vacuum module followed by selective alignment and transfer for two times onto a plurality of target substrates coated with a transfer member.

FIG. 94 shows micro-LED arrays aligned on a mother substrate or a temporary substrate.

FIG. 95 shows pick up of the micro-LED arrays using a micro-vacuum module followed by release of the micro-LED array onto different substrates for two times.

Referring to FIG. 96, vacuum is formed and released in a state where adsorption holes detaching a first micro-LED array are connected to a vacuum controller via channel 1, and adsorption holes detaching a second micro-LED array are connected to the vacuum controller via channel 2. Although the diameter of the adsorption holes shown in the figure is 50 µm, it can be adjusted in a range from 10 µm to 100 µm. Likewise, the gap between the channels may be 140 µm or larger, and the channel width may be 30-200 µm.

FIGS. 97-102 show detachment of micro-LED arrays from a mother substrate or a temporary substrate using a micro-vacuum module followed by selective alignment and transfer for four times onto a plurality of target substrates coated with a transfer member.

Figure 97:
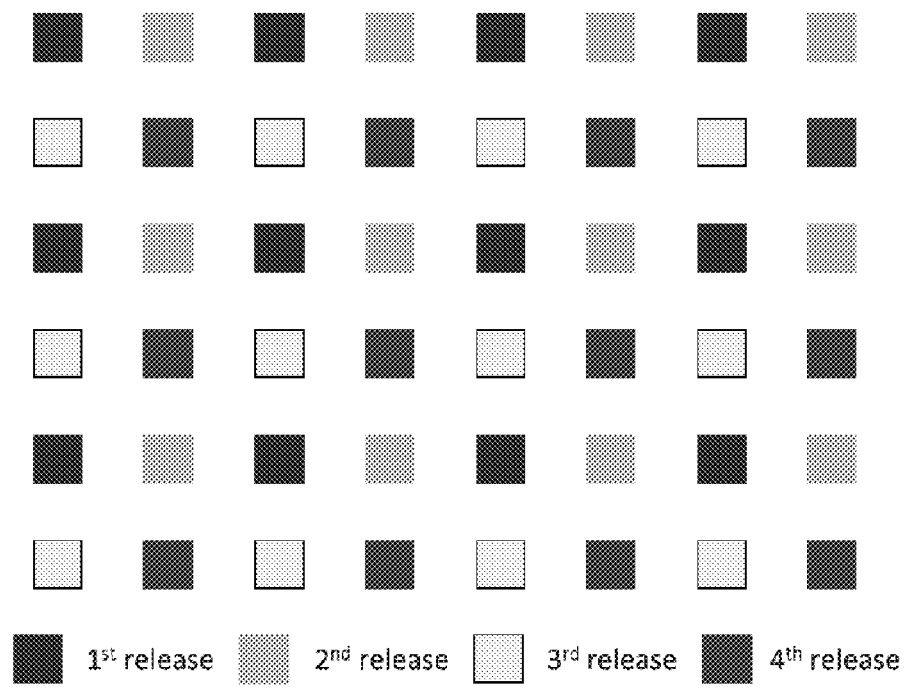
FIGS. 97-102 illustrate detachment of micro-LED arrays or red, green, yellow and blue colors from a mother substrate or a temporary substrate using a micro-vacuum module and selective alignment and transfer onto a plurality of target substrates coated with a transfer member.

FIG. 97 shows micro-LED arrays aligned on a mother substrate or a temporary substrate.

Figure 98:
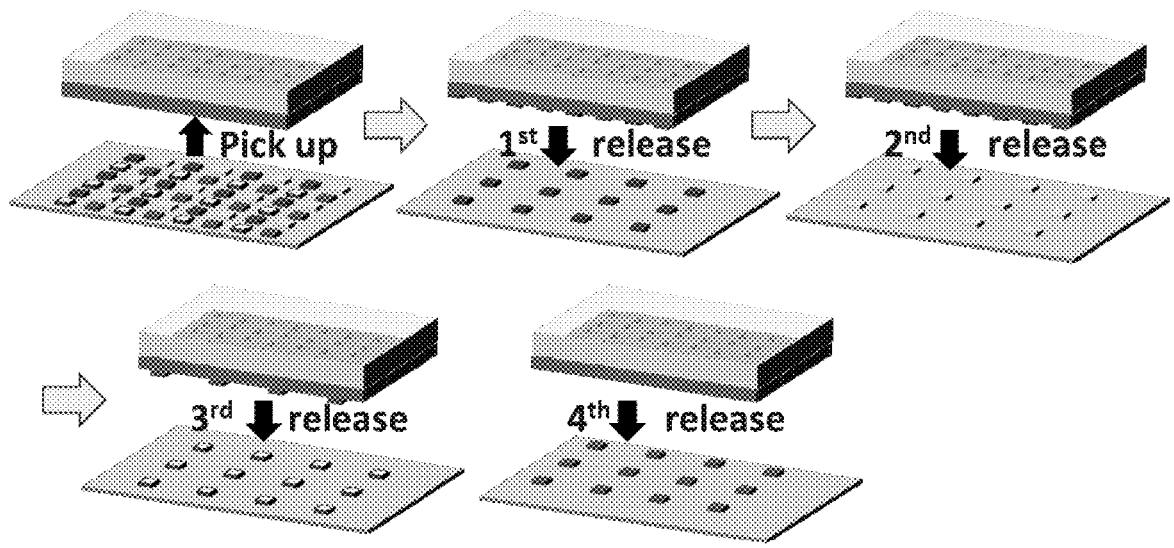

FIG. 98 shows pick up of the micro-LED arrays using a micro-vacuum module followed by consecutive release of the micro-LED array onto different substrates for four times.

Figure 99:
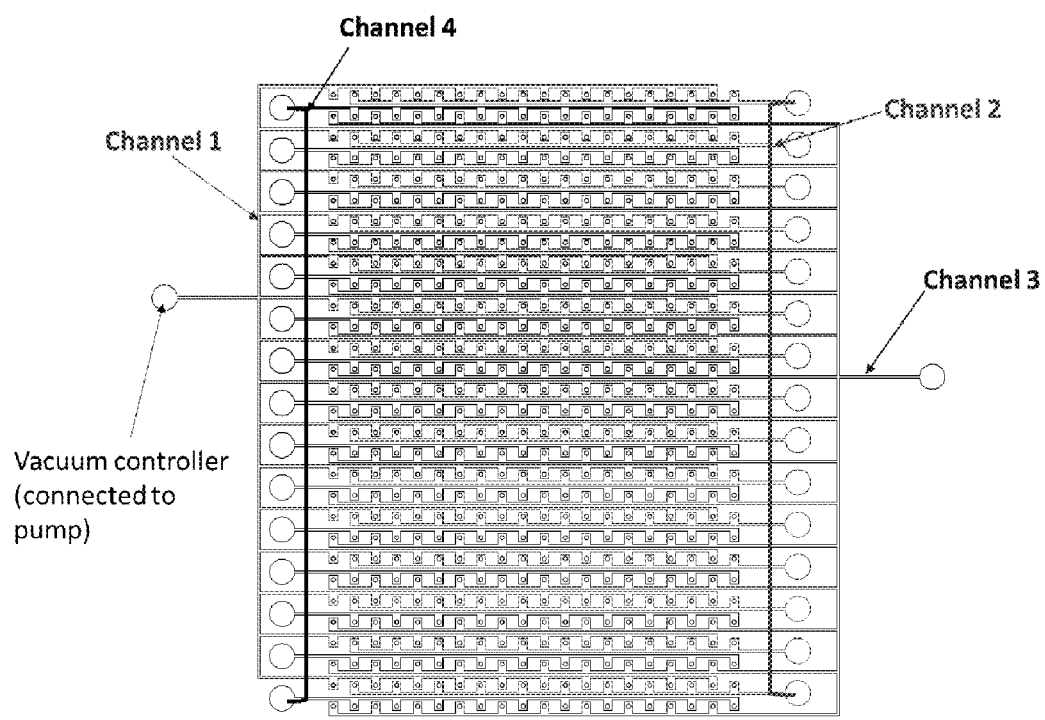

Referring to FIG. 99, vacuum is formed and released in a state where adsorption holes detaching a first micro-LED array are connected to a vacuum controller via channel 1, adsorption holes detaching a second micro-LED array are connected to the vacuum controller via channel 2, adsorption holes detaching a third micro-LED array are connected to the vacuum controller via channel 3, and adsorption holes detaching a fourth micro-LED array are connected to the vacuum controller via channel 4.

Figure 100:
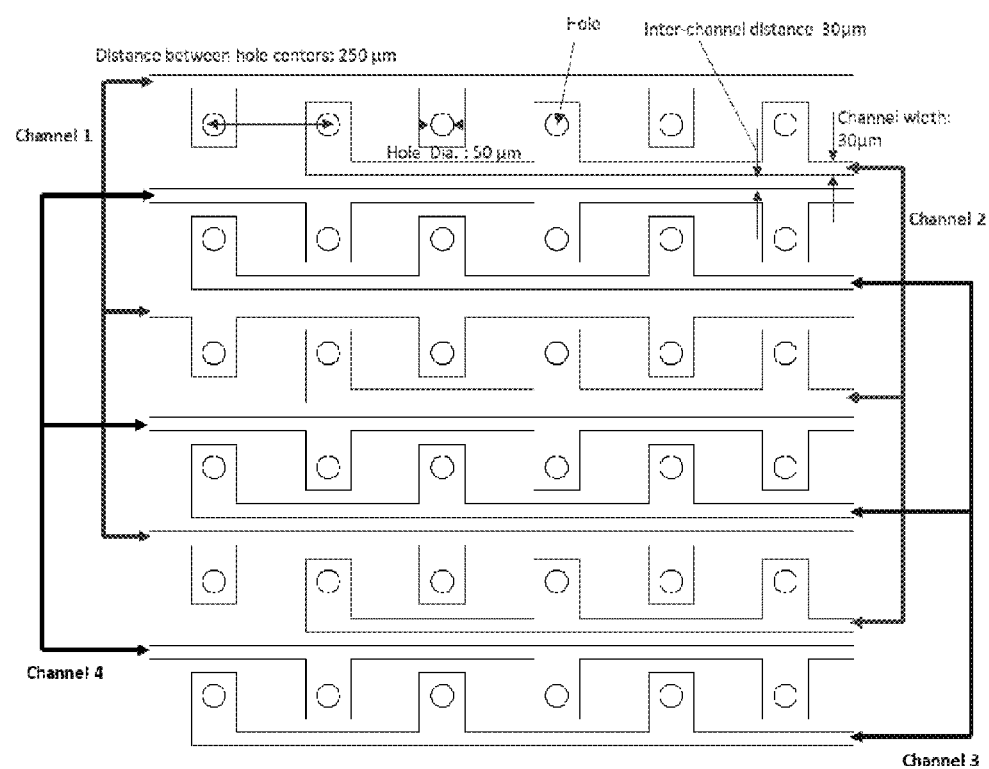

FIG. 100 is an enlarged view of a portion of FIG. 99. It shows the diameter of the adsorption holes to which the micro-LED arrays are attached directly, and the gap between the adsorption holes. It also shows the gap between the channels and the channel width. In this example, the diameter of the adsorption holes and the gap between the adsorption hole are 50 μm and 250 μm, respectively. And, the gap between the channels and the channel width are 30 μm, respectively. Although the diameter of the adsorption holes shown in the figure is 50 μm, it can be adjusted in a range from 10 μm to 100 μm. Likewise, the gap between the channels may be 30 μm or larger, and the channel width may be 30-200 μm.

Figure 101:
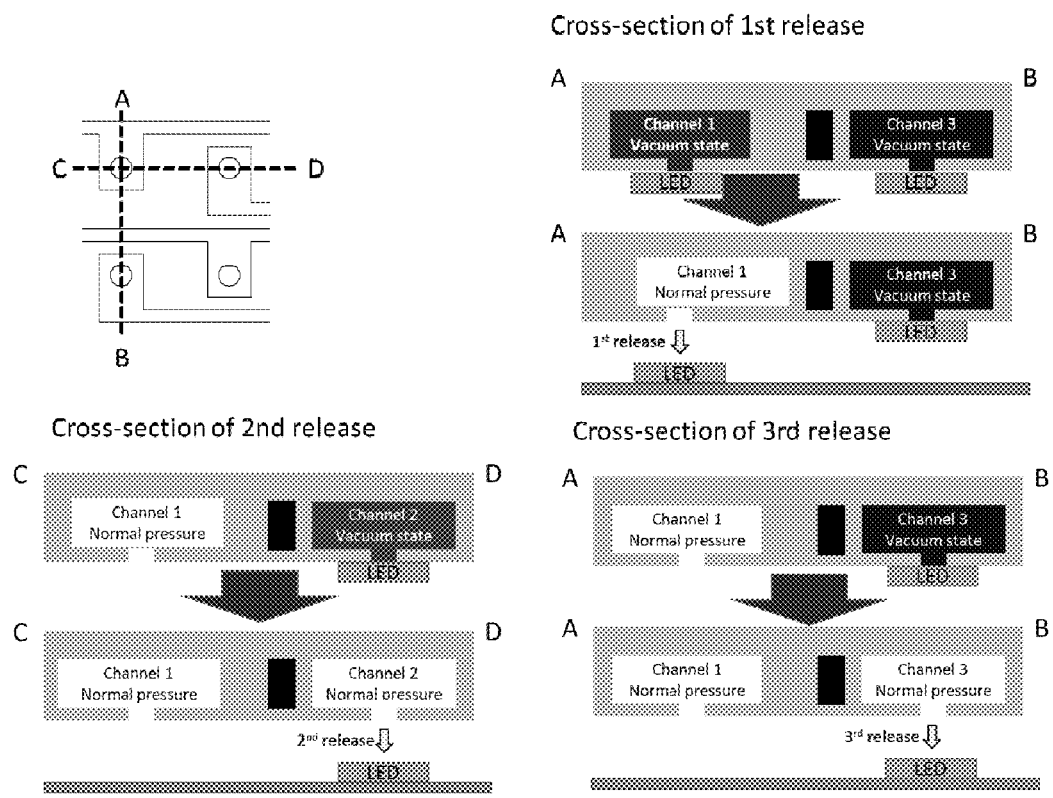

FIG. 101 shows cross-sectional views illustrating a process whereby the micro-LED arrays are released from the channel 1 to the channel 3.

As seen from the left-top corner, line A-B in the vertical direction and line C-D in the horizontal direction are marked on an array consisting of four micro-LEDs.

The first release process in the line A-B is shown in the right-top corner. The transfer onto the target substrate is achieved by releasing the vacuum of the channel 1 while maintaining the vacuum of the other channels.

The second release process in the line C-D is shown in the left-bottom corner. The transfer onto the target substrate is achieved by releasing the vacuum of the channel 2 while maintaining the vacuum of the other channels.

The third release process in the line A-B is shown in the right-top corner. The transfer onto the target substrate is achieved by releasing the vacuum of the channel 3 while maintaining the vacuum of the other channels.

Figure 102:
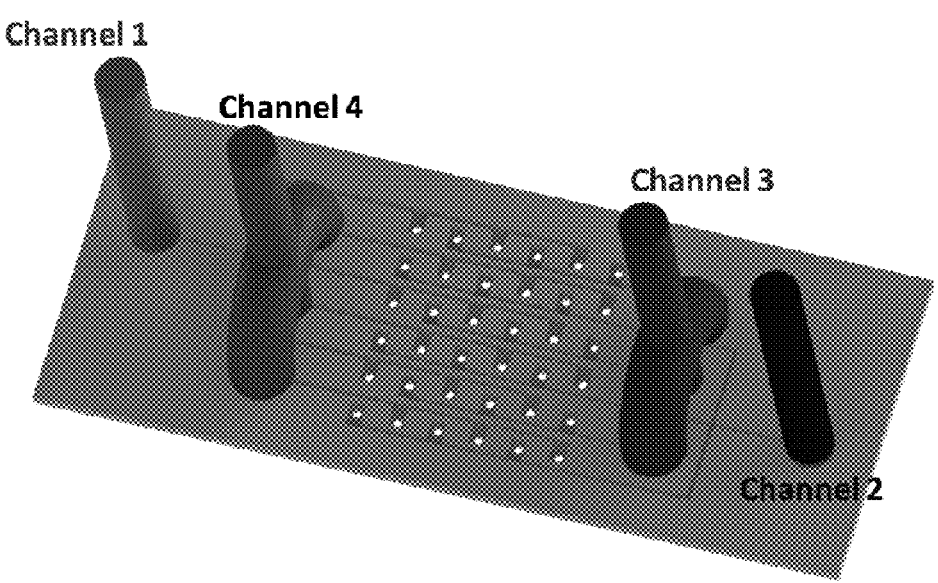

FIG. 102 shows the four micro-LEDs aligned in 3×3 alignment. The channel 1 and the channel 2 connected to the red and green micro-LEDs, respectively, are connected in the micro-vacuum module, and the channel 3 and the channel 4 connected to the yellow and blue micro-LEDs, respectively, are connected outside the micro-vacuum module for vacuum control.

In another embodiment, a donut-shaped cylindrical column may be made around the micro size hole.

Figure 103:
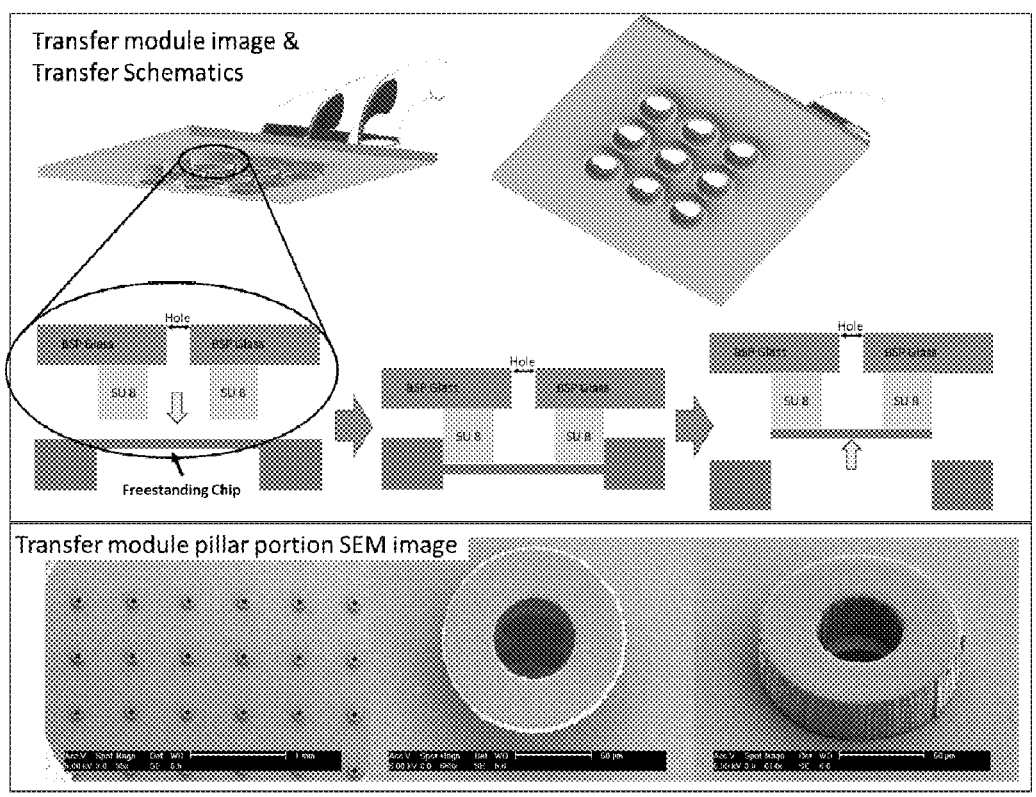
FIG. 103 illustrates transfer module image and transfer schematics.
Figure 104:
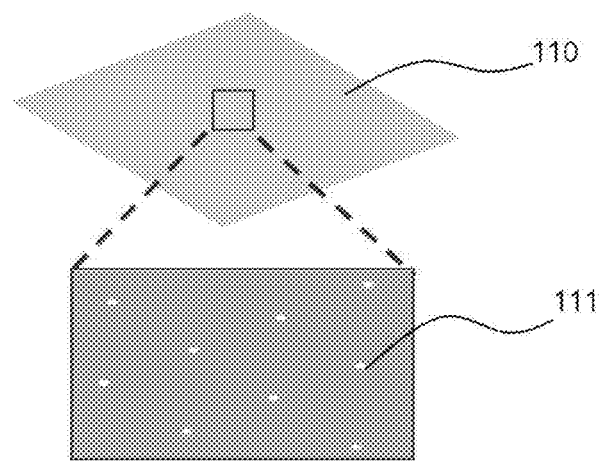
FIGS. 104-110 illustrate the steps of a method for fabricating a micro-vacuum module for semiconductor device transfer according to an exemplary embodiment of the present disclosure.

According to FIG. 103, in this case, the donut-shaped cylindrical pillar may be formed on a substrate having a hole formed of a moldable material including a metal/polymer, or the substrate having the hole may be formed by an etching process.

The donut-shaped cylinder allows the vacuum path through the hole portion to protrude further from the base substrate (hole formed substrate). Therefore, because of pillar, the entire base substrate does not touch the surface of the chip to be transferred, and only the circular pillar portion may touch only the semiconductor element (μLED) to be transferred.

Hereinafter, a method for fabricating a micro-vacuum module for semiconductor device transfer is described.

FIGS. 114-120 illustrate the steps of a method for fabricating a micro-vacuum module for semiconductor device transfer according to an exemplary embodiment of the present disclosure.

Figure 114:
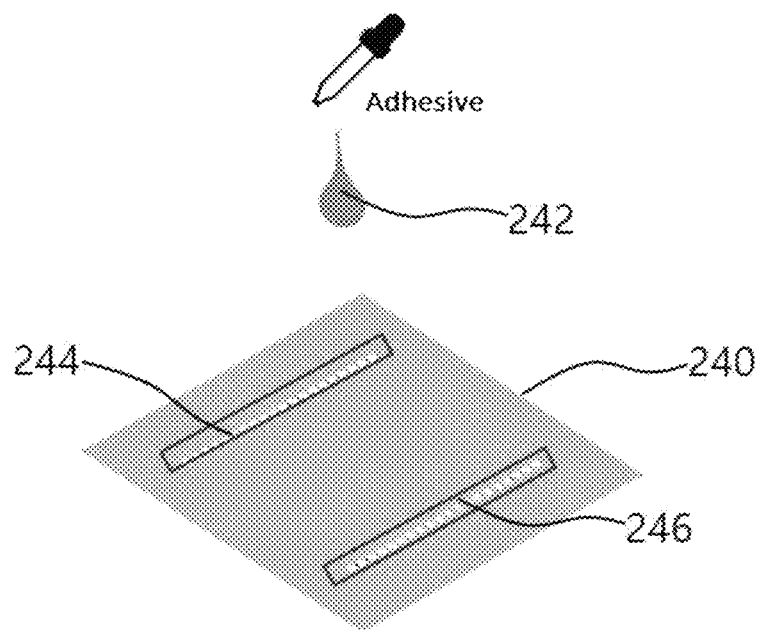

A step of forming a hole array on a base substrate 110 is described referring to FIG. 114. FIG. 114 shows a portion of a base substrate 110 with a hole array 111 formed thereon.

The hole array 111 is formed on the base substrate 110, which is easily machinable, e.g., silicon, glass, acryl, etc., through a reactive-ion etching process or a process using laser.

The hole array 111 formed on the base substrate 110 has a diameter or a side ranging from 1 μm to 1 mm. The hole array 111 is formed according to the cell of the device to be transferred. The area of each hole of the hole array 111 should not be larger than the area of the device. The hole array 111 serves as holes for forming micro-vacuum.

For example, the hole array 111 is formed on the base substrate 110 in singular or plural numbers with a diameter smaller than 100 μm and is contacted with a microLED (μLED) having a width and a length of 100 μm or smaller.

The hole array 111 may be formed by a Si Bosch process, a laser micromachining process, a patterning process using an epoxy polymer (SU8, etc.), etc.

The microLED may be a thin-film microLED with a size of 5 μm or smaller.

Figure 105:
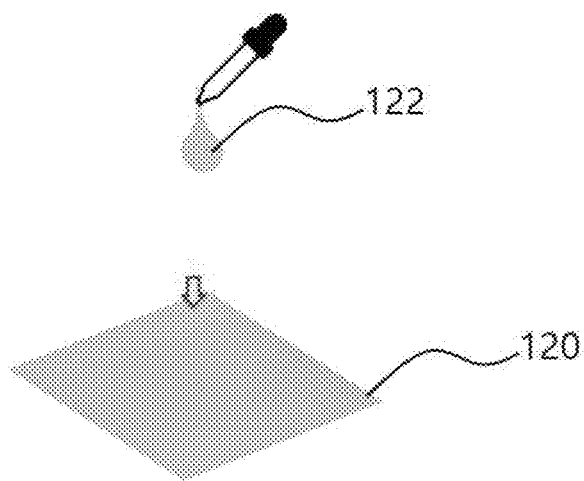

Referring to FIG. 105, a sacrificial layer solution 122 which exhibits adhesive property and can be removed with a specific solution is formed uniformly on a carrier substrate 120. The material used for the sacrificial layer solution 122 should not react with an adhesive used in the subsequent process and the specific solution used to remove the sacrificial layer solution 122 should not react with the adhesive, too. The sacrificial layer solution 122 may be a sacrificial layer which exhibits adhesive property and can be removed with a specific solution. Specifically, for the sacrificial layer solution 122, PMMA (poly(methyl methacrylate)), a photoresist or PVA (polyvinyl alcohol) may be used.

Figure 106:
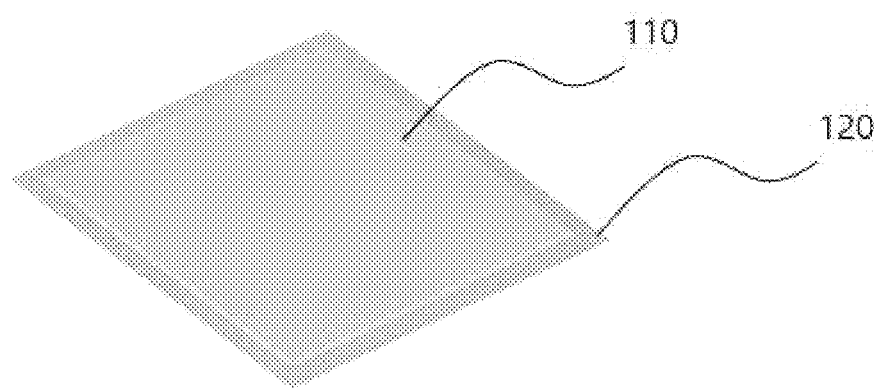

Referring to FIG. 106, the base substrate 110 is attached onto the carrier substrate 120.

Figure 107:
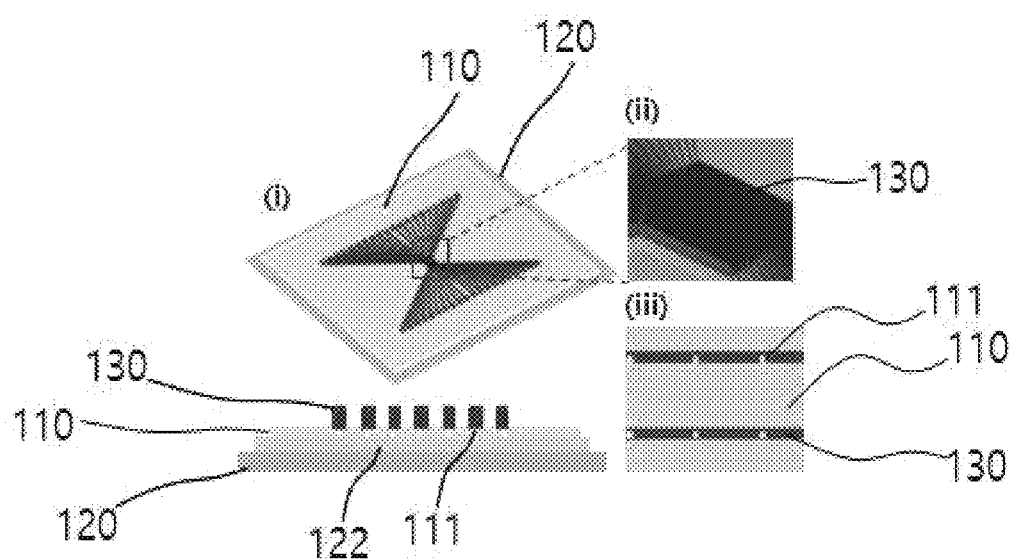

Referring to FIG. 107, a channel layer 130 capable of covering the hole array 111 on the base substrate 110 is formed using a polymer which is capable of forming a pattern through photolithography on the base substrate 110 attached onto the carrier substrate 120 (FIG. 107 (i)).

FIG. 107 (ii) shows an image of a pattern at the center portion of the channel layer 130. FIG. 107 (iii) shows an image of a pattern at the center portion of the channel layer 130 seen from above.

Figure 108:
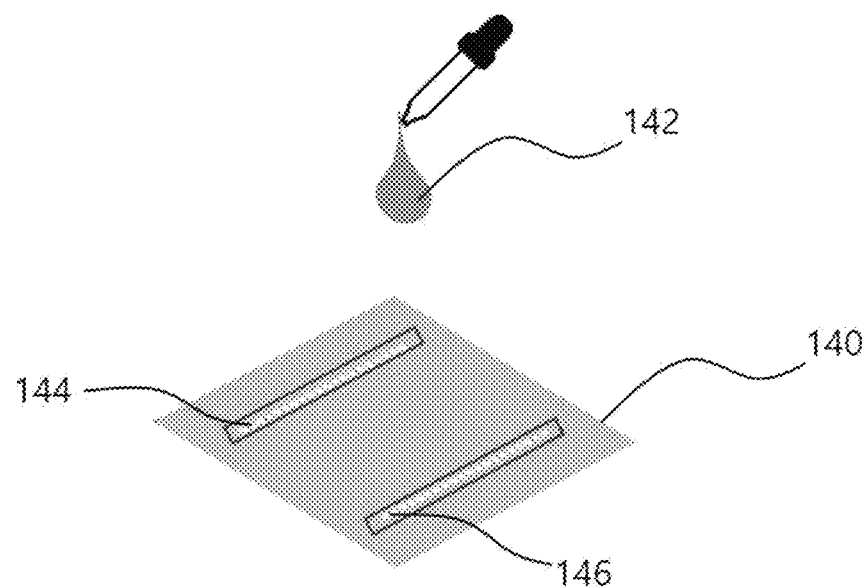

Referring to FIG. 108, an adhesive 142 is applied onto a process substrate 140 with a first through-hole 144 connected to an external pump module and a second through-hole 146 connected to a vacuum control unit formed. The process substrate 140 should be transparent when a UV-curable adhesive is used. When other adhesives are used, it needs not be transparent as long as the adhesive can be applied uniformly by spin coating. The process substrate may also be referred to as a process forming substrate.

Figure 109:
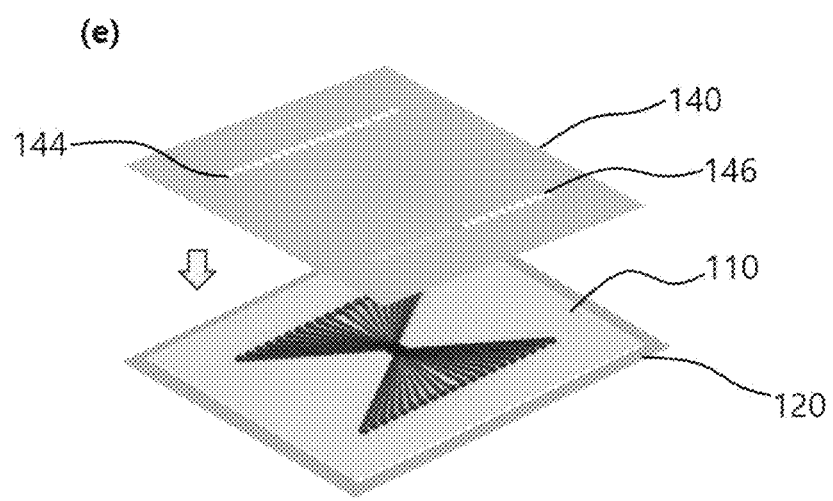

Referring to FIG. 109, the process substrate 140 is attached to the base substrate 110 with the channel layer 130 formed. During this process, the process substrate 140 is inverted such that the adhesive 142 is contacted with the top surface of the base substrate 110.

In the process where the process substrate 140 is attached to the base substrate 110, the adhesive 142 should be filled between the channel layer 130 formed of a photosensitive material. If the channel layer 130 is removed after the adhesive 142 is cured, the adhesive 142 is formed with a shape opposite to that of the channel layer 130 and a plurality of channel holes 132 are formed in the space that has been occupied by the channel layer 130. Overall, the adhesive 142 with the channel holes 132 formed between the process substrate 140 and the base substrate 110 serves as a support layer and the hole array 111 is communicated respectively to the plurality of channel holes 132.

Accordingly, for selective transfer channel by channel, vacuum should be formed for each channel pattern or line pattern formed along the plurality of channel holes 132. Here, the channel pattern or line pattern may be defined as a connected structure of the channel hole 132 and the hole array 111.

In order to separate the devices transferred from a mother substrate channel by channel, the devices should be lifted with the adsorptive force delivered through the hole array 111. Therefore, the width of the channel hole 132 covering the hole array 111 is determined within a range not affecting the hole array 111 present on the other adjacent channel pattern.

Figure 110:
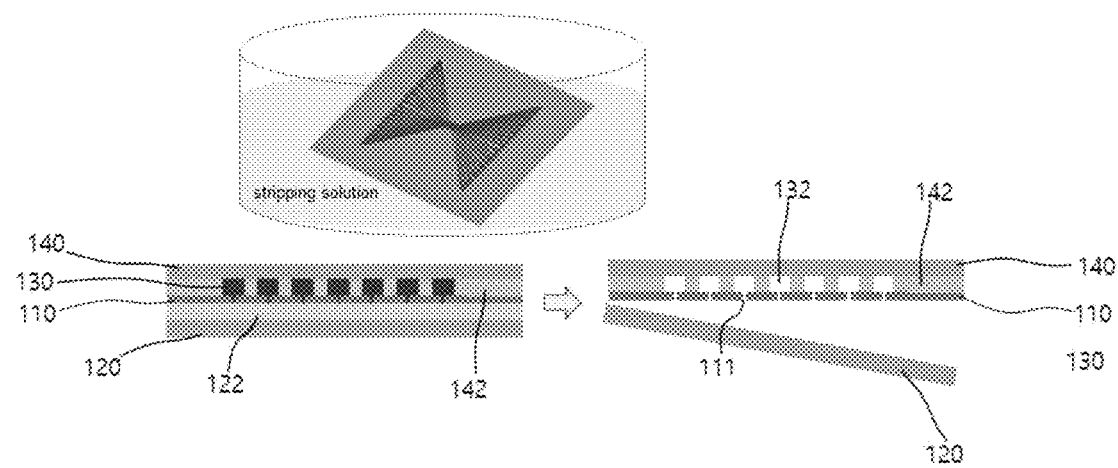

Referring to FIG. 110, after the adhesive 142 is cured, the carrier substrate 120 is separated from the base substrate 110 using a solution which reacts with the material of the sacrificial layer solution 122. Then, in order to remove the channel layer 130 formed by photolithography, the formed pattern is removed using a solution which reacts with the material used to form the channel layer.

When the same solution is used to remove the materials used to form the sacrificial layer solution 122 and the channel layer 130, the process of separating the base substrate 110 and the carrier substrate 120 and the process of removing the pattern formed by photolithography may be conducted at the same time.

Figure 124:
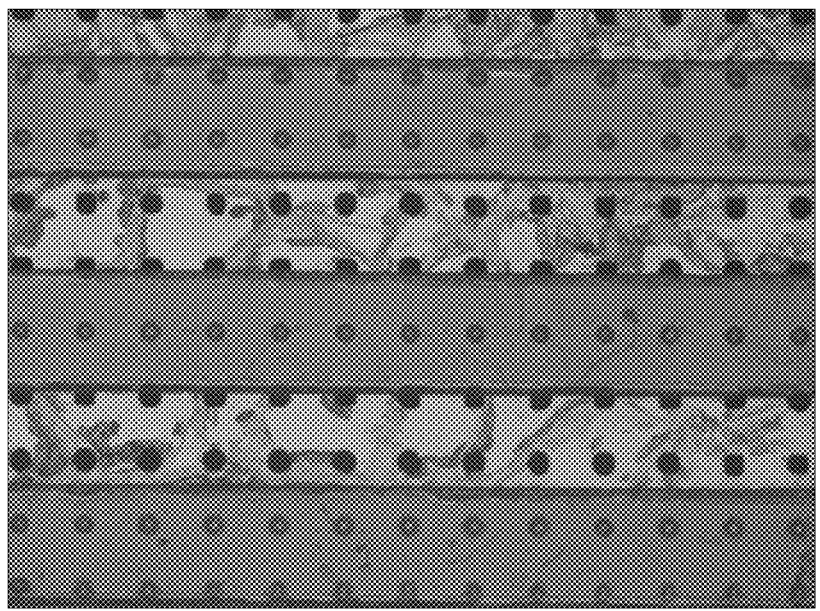
FIG. 124 shows an optical microscopic image of the channel portion of a micro-vacuum module for semiconductor device transfer with a sacrificial layer and a polymer pattern removed through a solution process in FIG. 7.

FIG. 124 shows an optical microscopic image of the channel portion of the micro-vacuum module for semiconductor device transfer with the sacrificial layer and the polymer pattern removed through the solution process in FIG. 110.

Figure 111:
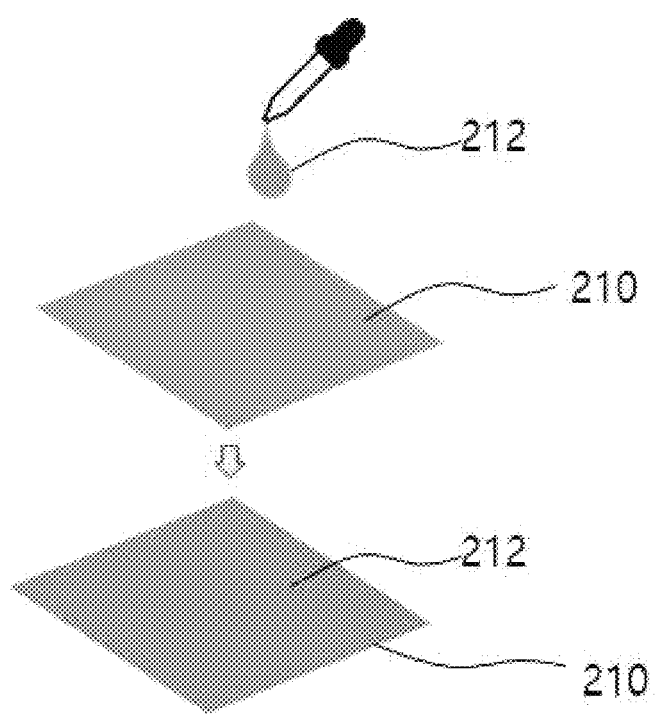
FIGS. 111-117 illustrate the steps of a method for fabricating a micro-vacuum module for semiconductor device transfer according to another exemplary embodiment of the present disclosure.

FIGS. 111-107 illustrate a method for fabricating a micro-vacuum module for semiconductor device transfer according to another exemplary embodiment of the present disclosure.

Referring to FIG. 111, a material that can be used as a sacrificial layer 212 is formed on a carrier substrate 210. The sacrificial layer 212 contains hydrogenated amorphous silicon (a-Si:H), a photosensitive material, PVA (poly(vinyl alcohol)), etc. that can be removed or separated in the subsequent process. When the sacrificial layer contains hydrogenated amorphous silicon (a-Si:H), it may be separated using a laser. When other materials are used for the sacrificial layer, they may be removed using solvents that react with the respective materials.

The carrier substrate 210 may be any substrate which is surface-treated such that the material used as the sacrificial layer is or can be applied uniformly by spin coating.

Figure 112:
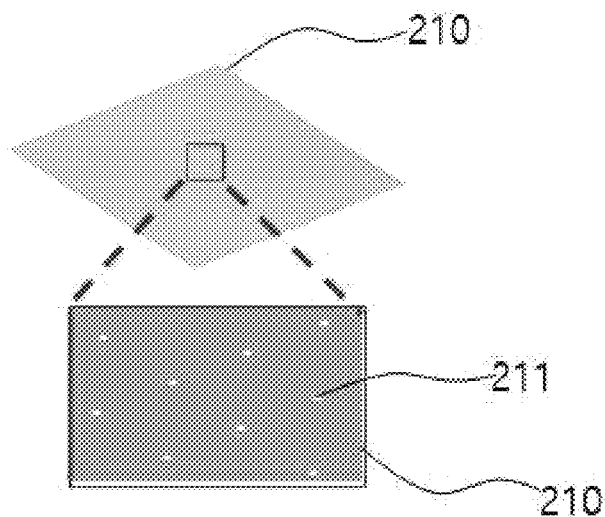

Referring to FIG. 112, a hole array 211 is formed on the carrier substrate 210 by photolithography.

The hole array 211 formed on the carrier substrate 210 has a diameter or a side ranging from 1 μm to 1 mm. The hole array 211 is formed according to the cell of the device to be transferred and the area of each hole should not be larger than the area of the device.

Figure 113:
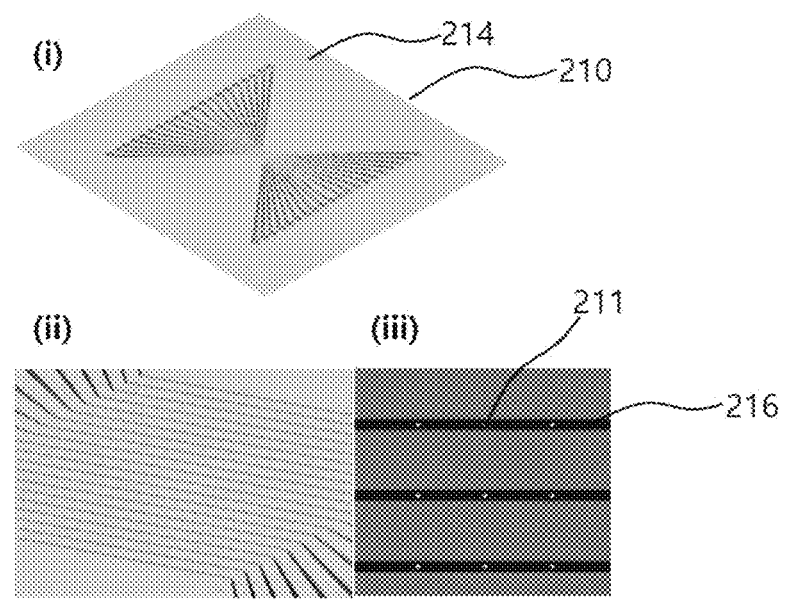

Referring to FIG. 113, a channel layer 216 is formed in a direction not covering the hole array 211 on the carrier substrate 210 using a polymer 214 which is capable of forming the channel layer 216 on the carrier substrate 210 by photolithography (FIG. 113 (i)).

FIG. 113 (ii) shows an image of a pattern at the center portion of the channel layer 216. FIG. 113 (iii) shows an image of a pattern at the center portion of the channel layer 216 seen from above.

Referring to FIG. 114, an adhesive 242 is applied onto a process substrate 240 with a first through-hole 244 connected to an external pump module and a second through-hole 246 connected to a vacuum control unit formed. The process substrate 240 should be transparent when a UV-curable adhesive is used. When other adhesives are used, it needs not be transparent as long as the adhesive can be applied uniformly by spin coating.

Figure 115:
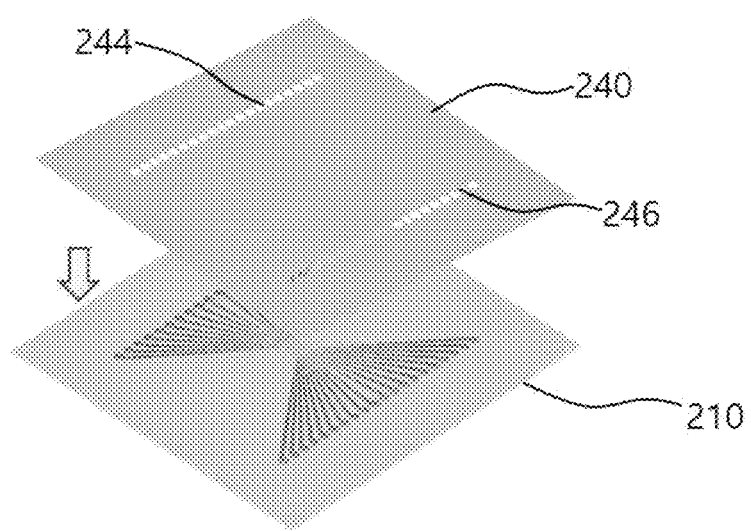

Referring to FIG. 115, the process substrate 240 is attached to the carrier substrate 210 with the channel layer formed. During this process, the process substrate 240 is inverted such that the adhesive 242 is contacted with the top surface of the carrier substrate 210.

Figure 125:
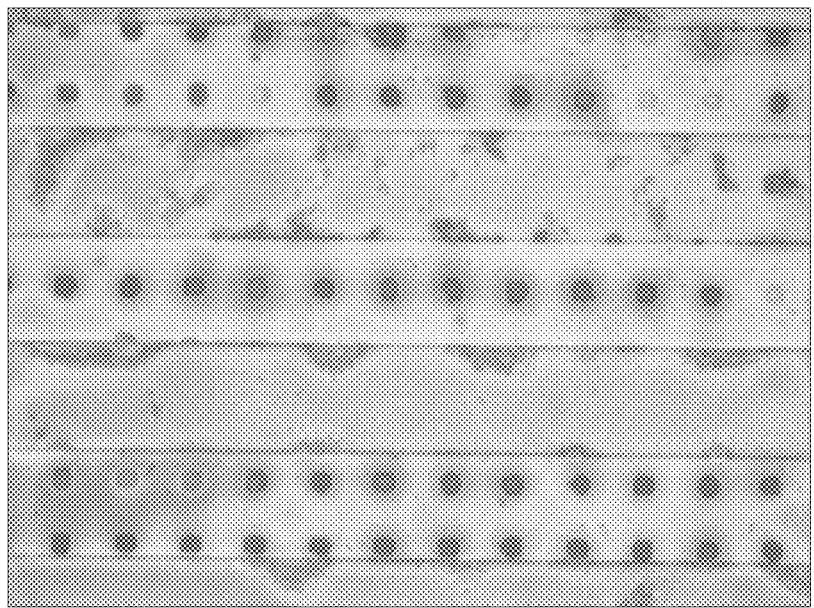
FIG. 125 shows an optical microscopic image of the channel portion of a micro-vacuum module for semiconductor device transfer with a carrier substrate having a channel layer formed and a process substrate attached in FIG. 12.

FIG. 125 shows an optical microscopic image of the channel portion of the micro-vacuum module for semiconductor device transfer with the carrier substrate having the channel layer formed and the process substrate attached.

Figure 116:
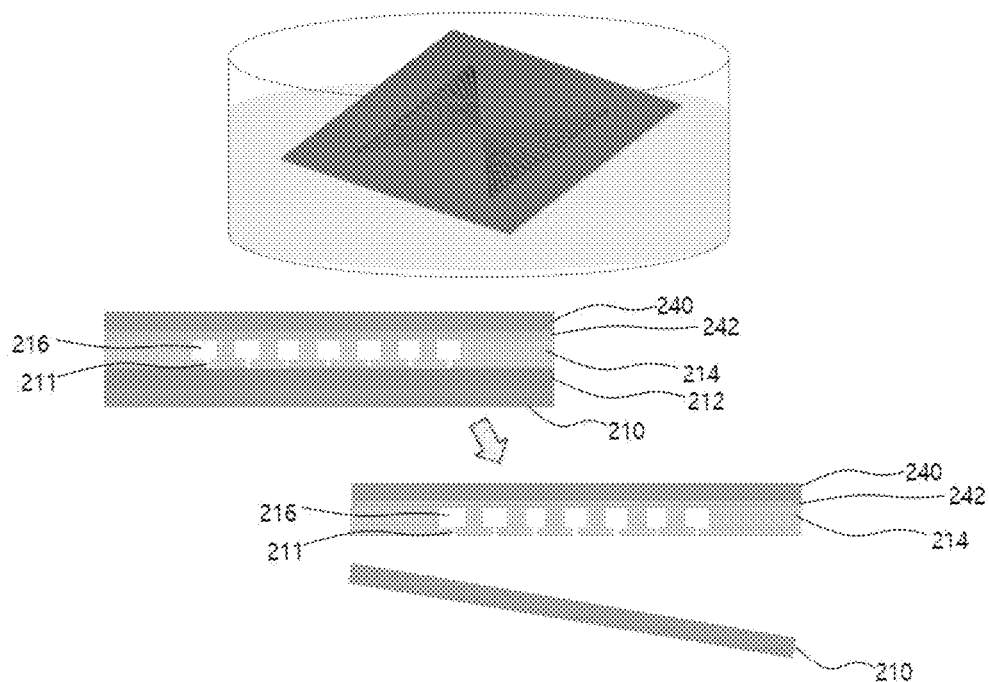

Referring to FIG. 116, after the adhesive 242 is cured, the structure formed on the sacrificial layer 212 is separated from the carrier substrate 210 by removing the sacrificial layer 212 using a solution which reacts only with the sacrificial layer 212. When hydrogenated amorphous silicon (a-Si:H) is used as the sacrificial layer, the sacrificial layer is separated from the carrier substrate 210 by irradiating laser to the sacrificial layer and then the remaining sacrificial layer is removed through sonication.

Through this, the channel layer 216 is fixed on the process substrate 240 by the cured adhesive 242.

Figure 117:
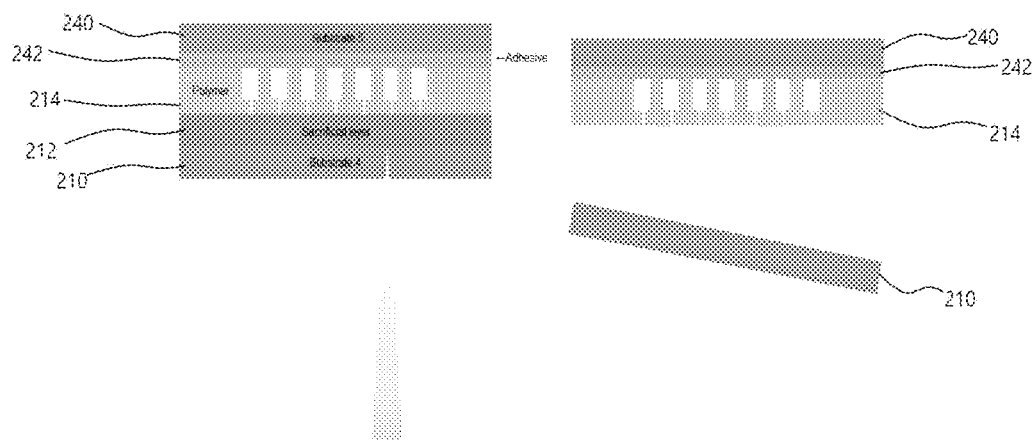
Figure 118:
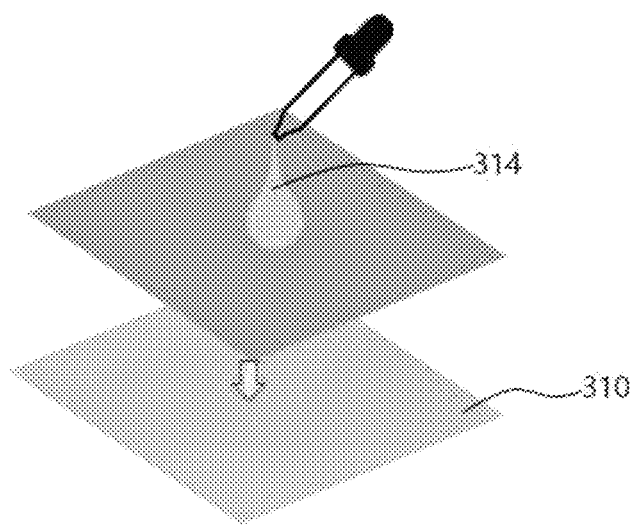
FIGS. 118-122 illustrate the steps of a method for fabricating a micro-vacuum module for semiconductor device transfer according to another exemplary embodiment of the present disclosure.

Referring to FIG. 117, when silicon oxide is used as the sacrificial layer 212, the sacrificial layer 212 is separated from the carrier substrate 210 by irradiating laser to the sacrificial layer and then the remaining sacrificial layer 212 is removed using a solution containing hydrofluoric acid.

FIGS. 118-123 illustrate a method for fabricating a micro-vacuum module for semiconductor device transfer according to another exemplary embodiment of the present disclosure.

Referring to FIG. 108, a polymer 314 enabling channel formation is spin-coated on a base substrate 310 by photolithography. The base substrate 310 should be a transparent substrate so as to allow processing using laser.

Figure 119:
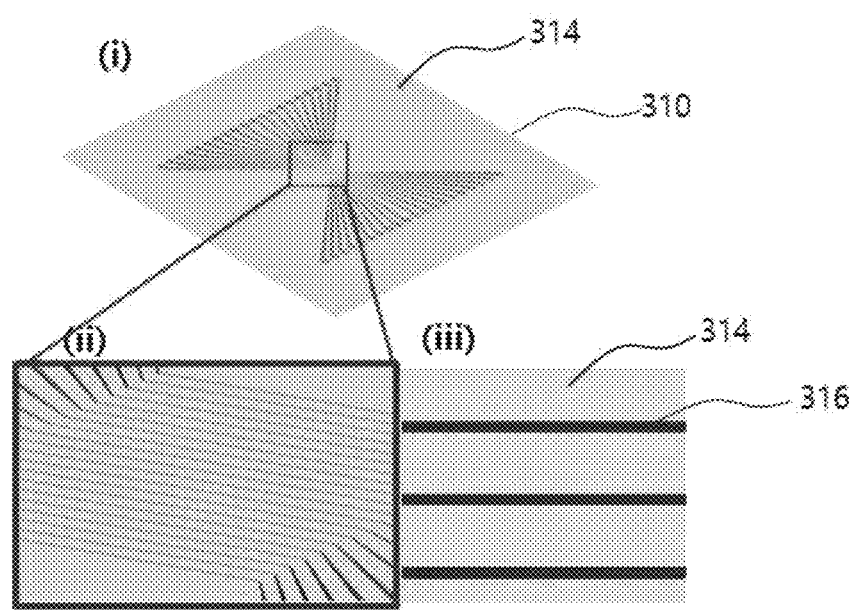

Referring to FIG. 119 (i), a desired channel layer 316 is formed on the polymer 314 by photolithography. FIG. 119 (ii) shows an image of a pattern of the channel portion of the channel layer 316 and FIG. 119 (iii) shows an image of the channel portion of the channel layer 316 seen from above.

Figure 120:
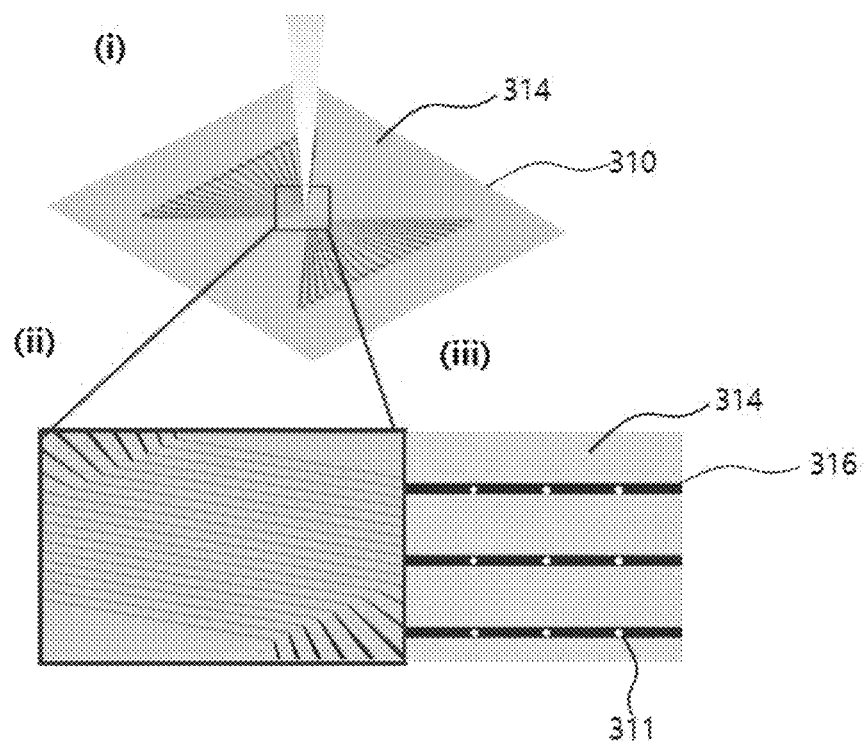

Referring to FIG. 120 (i), a hole array 311 is formed by forming a plurality of holes on the channel layer 316 with predetermined intervals using laser. The laser may be ultraviolet (UV), infrared (IR) or green laser having a wavelength of 100-1064 nm and a pulse duration of $10^{-12}$-$10^{-8}$ seconds.

FIG. 120 (ii) shows an image of the center portion of the channel layer 316 and FIG. 120 (iii) shows an image of a pattern of the center portion of the channel layer 316 seen from above.

Figure 121:
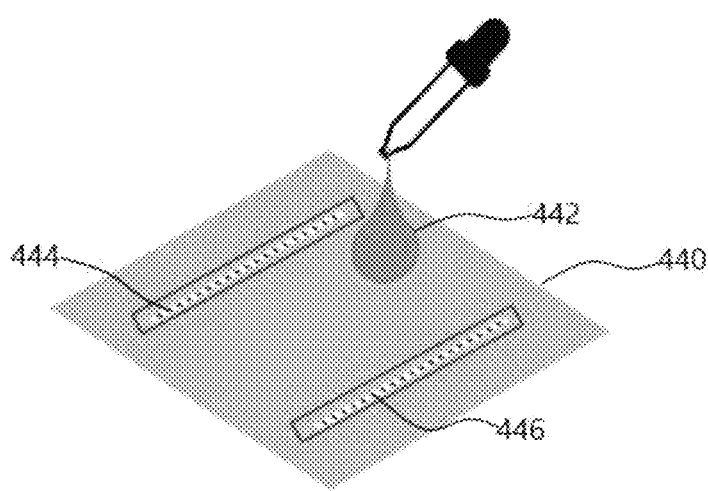

Referring to FIG. 121, an adhesive 342 is applied onto a process substrate 340 with a first through-hole 344 connected to an external pump module and a second through-hole 346 connected to a vacuum control unit formed. The process substrate 340 should be transparent when a UV-curable adhesive is used. When other adhesives are used, it needs not be transparent as long as the adhesive can be applied uniformly by spin coating.

Figure 122:
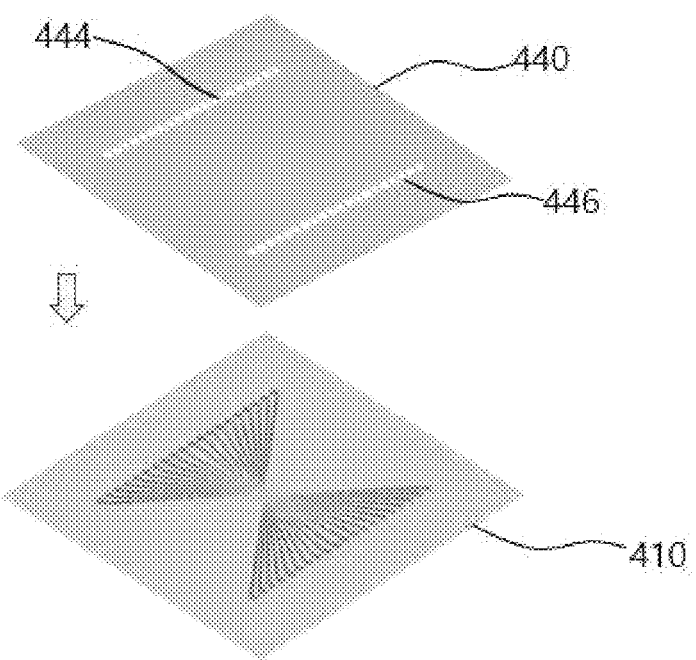

Referring to FIG. 122, the process substrate 340 is attached to the base substrate 310 with the channel layer formed. During this process, the process substrate 340 is inverted such that the adhesive 342 is contacted with the top surface of the base substrate 310.

Figure 123:
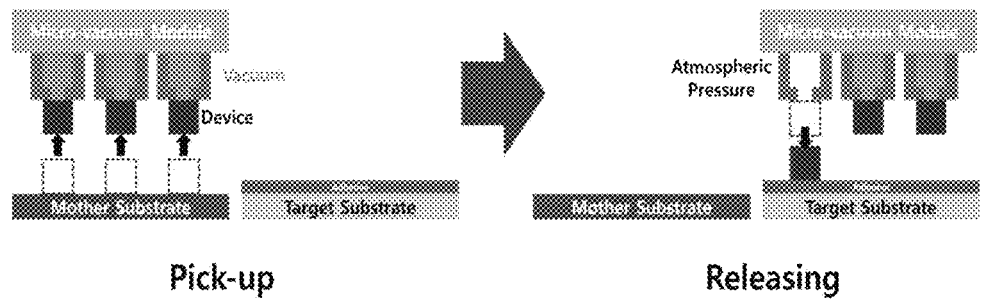
FIG. 123 shows a process of transferring a semiconductor device using a micro-vacuum module fabricated according to the present disclosure.

FIG. 123 shows a process of transferring a semiconductor device using the micro-vacuum module fabricated according to the present disclosure.

By using vacuum formed in the micro-channel of the micro-vacuum module according to the present disclosure, an electronic device formed on a hard mother substrate may be separated and then printed onto a target substrate.

The micro-channel is formed by a hole array 111, 211 formed on a base substrate 110, 210.

Hereinafter, a process of transferring a semiconductor device is described in detail.

First, a printable semiconductor device is fabricated on a hard mother substrate.

After accurately aligning the hole array of the micro-vacuum module and the semiconductor device array by adjusting locations, the hole array is contacted with the semiconductor device.

By forming vacuum by taking out air inside the micro-channel by connecting a pump to the micro-vacuum module, the semiconductor device is attached to the hole array of the micro-vacuum module.

The separation of the semiconductor device can be conducted on a wafer scale and, if necessary, selective separation is possible by selectively forming vacuum. The adhesive force of the semiconductor device increases in proportion to the amount of the air taken out by the pump. If the first adhesive force between the micro-vacuum module and the semiconductor device is larger than the second adhesive force between the semiconductor device and the mother substrate, the semiconductor device can be separated from the mother substrate.

After the semiconductor device is transferred to the micro-vacuum module attached therebelow, the location on the target substrate may be adjusted accurately and the attached electronic device can be released accurately on the desired location by releasing vacuum. Full transfer is possible by entirely releasing the vacuum formed in the micro-vacuum module and, if necessary, selective transfer is possible by selectively releasing the vacuum.

After the semiconductor device is transferred to the target substrate, a device fabrication process may be conducted, if necessary.

As described above, the micro-vacuum module for semiconductor device transfer fabricated according to the present disclosure can transfer all types of electronic devices including thin-film type, packaged unit type, etc. Because the transfer module is fabricated on a hard substrate, the module size is not limited and large-area transfer is possible. Also, selective transfer of the electronic device is possible by selectively releasing vacuum, if necessary.

As described above, according to the method for transfer and bonding of micro-light-emitting diodes using vacuum suction force according to the present disclosure, red, blue and green micro-light-emitting diode formed on different mother substrates or temporary substrates are aligned and transferred to desired positions on a target substrate coated with a transfer member, and then physical bonding and electrical connection between the micro-light-emitting diodes and the target substrate are achieved through a process of deforming the transfer member by applying external force onto the transferred micro-light-emitting diodes.

Those skilled in the art will appreciate that the conceptions and specific embodiments disclosed in the foregoing description may be readily utilized as a basis for modifying or designing other embodiments for carrying out the same purposes of the present disclosure. Those skilled in the art will also appreciate that such equivalent embodiments do not depart from the spirit and scope of the disclosure as set forth in the appended claims.

The invention claimed is:

1. A layout structure between a mother substrate or a temporary substrate, a target substrate, a micro-LED array and a micro-vacuum module for micro-LED array transfer using the micro-vacuum module, wherein the layout structure comprises:
   the mother substrate or the temporary substrate with micro-LED arrays of red, green, and blue colors formed;
   the target substrate coated with a transfer member; and
   the micro-vacuum module which detaches the micro-LED arrays from the mother substrate or the temporary substrate,
   wherein the micro-vacuum module comprises:
   a plurality of adsorption holes formed to be exposed to outside,
   a single or a plurality of vacuum flow channels respectively formed and connected to each vacuum controller for formation and release of a vacuum, each vacuum flow channel being configured to communicate with the plurality of adsorption holes so that the plurality of adsorption holes share the vacuum through a corresponding vacuum flow channel, and
   a gap between the plurality of adsorption holes being equal to or larger than a size of each adsorption hole,
   wherein the micro-vacuum module selectively detaches a micro-LED array of a single color from among the micro-LED arrays from the mother substrate or the temporary substrate by forming vacuum in a part of the vacuum flow channel and in the adsorption holes dependent on the part of the vacuum flow channel, and
   wherein the micro-LED array attached to the micro-vacuum module is released selectively or collectively to the target substrate by releasing the vacuum from a part or whole of the adsorption holes.

2. The layout structure according to claim 1, wherein the width of the adsorption hole is 5 µm or greater and 100 µm or smaller and the gap between the adsorption holes is 5 µm or greater and 300 µm or smaller to realize a monochromatic or RGB micro-LED display.

3. The layout structure according to claim 1, wherein the width of the adsorption hole is 5 µm or greater and 100 µm or smaller and the gap between the adsorption holes is 10 µm or greater and 8 mm smaller to realize a LED patch.

4. The layout structure according to claim 1, wherein the transfer member is one of a conductive adhesive material comprising ACF, ACA, SOCF and solder and a nonconductive adhesive material.

5. The layout structure according to claim 4, wherein the transfer member can be deformed by an external force-applying means in the shape of a cylinder or a roll.

6. A layout structure between a mother substrate or a temporary substrate, a target substrate, a micro-LED array and a micro-vacuum module for micro-LED array transfer using the micro-vacuum module, wherein the layout structure comprises:

the mother substrate or the temporary substrate with micro-LED arrays of red, green and blue colors formed;

the target substrate coated with a transfer member; and the micro-vacuum module which detaches the micro-LED array from the mother substrate or the temporary substrate, wherein the micro-vacuum module comprises:

a plurality of adsorption holes formed to be exposed to outside, a single or a plurality of vacuum flow channel respectively formed and connected to each vacuum controller for formation and release of a vacuum, each vacuum flow channel being configured to communicate with the plurality of adsorption holes so that the plurality of adsorption holes share the vacuum through a corresponding vacuum flow channel, and a gap between the plurality of adsorption holes being equal to or larger than a size of each adsorption hole, wherein the micro-vacuum module selectively or collectively detaches a micro-LED array of a single color from among the micro-LED arrays from the mother substrate or the temporary substrate by forming vacuum in the vacuum flow channel and in the adsorption holes dependent on the vacuum flow channel, and wherein the micro-LED array attached to the micro-vacuum module is released selectively to the target substrate by releasing the vacuum from a part of the adsorption holes.

7. The layout structure according to claim 6, wherein the width of the adsorption hole is 5 μm or greater and 100 μm or smaller and the gap between the adsorption holes is 5 μm or greater and 300 μm or smaller to realize a monochromatic or RGB micro-LED display.

8. The layout structure according to claim 6, wherein the width of the adsorption hole is 5 μm or greater and 100 μm or smaller and the gap between the adsorption holes is 10 μm or greater and 8 mm smaller to realize a LED patch.

9. The layout structure according to claim 6, wherein the transfer member is one of a conductive adhesive material comprising ACF, ACA, SOCF and solder and a nonconductive adhesive material.

10. A layout structure between a mother substrate or a temporary substrate, a target substrate, a micro-LED array and a micro-vacuum module for micro-LED array transfer using the micro-vacuum module, wherein the layout structure comprises:

the mother substrate or the temporary substrate with micro-LED arrays of red, green and blue colors formed;

the target substrate coated with a transfer member; and the micro-vacuum module which detaches the micro-LED array from the mother substrate or the temporary substrate, wherein the micro-vacuum module comprises:

a plurality of adsorption holes formed to be exposed to outside, a single or a plurality of vacuum flow channels respectively formed and connected to each vacuum controller for formation and release of a vacuum, each vacuum flow channel being configured to communicate with the plurality of adsorption holes so that the plurality of adsorption holes share the vacuum through a corresponding vacuum flow channel, and a gap between the plurality of adsorption holes being equal to or larger than a size of each adsorption hole, wherein the micro-vacuum module selectively or collectively detaches a micro-LED array of a single color from among the micro-LED arrays from the mother substrate or the temporary substrate by forming vacuum in a part of the vacuum flow channel and in the adsorption holes dependent on the part of the vacuum flow channel, and wherein in a state where the micro-vacuum module is equipped with all of the micro-LED arrays of red, green and blue colors by selectively or collectively detaching the micro-LED array of different colors from the mother substrate or the temporary substrate by forming vacuum in adsorption holes with no micro-LED array attached from among the plurality of adsorption holes and in the vacuum flow channel allowing the adsorption holes with no micro-LED array attached to communicate with each other, the micro-LED arrays of red, green and blue colors attached to the micro-vacuum module are released collectively to the target substrate by releasing the vacuum from the vacuum flow channel and the adsorption holes dependent thereon.

11. The layout structure according to claim 10, wherein the width of the adsorption hole is 5 μm or greater and 100 μm or smaller and the gap between the adsorption holes is 5 μm or greater and 300 μm or smaller to realize a monochromatic or RGB micro-LED display.

12. A layout structure between a mother substrate or a temporary substrate, a target substrate, a micro-LED array and a micro-vacuum module for micro-LED array transfer using the micro-vacuum module, wherein the layout structure comprises:

the mother substrate or the temporary substrate with a plurality of micro-LED arrays of different colors formed;

the target substrate coated with a transfer member; and the micro-vacuum module which detaches the micro-LED array from the mother substrate or the temporary substrate, wherein the micro-vacuum module comprises:

a plurality of adsorption holes formed to be exposed to outside and forming vacuum suction force, and a plurality of vacuum flow channels respectively formed and connected to each vacuum controller for formation and release of a vacuum, each vacuum flow channel being configured to communicate with the plurality of adsorption holes so that the plurality of adsorption holes share the vacuum through a corresponding vacuum flow channel, wherein the plurality of adsorption holes respectively forming vacuum suction force and having a diameter of 5 μm or greater and 100 μm or smaller are communicated through different channels, wherein each of the plurality of vacuum flow channels is connected to each vacuum controller for formation and release of vacuum, and wherein the micro-LED arrays attached to the micro-vacuum module by the vacuum suction force applied to the plurality of vacuum flow channels and the plurality of adsorption holes dependent thereon are selectively released to different target substrates by sequentially releasing the vacuum of the vacuum flow channel two to four times.

13. The layout structure according to claim 12, wherein the width of the adsorption hole is 5 μm or greater and 100 μm or smaller and the gap between the adsorption holes is 5 μm or greater and 300 μm or smaller to realize a monochromatic or RGB micro-LED display.

* * * * *